US010460683B2

(12) United States Patent
Fujita

(10) Patent No.: US 10,460,683 B2
(45) Date of Patent: Oct. 29, 2019

(54) SEMICONDUCTOR DEVICE, DISPLAY DEVICE, AND ELECTRONIC DEVICE

(71) Applicant: Semiconductor Energy Laboratory Co., Ltd., Atsugi-shi, Kanagawa-ken (JP)

(72) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 125 days.

(21) Appl. No.: 15/684,051

(22) Filed: Aug. 23, 2017

(65) Prior Publication Data

US 2018/0061335 A1    Mar. 1, 2018

(30) Foreign Application Priority Data

Aug. 30, 2016 (JP) .................. 2016-167883

(51) Int. Cl.
*G06F 3/041* (2006.01)
*G09G 3/36* (2006.01)
(Continued)

(52) U.S. Cl.
CPC ....... *G09G 3/3611* (2013.01); *G02F 1/13306* (2013.01); *G08C 19/36* (2013.01);
(Continued)

(58) Field of Classification Search
CPC . G02F 1/13306; G02F 2201/44; G08C 19/36; G09G 3/3291; G09G 3/3611;
(Continued)

(56) References Cited

U.S. PATENT DOCUMENTS 8,462,145 B2   6/2013   Kim et al.
8,742,964 B2   6/2014   Kleks et al.
(Continued)

FOREIGN PATENT DOCUMENTS

CN   001728227 A    2/2006
CN   102237026 A    11/2011
(Continued)

OTHER PUBLICATIONS

International Search Report (Application No. PCT/IB2017/055050) dated Nov. 21, 2017.
(Continued)

*Primary Examiner* — Nelson M Rosario
(74) *Attorney, Agent, or Firm* — Fish & Richardson P.C.

(57) ABSTRACT

To provide a novel semiconductor device or display device. The semiconductor device includes a decoder circuit, an amplifier circuit, and an arithmetic circuit. The amplifier circuit includes a first amplifier and a second amplifier. One of the first amplifier and the second amplifier has a function of inspecting an output of the other of the first amplifier and the second amplifier. The arithmetic circuit has a function of calculating an error of a potential output from the first amplifier or the second amplifier, on the basis of a result of the inspection. The decoder circuit has a function of correcting a video signal input to the decoder circuit by subtracting the error of the potential from the video signal.

9 Claims, 30 Drawing Sheets

(51) Int. Cl.
　　*G02F 1/133*　　(2006.01)
　　*G08C 19/36*　　(2006.01)
　　*H01L 29/08*　　(2006.01)
　　*H01L 29/423*　(2006.01)
　　*H01L 29/786*　(2006.01)
　　*G09G 3/3291*　(2016.01)

(52) U.S. Cl.
　　CPC ......... *G09G 3/3291* (2013.01); *G09G 3/3688* (2013.01); *H01L 29/08* (2013.01); *H01L 29/42384* (2013.01); *H01L 29/7869* (2013.01); *G02F 2201/44* (2013.01); *G09G 2300/046* (2013.01); *G09G 2310/027* (2013.01); *G09G 2310/0291* (2013.01)

(58) Field of Classification Search
　　CPC ........... G09G 3/3688; G09G 2300/046; G09G 2310/027; G09G 2310/0291; H01L 29/08; H01L 29/42384; H01L 29/7869
　　See application file for complete search history.

(56) References Cited

U.S. PATENT DOCUMENTS

| | | |
|---|---|---|
| 2005/0140630 A1 | 6/2005 | Kikuchi et al. |
| 2006/0022925 A1 | 2/2006 | Hara et al. |
| 2007/0072439 A1 | 3/2007 | Akimoto et al. |
| 2009/0161697 A1* | 6/2009 | Wang ............ H04N 21/234354 370/538 |
| 2010/0141493 A1 | 6/2010 | Cho et al. |
| 2010/0156867 A1 | 6/2010 | Kim et al. |
| 2010/0225514 A1 | 9/2010 | Inoue |
| 2011/0148835 A1 | 6/2011 | Yamazaki |
| 2011/0260746 A1 | 10/2011 | Huang et al. |
| 2012/0098738 A1 | 4/2012 | Yoshida et al. |
| 2014/0146010 A1 | 5/2014 | Akai et al. |
| 2014/0266309 A1 | 9/2014 | Jakobson |
| 2016/0042696 A1 | 2/2016 | Hirakata et al. |
| 2017/0053584 A1 | 2/2017 | Takahashi |
| 2017/0287429 A1* | 10/2017 | Kong .................. G09G 3/3607 |
| 2018/0315390 A1* | 11/2018 | Kong .................. G09G 3/3688 |

FOREIGN PATENT DOCUMENTS

| | | |
|---|---|---|
| JP | 2006-039205 A | 2/2006 |
| JP | 2006-119225 A | 5/2006 |
| JP | 2007-096055 A | 4/2007 |
| JP | 2007-123861 A | 5/2007 |
| JP | 2013-190513 A | 9/2013 |
| JP | 2016-038586 A | 3/2016 |
| KR | 2006-0046797 A | 5/2006 |

OTHER PUBLICATIONS

Written Opinion (Application No. PCT/IB2017/055050) dated Nov. 21, 2017.

Jeon.Y et al., "A Piecewise-Linear 10b DAC Architecture with Drain-Current Modulation for Compact AMLCD Driver ICs", ISSCC 2009 (Digest of Technical Papers, IEEE International Solid-State Circuits Conference), Feb. 8, 2009, pp. 264-265,265a.

* cited by examiner $Vin(+)[x] = Vin[x-1] + Vos[x-1] + Vos[x]$

FIG. 26A
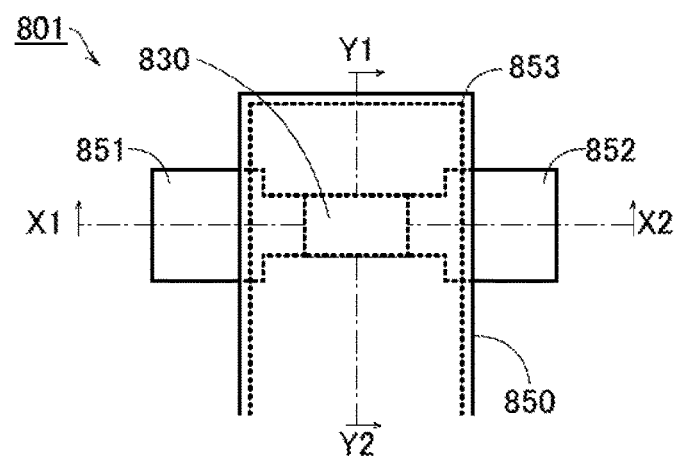
FIG. 26B
FIG. 26C
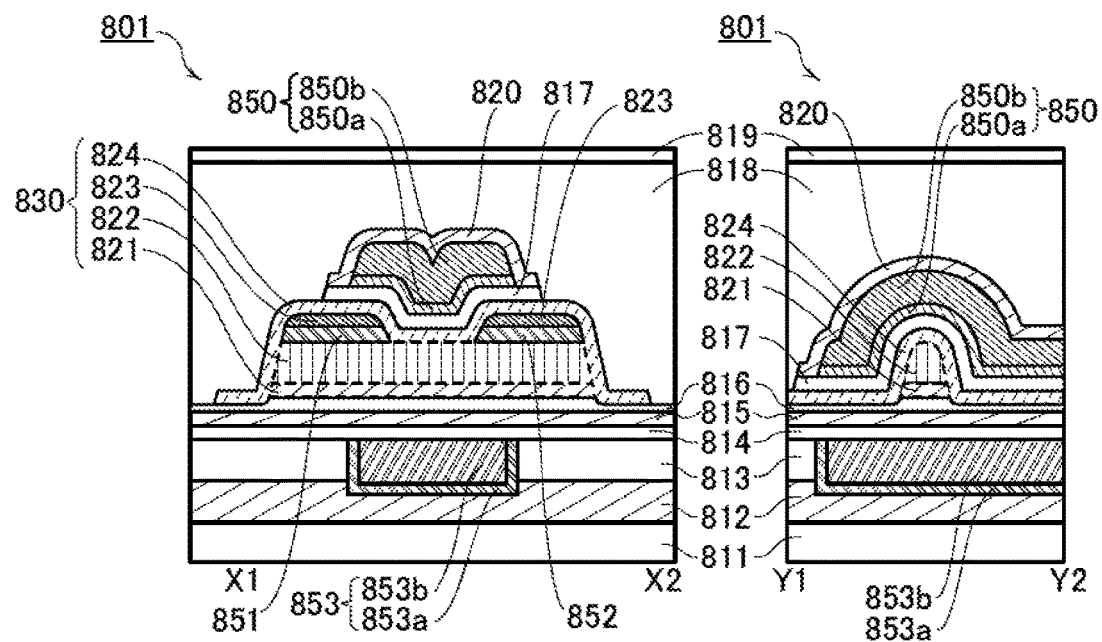

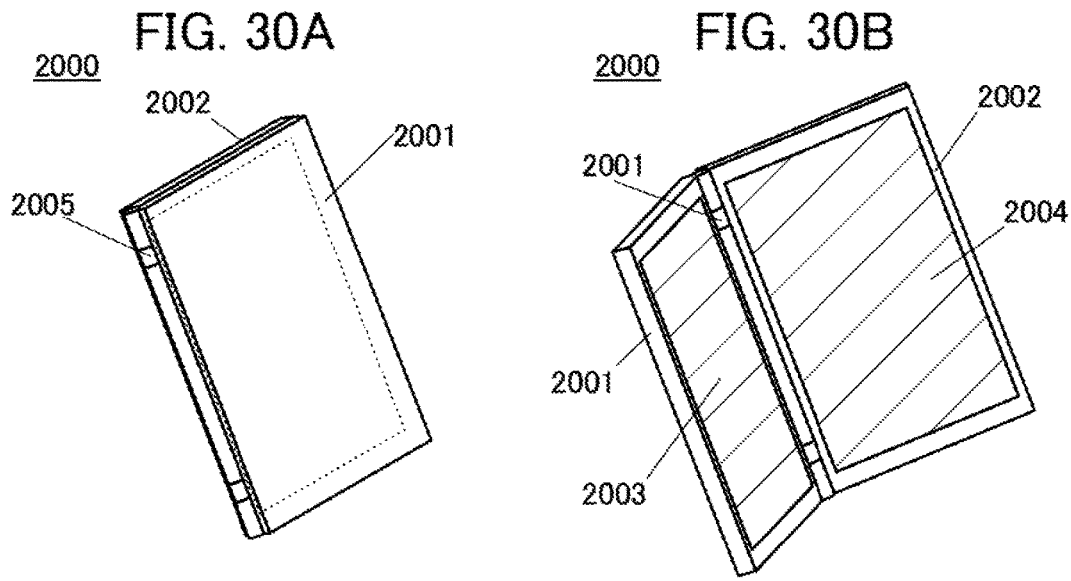
FIG. 30A
FIG. 30B
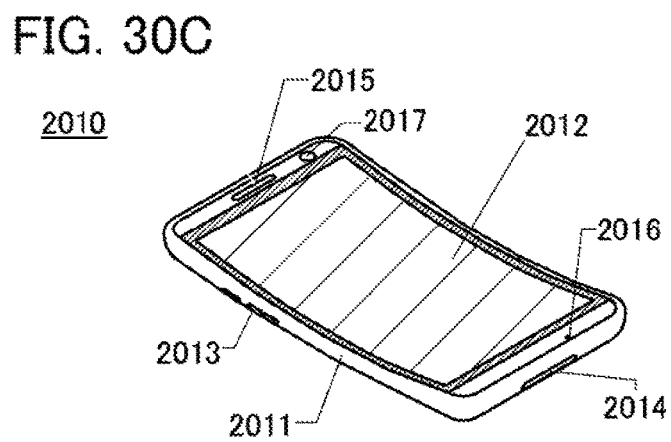
FIG. 30C
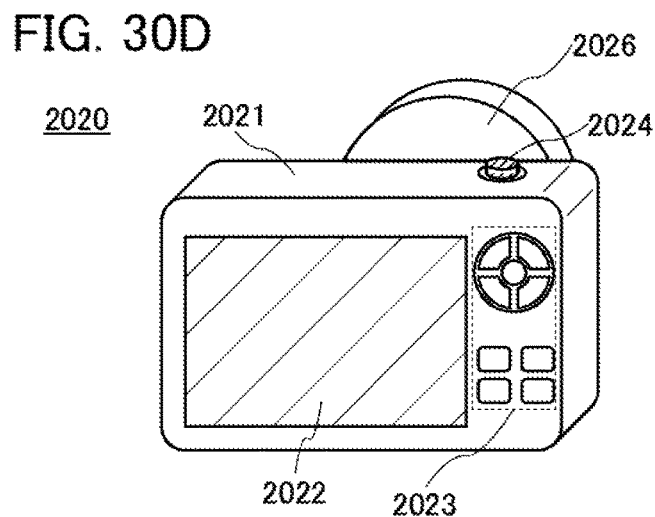
FIG. 30D

SEMICONDUCTOR DEVICE, DISPLAY DEVICE, AND ELECTRONIC DEVICE

TECHNICAL FIELD

Embodiments of the present invention relate to a semiconductor device, a display device, and an electronic device.

Note that one embodiment of the present invention is not limited to the above technical field. Examples of the technical field of one embodiment of the present invention disclosed in this specification and the like include a driver circuit, a semiconductor device, a display device, a light-emitting device, a power storage device, a memory device, a display system, a display module, an electronic device, a lighting device, an input device, an input/output device, a driving method thereof, and a manufacturing method thereof.

In this specification and the like, a semiconductor device refers to any device that can function by utilizing semiconductor characteristics. A transistor, a semiconductor circuit, an arithmetic device, a driver circuit, a memory device, and the like are each an embodiment of the semiconductor device. In addition, a display device, an imaging device, an electro-optical device, a power generation device (e.g., a thin film solar cell and an organic thin film solar cell), a display module, and an electronic device may each include a semiconductor device.

BACKGROUND ART

Flat panel displays typified by liquid crystal display devices and light-emitting display devices are widely used to display images. Although transistors used in these display devices are mainly manufactured using silicon semiconductors, a technique in which, instead of a silicon semiconductor, a metal oxide exhibiting semiconductor characteristics is used for transistors has attracted attention in recent years. For example, in Patent Documents 1 and 2, a technique is disclosed in which a transistor manufactured using zinc oxide or an In—Ga—Zn-based oxide for a semiconductor layer is used in a pixel of a display device.

REFERENCE

Patent Document

[Patent Document 1] Japanese Published Patent Application No. 2007-096055
[Patent Document 2] Japanese Published Patent Application No. 2007-123861

DISCLOSURE OF INVENTION

An object of one embodiment of the present invention is to provide a novel semiconductor device or display device. Another object of one embodiment of the present invention is to provide a high-quality semiconductor device or display device. Another object of one embodiment of the present invention is to provide a highly reliable semiconductor device or display device. Another object of one embodiment of the present invention is to provide a semiconductor device or display device with reduced variations in video signals. Another object of one embodiment of the present invention is to provide a semiconductor device or display device with low power consumption.

One embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

A semiconductor device of one embodiment of the present invention includes a decoder circuit, an amplifier circuit, and an arithmetic circuit. The amplifier circuit includes a first amplifier and a second amplifier. One of the first amplifier and the second amplifier is configured to inspect an output of the other of the first amplifier and the second amplifier. The arithmetic circuit is configured to calculate an error of a potential output from the first amplifier or the second amplifier, on the basis of a result of the inspection. The decoder circuit is configured to correct a video signal input to the decoder circuit by subtracting the error of the potential from the video signal.

In the semiconductor device of one embodiment of the present invention, the first amplifier may include a first operational amplifier. The second amplifier may include a second operational amplifier, a first switch, and a second switch. A first terminal of the first switch may be electrically connected to an inverting input terminal of the second operational amplifier. A second terminal of the first switch may be electrically connected to an output terminal of the second operational amplifier. A first terminal of the second switch may be electrically connected to the inverting input terminal of the second operational amplifier. A second terminal of the second switch may be electrically connected to an output terminal of the first operational amplifier. The second operational amplifier may be configured to output a signal corresponding to an inspection result of an output of the first operational amplifier to the arithmetic circuit.

In the semiconductor device of one embodiment of the present invention, the output of the first operational amplifier may be inspected by turning on the second switch so that a potential supplied to a non-inverting input terminal of the second operational amplifier is gradually changed.

In the semiconductor device of one embodiment of the present invention, the first switch and the second switch may each be composed of a transistor. The transistor may include a metal oxide in a channel formation region.

In the semiconductor device of one embodiment of the present invention, the video signal may be digital data. The arithmetic circuit may be configured to calculate the error of the potential with use of the digital data.

A display device of one embodiment of the present invention includes the above semiconductor device and a pixel portion. The pixel portion includes a plurality of pixels. The semiconductor device is configured to supply a potential corresponding to a corrected video signal to the pixel.

In the display device of one embodiment of the present invention, the semiconductor device may include a D/A converter circuit. The D/A converter circuit may include a selection circuit and a potential generation circuit. The potential generation circuit may be configured to supply a plurality of reference potentials to the selection circuit. The number of the reference potentials may be larger than the number of grey levels displayed by the pixels.

The display device of one embodiment of the present invention may further include a first driver circuit comprising the semiconductor device and a second driver circuit comprising the semiconductor device. The pixel portion may include a first pixel comprising a reflective liquid crystal element and a second pixel comprising a light-emitting element. The first driver circuit may be configured to supply a video signal to the first pixel. The second driver circuit may be configured to supply a video signal to the second pixel. The potential generation circuit in the first driver circuit may be configured to generate the reference potential with use of a first potential. The potential generation circuit in the second driver circuit may be configured to generate the reference potential with use of a second potential. When the inspection is performed, changing from one of the first potential and the second potential to the other may be performed.

An electronic device of one embodiment of the present invention includes any of the display devices and a processor. The processor is configured to select whether to make the semiconductor device supply a video signal to the pixel portion or make the semiconductor device perform the inspection.

One embodiment of the present invention can provide a novel semiconductor device or display device. Another embodiment of the present invention can provide a high-quality semiconductor device or display device. Another embodiment of the present invention can provide a highly reliable semiconductor device or display device. Another embodiment of the present invention can provide a semiconductor device or display device with reduced variations in video signals. Another embodiment of the present invention can provide a semiconductor device or display device with low power consumption.

Note that the description of these effects does not preclude the existence of other effects. One embodiment of the present invention does not necessarily achieve all of these effects. Other effects will be apparent from and can be derived from the description of the specification, the claims, the drawings, and the like.

BRIEF DESCRIPTION OF DRAWINGS

FIGS. 26A to 26C illustrate a structure example of a transistor.
FIGS. 30A to 30D illustrates structure examples of electronic devices.

BEST MODE FOR CARRYING OUT THE INVENTION

Figure 1:
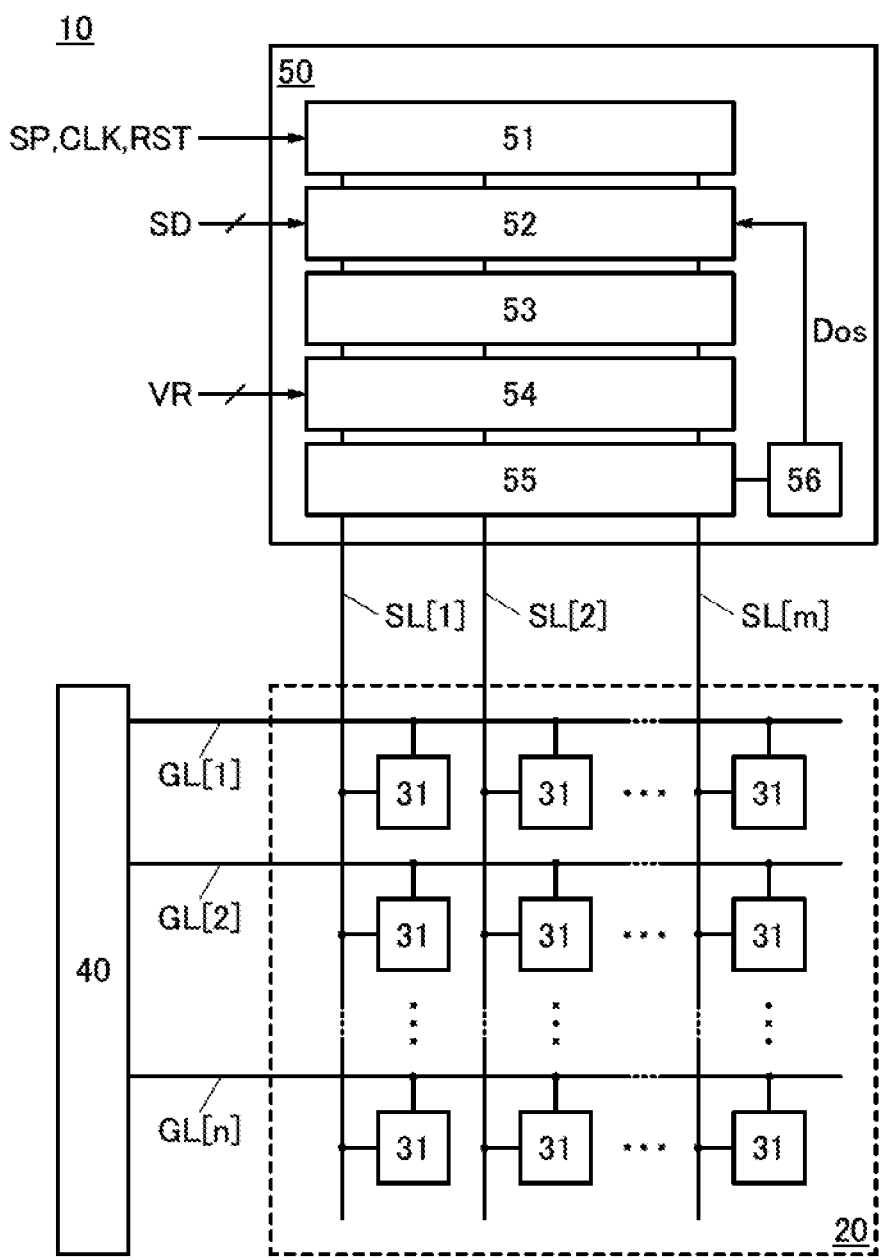
FIG. 1 illustrates a configuration example of a display device.

Embodiments of the present invention will be described below in detail with reference to the accompanying drawings. Note that the present invention is not limited to the following description of the embodiments and it is easily understood by those skilled in the art that the mode and details can be variously changed without departing from the spirit and scope of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. The display device includes, in its category, a liquid crystal display device, a light-emitting device including pixels each provided with a light-emitting element typified by an organic light-emitting element, electronic paper, a digital micromirror device (DMD), a plasma display panel (PDP), a field emission display (FED), and the like.

In this specification and the like, a metal oxide means an oxide of a metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases. That is, a metal oxide that has at least one of an amplifying function, a rectifying function, and a switching function can be called a metal oxide semiconductor, or OS for short. In the following description, a transistor including a metal oxide in a channel formation region is also referred to as an OS transistor.

In this specification and the like, a metal oxide including nitrogen is also called a metal oxide in some cases. Moreover, a metal oxide including nitrogen may be called a metal oxynitride. The details of a metal oxide will be described later.

Furthermore, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or text, another connection relation is included in the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

(Embodiment 1)

In this embodiment, a driver circuit and a display device of one embodiment of the present invention will be described.

<Configuration Example of Display Device>

FIG. 1 illustrates a configuration example of a display device 10. The display device 10 includes a pixel portion 20, a driver circuit 40, and a driver circuit 50. The pixel portion 20 includes a plurality of pixels 31.

The pixel portion 20 has a function of displaying an image. The pixel 31 includes a display element and has a function of displaying a predetermined gray level. Here, the pixel portion 20 includes m columns and n rows (m and n are each an integer of 2 or more) of pixels 31. The pixel 31 in an i-th column and a j-th row (i is an integer of 1 or more and m or less, and j is an integer of 1 or more and n or less) is connected to a wiring SL[i] and a wiring GL[j]. Wirings GL[1] to GL[n] are connected to the driver circuit 40, and wirings SL[1] to SL[m] are connected to the driver circuit 50. The pixels 31 each display a predetermined gray level, whereby a predetermined image is displayed on the pixel portion 20.

Examples of the display element in the pixel 31 include a liquid crystal element and a light-emitting element. As the liquid crystal element, a transmissive liquid crystal element, a reflective liquid crystal element, a transflective liquid crystal element, or the like can be used. Alternatively, for example, a microelectromechanical systems (MEMS) shutter element, an optical interference type MEMS element, or a display element using a microcapsule method, an electrophoretic method, an electrowetting method, an Electronic Liquid Powder (registered trademark) method, or the like can be used as the display element.

Examples of the light-emitting element include self-luminous elements such as an organic light-emitting diode (OLED), a light-emitting diode (LED), a quantum-dot light-emitting diode (QLED), and a semiconductor laser.

The driver circuit 40 has a function of supplying a signal for selecting any of the pixels 31 (hereinafter, the signal is referred to as a selection signal) to the pixel portion 20. Specifically, the driver circuit 40 has a function of supplying a selection signal to the wirings GL, and the wirings GL each have a function of transmitting the selection signal output from the driver circuit 40.

The driver circuit 50 has a function of supplying a signal for displaying an image (hereinafter, the signal is referred to as a video signal) to the pixel portion 20. Specifically, the driver circuit 50 has a function of supplying a video signal to the wirings SL, and the wirings SL each have a function of transmitting the video signal output from the driver circuit 50. The video signal supplied to the wiring SL is written to the pixel 31 selected by the driver circuit 40.

Here, an OS transistor is preferably used in the pixel 31. A metal oxide has a larger energy gap and a lower minority carrier density than a semiconductor such as silicon; thus, the off-state current of an OS transistor can be extremely low. Accordingly, when an OS transistor is used in the pixel 31, a video signal held in the pixel 31 can be retained for a long time compared with the case where a transistor in which a channel formation region includes silicon (hereinafter such a transistor is also referred to as a Si transistor) is used, for example. Consequently, the frequency of writing a video signal to the pixel 31 can be greatly reduced, resulting in a reduction in power consumption. The frequency of writing a video signal is more than or equal to once every day and less than 0.1 times every second, preferably more than or equal to once every hour and less than once every second, more preferably more than or equal to once every 30 seconds and less than once every second, for example. The details of the circuit configuration of the pixel 31 using an OS transistor will be described in Embodiment 2.

The driver circuit 50 includes a shift register 51, a decoder circuit 52, a level shifter circuit 53, a digital analog (D/A) converter circuit 54, an amplifier circuit 55, and an arithmetic circuit 56. Note that the driver circuit 50 can be constructed using a semiconductor device and thus can also be called a semiconductor device.

The shift register 51 has a function of generating a sampling pulse with the use of a start pulse SP, a clock signal CLK, and a reset signal RST. The sampling pulse generated by the shift register 51 is output to the decoder circuit 52.

The decoder circuit 52 has a function of decoding a video signal (data SD) input from the outside. Specifically, the decoder circuit 52 has a function of generating a control signal for controlling the operation of the D/A converter circuit 54, on the basis of the data SD. The signal decoded by the decoder circuit 52 is output to the level shifter circuit 53.

The level shifter circuit 53 has a function of shifting the level of a signal input from the decoder circuit 52. Specifically, the level shifter circuit 53 has a function of converting a potential input from the decoder circuit 52 into a potential for controlling the operation of the D/A converter circuit 54. In the case where a negative potential is used for the operation of the D/A converter circuit 54, the negative potential is generated by the level shifter circuit 53.

The D/A converter circuit 54 has a function of generating an analog signal corresponding to the data SD. Specifically, the D/A converter circuit 54 has a function of converting the data SD, which is a digital signal, into an analog potential. For the operation of the D/A converter circuit 54, the data SD decoded by the decoder circuit 52 and converted by the level shifter circuit 53 is used. Note that a plurality of reference potentials VR are supplied to the D/A converter circuit 54.

The amplifier circuit 55 has a function of amplifying the potential generated by the D/A converter circuit 54 and outputting the amplified potential to the wiring SL. The potential supplied from the amplifier circuit 55 to the wiring SL corresponds to a video signal supplied to the pixel 31.

Here, variations in characteristics between elements in the driver circuit 50 can cause variations in video signals supplied from the driver circuit 50 to the wirings SL. The variations in video signals cause unevenness of an image displayed on the pixel portion 20. Consequently, to display a high-quality image, it is preferable to minimize variations in video signals, that is, a difference between the expected value and the measured value of a signal supplied to the wiring SL (hereinafter the difference is also referred to as an error of potential).

The driver circuit 50 of one embodiment of the present invention has a function of inspecting a signal output from the amplifier circuit 55 and calculating an error of potential. The data SD is corrected on the basis of the calculated error of potential, whereby variations in potentials supplied to the wirings SL can be reduced. Thus, the quality and reliability of the display device 10 can be improved.

Specifically, the driver circuit 50 includes an arithmetic circuit 56. The arithmetic circuit 56 has a function of calculating an error of potential on the basis of a signal input from the amplifier circuit 55. The calculated error of potential is supplied as data Dos to the decoder circuit 52.

The decoder circuit 52 has a function of correcting the data SD on the basis of the data Dos. Specifically, the decoder circuit 52 has a function of subtracting an error of potential from the data SD. Thus, the driver circuit 50 can generate a video signal on the basis of the data SD from which the error of potential is canceled out, and accordingly, variations in potentials supplied to the wirings SL can be reduced.

<Configuration Example of Driver Circuit>

Figure 2:
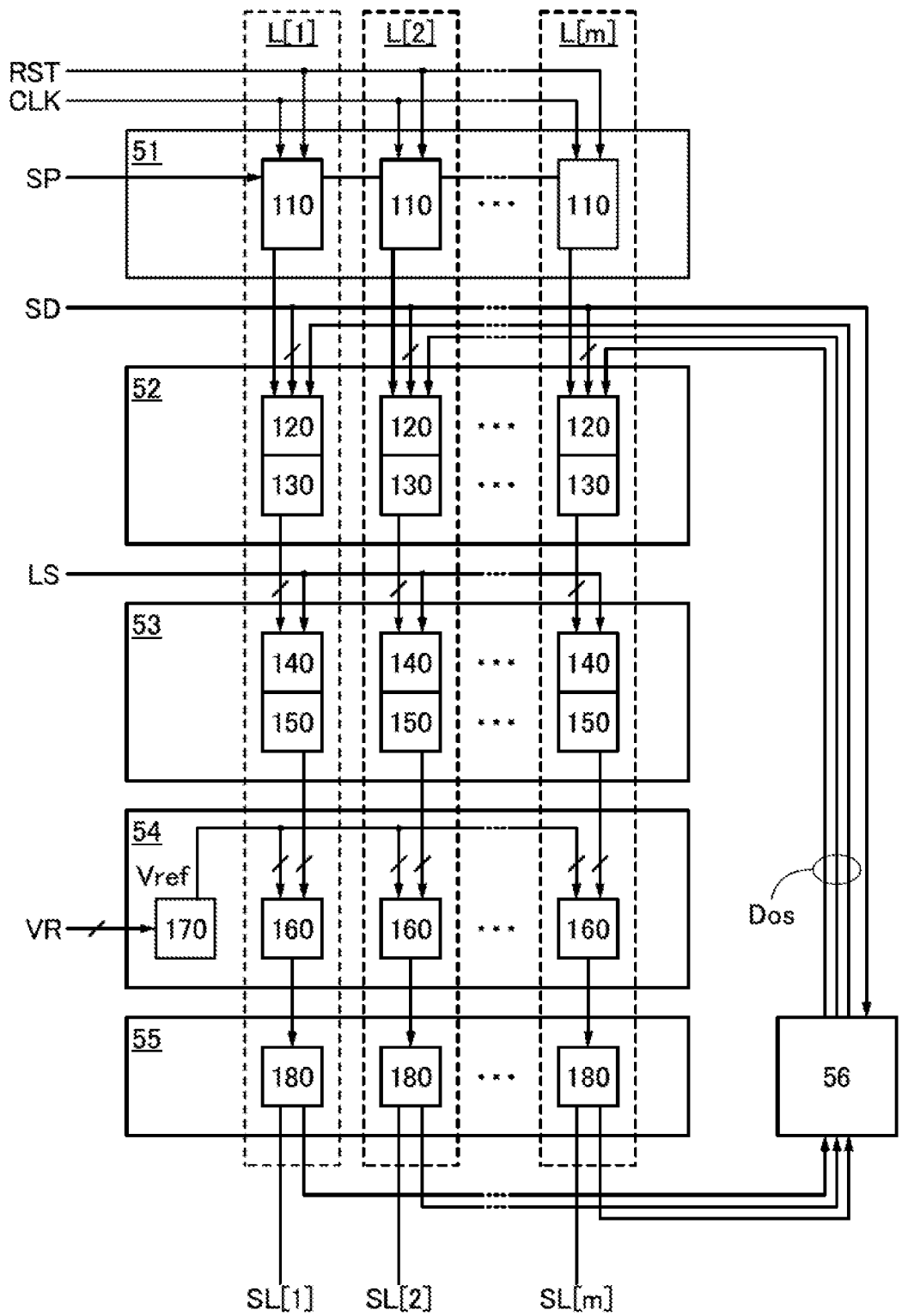
FIG. 2 illustrates a configuration example of a driver circuit.

Next, a specific configuration example of a driver circuit will be described. FIG. 2 illustrates a configuration example of the driver circuit 50.

The shift register 51 includes a plurality of registers 110. The register 110 is a circuit that is composed of a flip-flop or the like and has a function of generating a sampling pulse and outputting the sampling pulse to a latch circuit 120.

The decoder circuit 52 includes a plurality of latch circuits 120 and a plurality of decoders 130. The latch circuit 120 has a function of storing the input data SD at a predetermined timing and outputting the data SD to the decoder 130. The timing when a signal is output from the latch circuit 120 is controlled by a sampling pulse input from the register 110. The decoder 130 is a circuit having a function of converting a signal input from the latch circuit 120 into a control signal for controlling the operation of a selection circuit 160.

The level shifter circuit 53 includes a plurality of latch circuits 140 and a plurality of level shifters 150. The latch circuit 140 has a function of storing an input signal at a predetermined timing and outputting the signal to the level shifter 150. The timing when the signal is output from the latch circuit 140 is controlled by a signal LS. The level shifter 150 is a circuit having a function of converting a potential input from the latch circuit 140 into a potential needed to control the operation of the selection circuit 160.

The D/A converter circuit 54 includes a plurality of selection circuits 160 and a potential generation circuit 170. The selection circuit 160 has a function of outputting a potential corresponding to the data SD on the basis of control signals generated by the decoder 130 and the level shifter 150. The potential generation circuit 170 has a function of generating a reference potential Vref supplied to the selection circuit 160, with the use of the reference potential VR. The selection circuit 160 selects one reference potential Vref on the basis of a control signal input from the level shifter 150 and outputs the reference potential Vref to an amplifier 180. In other words, the selection circuit 160 has a function of outputting a predetermined potential (analog value) on the basis of control signals generated using the data SD. With these functions, DA conversion of a video signal is performed.

The amplifier circuit 55 includes a plurality of amplifiers 180. The amplifier 180 is a circuit having a function of amplifying a potential supplied from the selection circuit 160 and supplying the amplified potential to the wiring SL.

The number of each of the registers 110, the latch circuits 120, the decoders 130, the latch circuits 140, the level shifters 150, the selection circuits 160, and the amplifiers 180 are the same as that of the wirings SL. A group of circuits that generate a video signal that is to be supplied to one of the wirings SL is hereinafter called a line L. That is, lines L whose number is the same as that of the wirings SL are provided in the driver circuit 50. The lines L are each composed of the register 110, the latch circuit 120, the decoder 130, the latch circuit 140, the level shifter 150, the selection circuit 160, and the amplifier 180.

Here, the amplifier 180 of one embodiment of the present invention has a function of inspecting an output of another amplifier 180 and outputting a signal corresponding to the inspection result to the arithmetic circuit 56. The arithmetic circuit 56 calculates an error of potential supplied from the amplifier 180 to the wiring SL, with the use of the signal input from the amplifier 180 and the data SD, and outputs the error of potential as the data Dos to the latch circuit 120. The latch circuit 120, to which the data Dos is input, generates data SD' obtained by subtracting the error of potential from the data SD and outputs the data SD' to the decoder 130. The data SD is corrected on the basis of an error of potential in this manner, whereby variations in potentials supplied to the wirings SL can be reduced. A specific configuration example and a specific operation example of the amplifiers 180 will be described below.

<Configuration Example of Amplifier>

Figure 3:
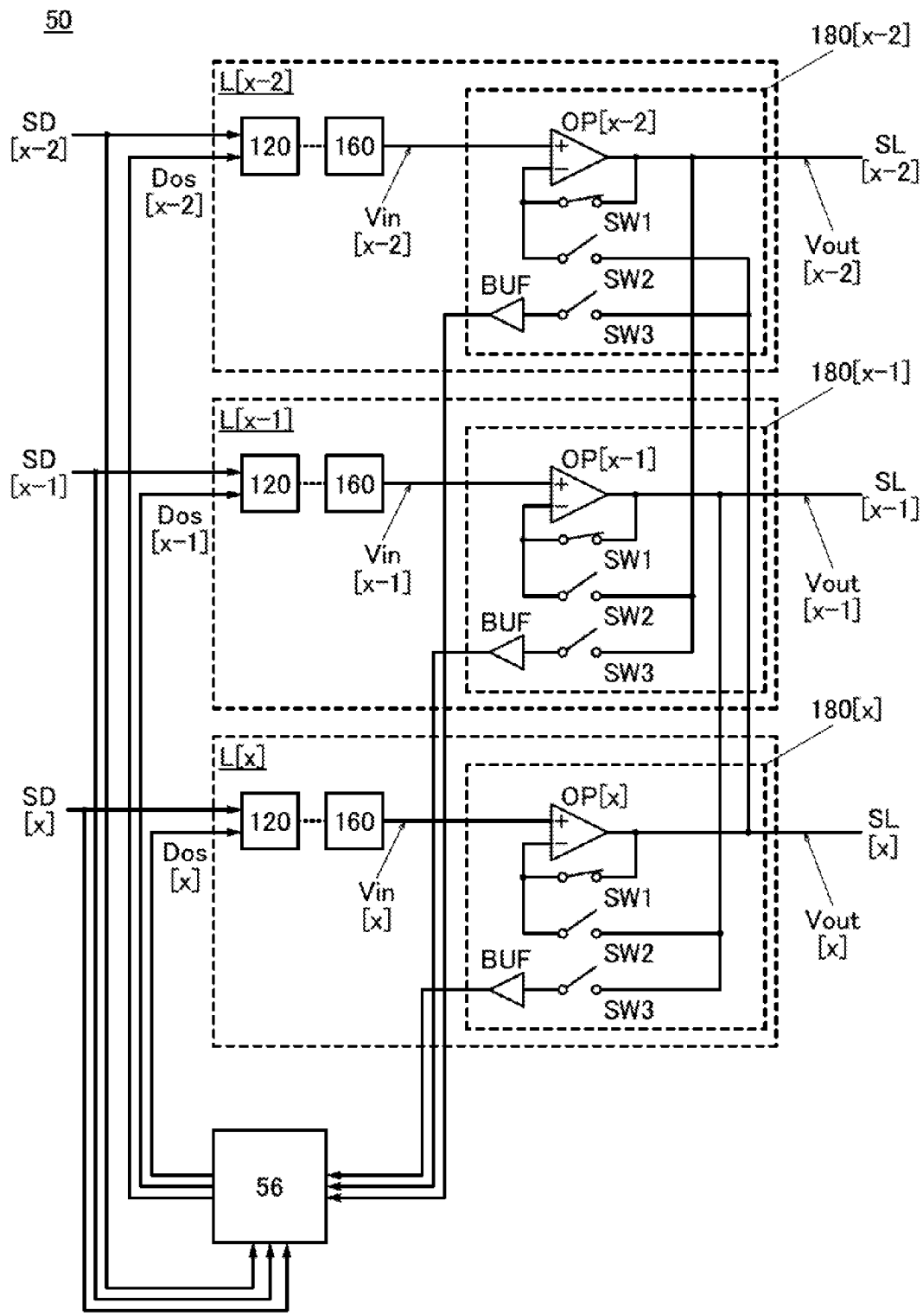
FIG. 3 illustrates a configuration example of a driver circuit.

FIG. 3 illustrates a specific configuration example of the amplifiers 180 included in the driver circuit 50. Here, the amplifiers 180 (180[x−2] to 180[x]) in the lines L[x−2] to L[x] (x is an integer of 3 or more and m or less) are illustrated, and the other amplifiers 180 can each have a similar configuration.

The amplifier 180 includes an operational amplifier OP, a switch SW1, a switch SW2, a switch SW3, and a buffer BUF. A non-inverting input terminal of the operational amplifier OP is connected to the selection circuit 160, and an output terminal of the operational amplifier OP is connected to the wiring SL. A first terminal of the switch SW1 is connected to an inverting input terminal of the operational amplifier OP, and a second terminal of the switch SW1 is connected to the output terminal of operational amplifier OP. A first terminal of the switch SW2 is connected to the inverting input terminal of the operational amplifier OP, and a second terminal of the switch SW2 is connected to an output terminal of the operational amplifier OP in another amplifier 180. A first terminal of the switch SW3 is connected to an input terminal of the buffer BUF, and a second terminal of the switch SW3 is connected to the output terminal of the operational amplifier OP in the another amplifier 180. The output terminal of the buffer BUF is connected to the arithmetic circuit 56.

In FIG. 3, second terminals of the switches SW2 and SW3 in the amplifier 180[x−2] are connected to an output terminal of the operational amplifier OP in the amplifier 180[x]; second terminals of the switches SW2 and SW3 in the amplifier 180[x−1] are connected to an output terminal of the operational amplifier OP in the amplifier 180[x−2]; and second terminals of the switches SW2 and SW3 in the amplifier 180[x] are connected to an output terminal of the operational amplifier OP in the amplifier 180[x−1]. The operational amplifiers OP included in the amplifiers 180[x−2], 180[x−1], and 180[x] are referred to as operational amplifiers OP[x−2], OP[x−1], and OP[x], respectively.

Data SD[x−2], SD[x−1], and SD[x] are input to the lines L[x−2], L[x−1], and L[x], respectively. The selection circuits 160 in the lines L[x−2], L[x−1], and L[x] output potentials Vin[x−2], Vin[x−1], and Vin[x] corresponding to the data SD[x−2], SD[x−1], and SD[x], respectively. The operational amplifiers OP[x−2], OP[x−1], and OP[x] output potentials Vout[x−2], Vout[x−2], and Vout[x] with the use of the potentials Vin[x−2], Vin[x−1], and Vin[x] as input potentials, respectively.

When the amplifiers 180 are normally operated, the switches SW1 are turned on, and the switches SW2 and SW3 are turned off, as illustrated in FIG. 3. Thus, each of the operational amplifiers OP constitutes a voltage follower and can amplify the potential Vin and output the amplified potential to the corresponding wiring SL.

Furthermore, the amplifier 180 has a function of inspecting an output of another amplifier 180. In FIG. 3, the amplifier 180[x−1] has a function of inspecting an output of the amplifier 180[x−2]; the amplifier 180[x] has a function of inspecting an output of the amplifier 180[x−1]; and the amplifier 180[x−2] has a function of inspecting an output of the amplifier 180[x]. Signals corresponding to the inspection results are output from the amplifiers 180 to the arithmetic circuit 56 through the buffers BUF.

The arithmetic circuit 56 has a function of calculating errors of potential of outputs of the amplifiers 180[x−2] to 180[x] on the basis of the data SD and the signals input from the buffers BUF, and outputting the errors of potential as data Dos [x−2] to Dos[x] to the latch circuits 120 in the lines L[x−2] to L[x]. The latch circuit 120 outputs the data SD' obtained by subtracting the data Dos from the data SD to the corresponding decoder 130 (not illustrated). In such a manner, video signals from which the errors of potential are canceled out can be generated.

In a period when the amplifiers 180 normally operate, the arithmetic circuit 56 does not perform an arithmetic operation and does not output the data Dos. Thus, supply of power to the arithmetic circuit 56 is preferably terminated during this period. This can reduce the power consumption of the driver circuit 50.

The switches SW1, SW2, and SW3 can each be composed of a transistor or an analog switch, for example. In particular, OS transistors are preferably used as the switches SW1 and SW2. In that case, the off-state current of the switches SW1 and SW2 can be extremely low; consequently, variations in potentials supplied to the inverting input terminals of the operational amplifiers OP can be significantly small. As a result, accuracy of inspection of outputs of the amplifiers 180 can be increased.

The buffer BUF may have a function of shifting the level of a signal output to the arithmetic circuit 56. This allows a signal output through the switch SW3 to be converted into a signal to be used for an arithmetic operation in the arithmetic circuit 56.

<Operation Example of Amplifier>

Next, a specific operation example of the amplifiers 180 when errors of potential are calculated and video signals are corrected will be described. Here, the case where outputs of three amplifiers 180[x−2] to 180[x] are inspected to calculate the data Dos[x−2] to Dos[x] will be described as an example.

[Inspecting Operation 1]

Figure 4:
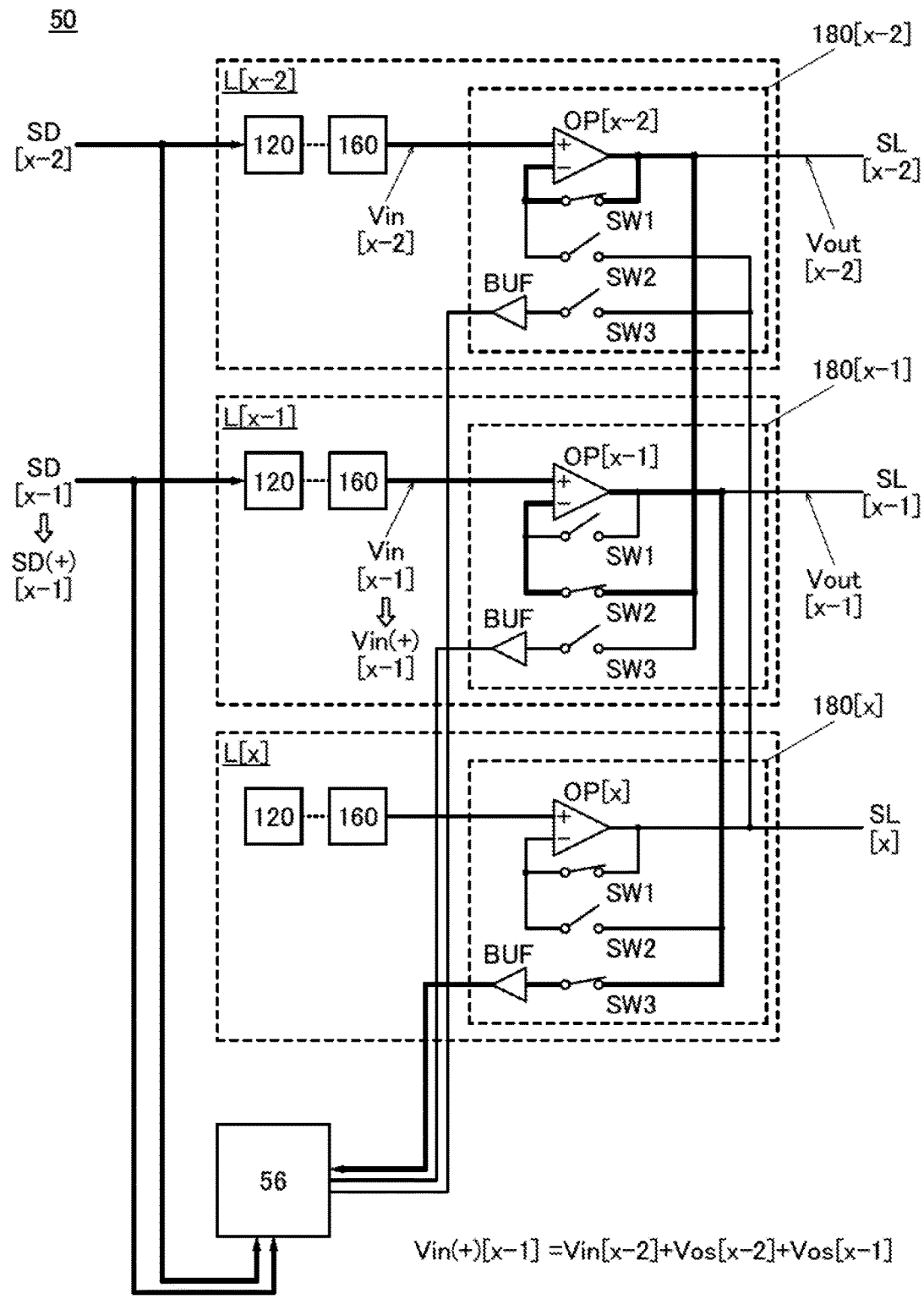
FIG. 4 illustrates an operation example of a driver circuit.

FIG. 4 illustrates an operation example of the case where an output of the amplifier 180[x−2] is inspected using the amplifier 180[x−1]. When the output of the amplifier 180 [x−2] is inspected, the switch SW1 in the amplifier 180[x−2] is on and the switches SW2 and SW3 in the amplifier 180[x−2] are off; the switch SW2 in the amplifier 180[x−1] is on and the switches SW1 and SW3 in the amplifier 180[x−1] are off; and the switches SW1 and SW3 in the amplifier 180[x] are on and the switch SW2 in the amplifier 180[x] is off.

First, in the line L[x−2], the data SD[x−2] is input to the latch circuit 120, and the potential Vin[x−2] corresponding to the analog value of the data SD[x−2] is input from the selection circuit 160 to the amplifier 180[x−2]. In the line L[x−1], the data SD[x−1] is input to the latch circuit 120, and the potential Vin[x−1] corresponding to the analog value of the data SD[x−1] is input from the selection circuit 160 to the amplifier 180[x−1].

The operational amplifier OP[x−2] outputs the potential Vout[x−2] with the use of the potential Vin[x−2] as an input potential. Then, the potential Vout[x−2] is input to an inverting input terminal of the operational amplifier OP[x−1].

Here, the operational amplifier OP[x−2] constitutes a voltage follower. Thus, the relation between the potential Vin[x−2] and the potential Vout[x−2] is ideally as follows: Vin[x−2]=Vout[x−2]. However, owing to an influence of, for example, the characteristics of elements included in the operational amplifier OP[x−2], an output of the operational amplifier OP[x−2] might deviate from the potential Vin[x−2], that is, a difference might be caused between the expected value and the measured value of the potential Vout (hereinafter a difference between the expected value and the measured value of an output potential of the operational amplifier OP is also referred to as an error of potential). Considering an error of potential Vos[x−2] of the operational amplifier OP[x−2], the potential Vout[x−2] is expressed by the following formula.

[Formula 1]

$$V_{out}[x-2] = V_{in}[x-2] + V_{os}[x-2] \quad (1)$$

Next, the data SD[x−1] input to the line L[x−1] is changed. Specifically, signals for gradually changing the data SD[x−1] to be close to the data SD[x−2] are input sequentially. This gradually increases the potential Vin[x−1] to be close to the potential Vin[x−2]. When the potential Vin[x−1] reaches the potential Vout[x−2], the output of the operational amplifier OP[x−1] shifts from the low level to the high level. The potential Vin[x−1] at this time is a potential Vin(+)[x−1].

The potential Vin(+)[x−1] is the potential Vout[x−2] to which the error of potential Vos[x−1] of the operational amplifier OP[x−1] is added. Thus, the potential Vin(+)[x−1] is expressed by the following formula.

[Formula 2]

$$V_{in}(+)[x-1] = V_{in}[x-2] + V_{os}[x-2] + V_{os}[x-1] \quad (2)$$

The output of the operational amplifier OP[x−1] corresponds to the inspection result of the output of the operational amplifier OP[x−2] and is input to the arithmetic circuit 56 through the switch SW3 and the buffer BUF in the amplifier 180[x]. The arithmetic circuit 56 stores the data SD[x−2] and the data SD[x−1] when the output of the operational amplifier OP[x−1] shifts from the low level to the high level, that is, data SD(+)[x−1]. Here, the data SD[x−2] and the data SD(+)[x−1] are digital values corresponding to the potential Vin[x−2] and the potential Vin(+)[x−1], respectively. Thus, the arithmetic circuit 56 can obtain the pair in Formula 2, the potential Vin[x−2] and the potential Vin(+)[x−1], from the data SD[x−2] and the data SD(+)[x−1].

The output of the amplifier 180[x−2] is inspected using the amplifier 180[x−1] in the aforementioned manner, whereby the relation between the error of potential Vos[x−2] and the error of potential Vos[x−1], which is shown in Formula 2, can be obtained.

Although inspection is performed by gradually increasing the potential Vin[x−1] here, the potential Vin[x−1] may be gradually decreased to be close to the potential Vin[x−2]. In that case, the potential Vin[x−1] when the output of the operational amplifier OP [x−1] shifts from the high level to the low level corresponds to the potential Vin(+)[x−1].

[Inspecting Operation 2]

Figure 5:
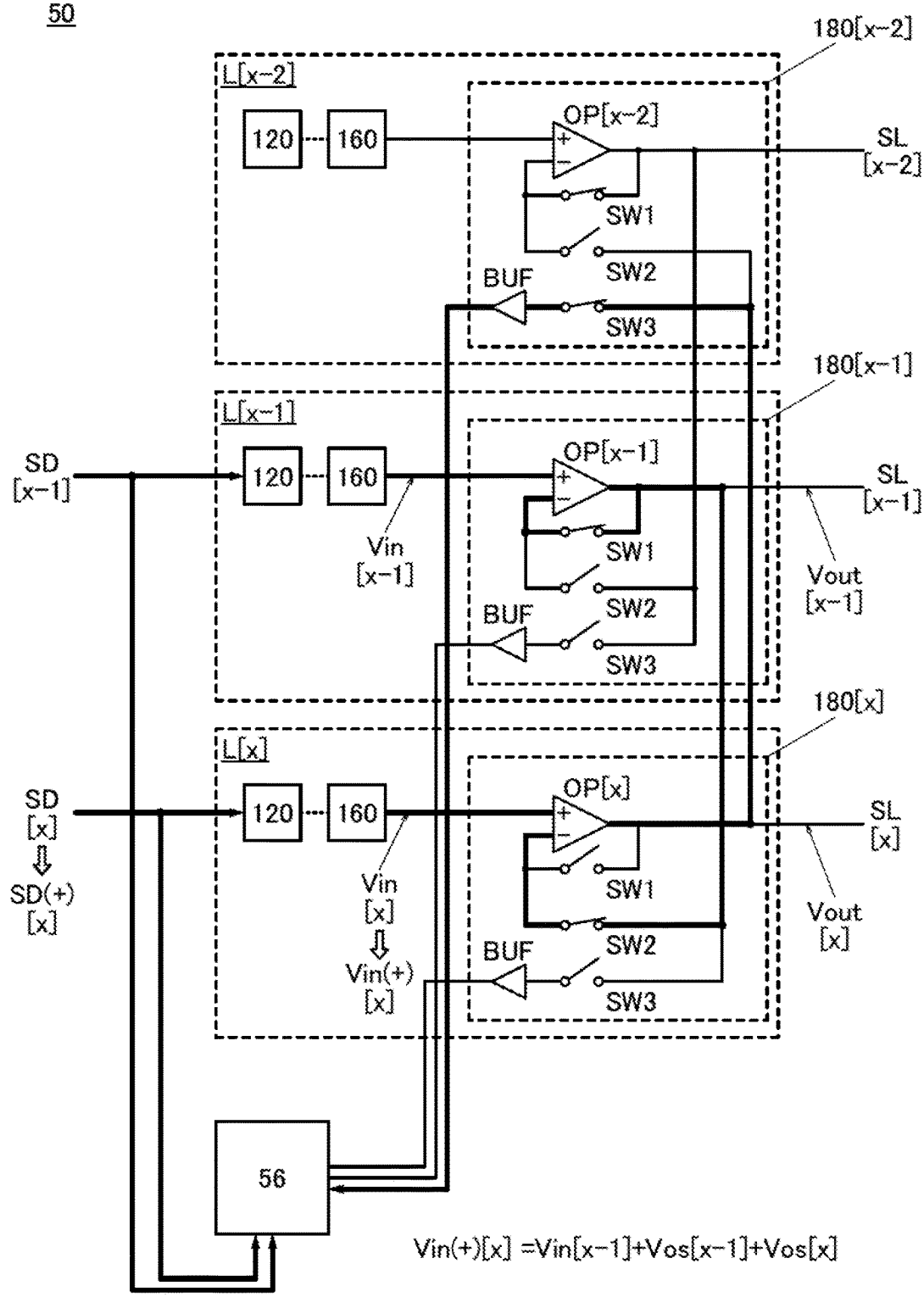
FIG. 5 illustrates an operation example of a driver circuit.

FIG. 5 illustrates an operation example of the case where an output of the amplifier 180[x−1] is inspected using the amplifier 180[x]. When the output of the amplifier 180[x−1] is inspected, the switch SW1 in the amplifier 180[x−1] is on and the switches SW2 and SW3 in the amplifier 180[x−1] are off, the switch SW2 in the amplifier 180[x] is on and the switches SW1 and SW3 in the amplifier 180[x] are off; and the switches SW1 and SW3 in the amplifier 180[x−2] are on and the switch SW2 in the amplifier 180[x−2] is off.

First, in the line L[x−1], the data SD[x−1] is input to the latch circuit 120, and the potential Vin[x−1] corresponding to the analog value of the data SD[x−1] is input from the selection circuit 160 to the amplifier 180[x−1]. In the line L[x], the data SD[x] is input to the latch circuit 120, and the potential Vin[x] corresponding to the analog value of the data SD[x] is input from the selection circuit 160 to the amplifier 180[x].

The operational amplifier OP[x−1] outputs the potential Vout[x−1] with the use of the potential Vin[x−1] as an input potential. Then, the potential Vout[x−1] is input to an inverting input terminal of the operational amplifier OP[x]. Considering the error of potential Vos[x−1] of the operational amplifier OP[x−1], the potential Vout[x−1] is expressed by the following formula.

[Formula 3]

$$V_{out}[x-1] = V_{in}[x-1] + V_{os}[x-1] \quad (3)$$

Next, the data SD[x] input to the line L[x] is changed. Specifically, signals for gradually changing the data SD[x] to be close to the data SD[x−1] are input sequentially. This gradually increases the potential Vin[x] to be close to the potential Vin[x−1]. When the potential Vin[x] reaches the potential Vout[x−1], the output of the operational amplifier OP[x] shifts from the low level to the high level. The potential Vin[x] at this time is a potential Vin(+)[x].

The potential Vin(+)[x] is the potential Vout[x−1] to which the error of potential Vos[x] of the operational amplifier OP[x] is added. Thus, the potential Vin(+)[x] is expressed by the following formula.

[Formula 4]

$$V_{in}(+)[x] = V_{in}[x-1] + V_{os}[x-1] + V_{os}[x] \quad (4)$$

The output of the operational amplifier OP[x] corresponds to the inspection result of the output of the operational amplifier OP[x−1] and is input to the arithmetic circuit 56 through the switch SW3 and the buffer BUF in the amplifier 180[x−2]. The arithmetic circuit 56 stores the data SD[x−1] and the data SD[x] when the output of the operational amplifier OP[x] shifts from the low level to the high level, that is, data SD(+)[x]. Here, the data SD[x−1] and the data SD(+)[x] are digital values corresponding to the potential Vin[x−1] and the potential Vin(+)[x], respectively. Thus, the arithmetic circuit 56 can obtain the pair in Formula 4, the potential Vin[x−1] and the potential Vin(+)[x], from the data SD[x−1] and the data SD(+)[x].

The output of the amplifier 180[x−1] is inspected using the amplifier 180[x] in the aforementioned manner, whereby the relation between the error of potential Vos[x−1] and the error of potential Vos[x], which is shown in Formula 4, can be obtained.

[Inspecting Operation 3]

Figure 6:
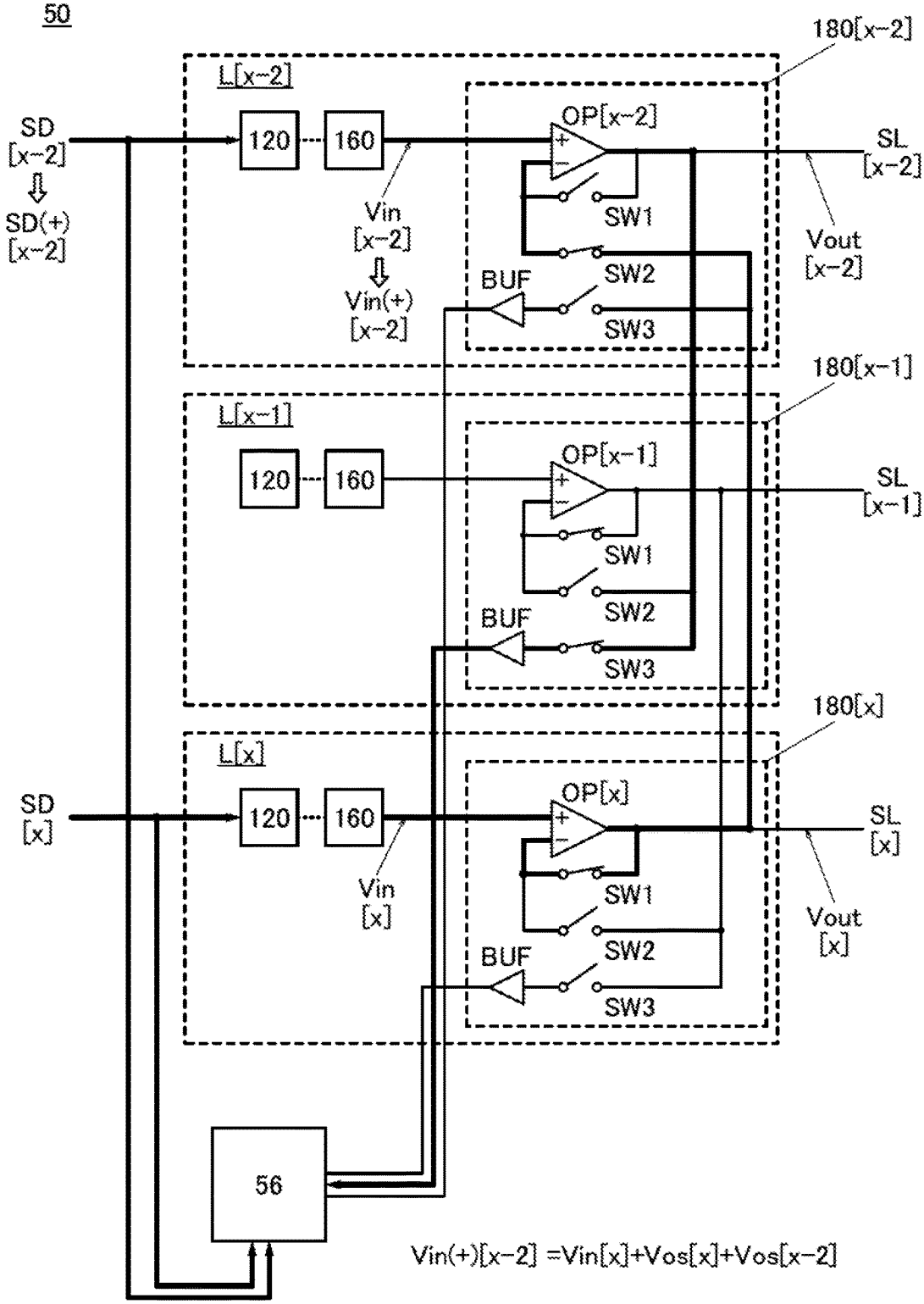
FIG. 6 illustrates an operation example of a driver circuit.

FIG. 6 illustrates an operation example of the case where an output of the amplifier 180[x] is inspected using the amplifier 180[x−2]. When the output of the amplifier 180[x] is inspected, the switch SW1 in the amplifier 180[x] is on and the switches SW2 and SW3 in the amplifier 180[x] are off; the switch SW2 in the amplifier 180[x−2] is on and the switches SW1 and SW3 in the amplifier 180[x−2] are off; and the switches SW1 and SW3 in the amplifier 180[x−1] are on and the switch SW2 in the amplifier 180[x−1] is off.

First, in the line L[x], the data SD[x] is input to the latch circuit 120, and the potential Vin[x] corresponding to the analog value of the data SD[x] is input from the selection circuit 160 to the amplifier 180[x]. In the line L[x−2], the data SD[x−2] is input to the latch circuit 120, and the potential Vin[x−2] corresponding to the analog value of the data SD[x−2] is input from the selection circuit 160 to the amplifier 180[x−2].

The operational amplifier OP[x] outputs the potential Vout[x] with the use of the potential Vin[x] as an input potential. Then, the potential Vout[x] is input to an inverting input terminal of the operational amplifier OP[x−2]. Considering the error of potential Vos[x] of the operational amplifier OP[x], the potential Vout[x] is expressed by the following formula.
[Formula 5]

$$V_{out}[x]=V_{in}[x]+V_{os}[x] \qquad (5)$$

Next, the data SD[x−2] input to the line L[x−2] is changed. Specifically, signals for gradually changing the data SD[x−2] to be close to the data SD[x] are input sequentially. This gradually increases the potential Vin[x−2] to be close to the potential Vin[x]. When the potential Vin[x−2] reaches the potential Vout[x], the output of the operational amplifier OP[x−2] shifts from the low level to the high level. The potential Vin[x−2] at this time is a potential Vin(+)[x−2].

The potential Vin(+)[x−2] is the potential Vout[x] to which the error of potential Vos[x−2] of the operational amplifier OP[x−2] is added. Thus, the potential Vin(+)[x−2] is expressed by the following formula.
[Formula 6]

$$V_{in}(+)[x-2]=V_{in}[x]+V_{os}[x]+V_{os}[x-2] \qquad (6)$$

The output of the operational amplifier OP[x−2] corresponds to the inspection result of the output of the operational amplifier OP[x] and is input to the arithmetic circuit 56 through the switch SW3 and the buffer BUF in the amplifier 180[x−1]. The arithmetic circuit 56 stores the data SD[x] and the data SD[x−2] when the output of the operational amplifier OP[x−2] shifts from the low level to the high level, that is, data SD(+)[x−2]. Here, the data SD[x] and the data SD(+)[x−2] are digital values corresponding to the potential Vin[x] and the potential Vin(+)[x−2], respectively. Thus, the arithmetic circuit 56 can obtain the pair in Formula 6, the potential Vin[x] and the potential Vin(+)[x−2], from the data SD[x] and the data SD(+)[x−2].

The output of the amplifier 180[x] is inspected using the amplifier 180[x−2] in the aforementioned manner, whereby the relation between the error of potential Vos[x] and the error of potential Vos[x−2], which is shown in Formula 6, can be obtained.
[Correcting Operation]

Figure 7:
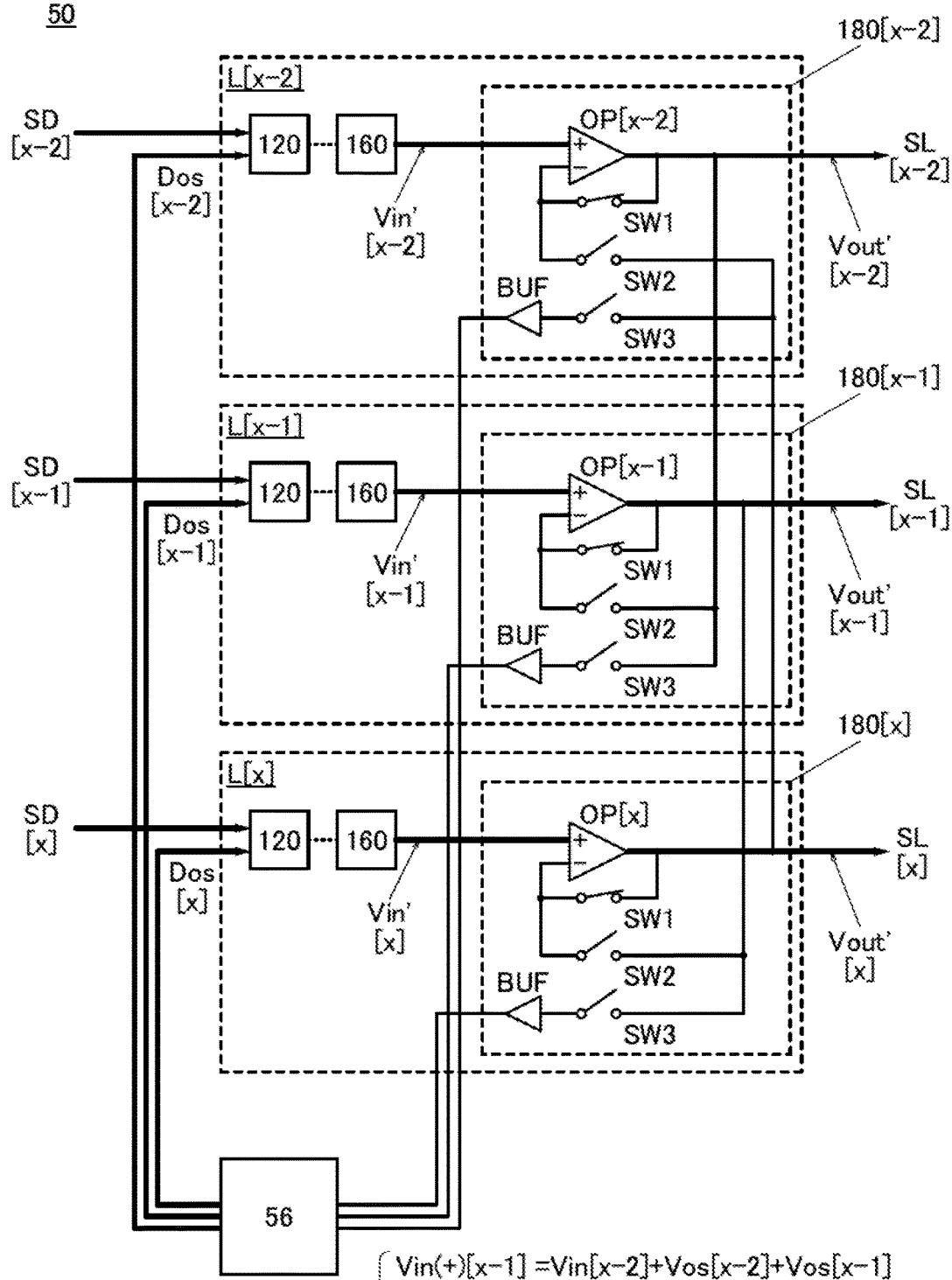
FIG. 7 illustrates an operation example of a driver circuit.

FIG. 7 illustrates an operation example of the case where errors of potential are calculated by the arithmetic circuit 56 and video signals are corrected on the basis of the errors of potential.

From Inspecting operations 1 to 3, the relations of Formulae 2, 4, and 6 can be obtained. Here, Formulae 2, 4, and 6 form simultaneous equations with three unknowns Vos[x], Vos[x−1], and Vos[x−2]. The arithmetic circuit 56 has a function of calculating the errors of potential Vos[x], Vos[x−1], and Vos[x−2] from the relations of Formulae 2, 4, and 6. Note that the digital data (SD[x−2], SD[x−1], SD[x], SD(+)[x−2], SD(+)[x−1], and SD(+)[x]) stored in the arithmetic circuit 56 are used in Inspecting operations 1 to 3 in order to calculate the errors of potential. The errors of potential Vos[x], Vos[x−1], and Vos[x−2] obtained by calculation in the arithmetic circuit 56 are supplied to the latch circuits 120 as the data Dos[x−2], Dos[x−1], and Dos[x], respectively.

The latch circuit 120 subtracts the error of potential from the input data SD to generate the data SD'. Specifically, the latch circuit 120 in the line L[x−2] outputs data SD'[x−2], which is obtained by subtracting the data Dos[x−2] from the data SD[x−2], to the corresponding decoder 130 (not illustrated). The latch circuit 120 in the line L[x−1] outputs data SD'[x−1], which is obtained by subtracting the data Dos[x−1] from the data SD[x−1], to the corresponding decoder 130 (not illustrated). The latch circuit 120 in the line L[x] outputs data SD'[x], which is obtained by subtracting the data Dos[x] from the data SD[x], to the corresponding decoder 130 (not illustrated). Then, the lines L generate analog potentials on the basis of the data SD' and supply the analog potentials to the wirings SL. Thus, the driver circuit 50 can supply desired video signals to the wirings SL regardless of variations in the characteristics of the amplifiers 180. Consequently, a reliable display device with high quality can be fabricated.

Although errors of potential are calculated using a set of three amplifiers 180 here, the number of amplifiers 180 used for calculation of offset potentials is not limited to three.
<Configuration Example of Latch Circuit>

Figure 8A:
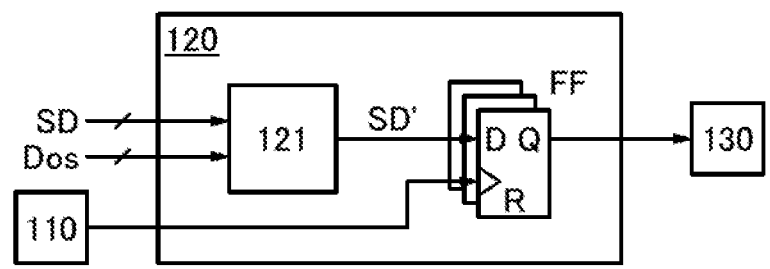
FIGS. 8A to 8C illustrate a configuration example of a latch circuit.

Next, a configuration example of the latch circuit 120 will be described. The latch circuit 120 has a function of subtracting an error of potential from the data SD. FIG. 8A illustrates a configuration example of the latch circuit 120.

The latch circuit 120 includes a subtraction circuit 121 and a plurality of flip-flops FF. The data SD and the data Dos are input to the subtraction circuit 121, and the data SD' generated by the subtraction circuit 121 and a sampling pulse generated by the register 110 are input to the flip-flops FF.

The subtraction circuit 121 has a function of performing subtraction. When the data SD and the data Dos are input to the subtraction circuit 121, the subtraction circuit 121 subtracts the data Dos from the data SD and outputs the subtraction result as the data SD' to the flip-flop FF. The flip-flop FF has a function of storing the data SD', which is input from the subtraction circuit 121, at a given timing and outputting the data SD' to the decoder 130. The timing at which the data SD' is output is controlled by the sampling pulse generated by the register 110.

Figure 8B:
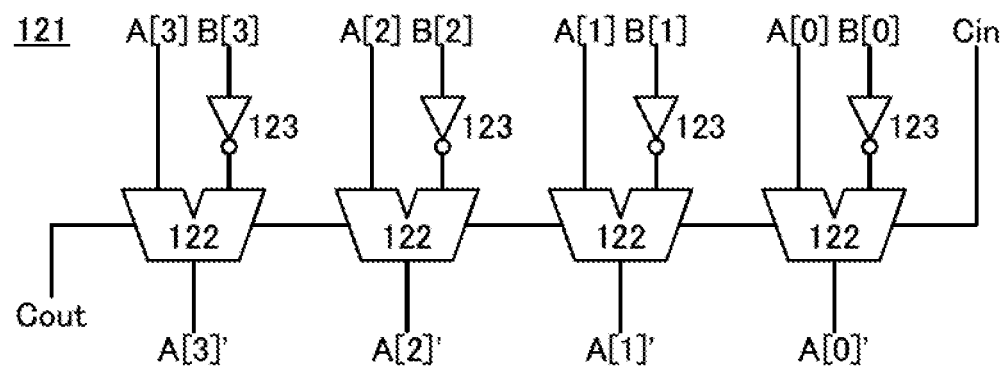

FIG. 8B illustrates a configuration example of the subtraction circuit 121. The subtraction circuit 121 includes adders 122 and inverters 123. Here, the case where 4-bit data B[3:0] is subtracted from 4-bit data A[3:0] to obtain data A'[3:0] will be described as an example. In this case, the subtraction circuit 121 is provided with four adders 122 and four inverters 123.

The data A and an inverted signal of the data B are input to the adder 122. In the arithmetic operation of digital data, A−B=A+Bb+1 (Bb is an inverted signal of B) is satisfied. Thus, by inputting the data A and the data Bb to the adder 122, data A', which is obtained by subtracting the data B from the data A, can be obtained.

Figure 8C:
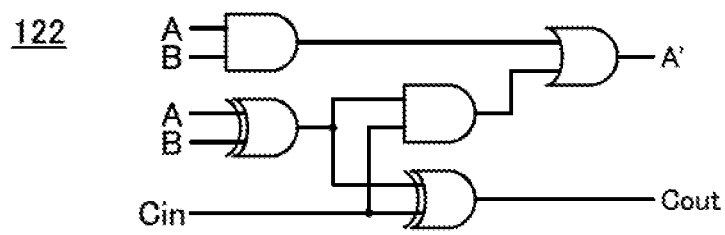

The adder 122 can be composed of two XOR circuits, two AND circuits, and one OR circuit as illustrated in FIG. 8C, for example. Here, A and B are input data, and A' is output data. Data Cin corresponds to a carry, and data Cout corresponds to a carry of A+B+Cin.

As described above, the subtraction circuit 121 provided in the latch circuit 120 allows subtraction of the data Dos from the data SD, canceling out an error of potential.

<Configuration Example of D/A Converter Circuit>

Next, a configuration example of the D/A converter circuit 54 will be described. The D/A converter circuit 54 includes the selection circuits 160 and the potential generation circuit 170.

[Selection Circuit]

Figure 9:
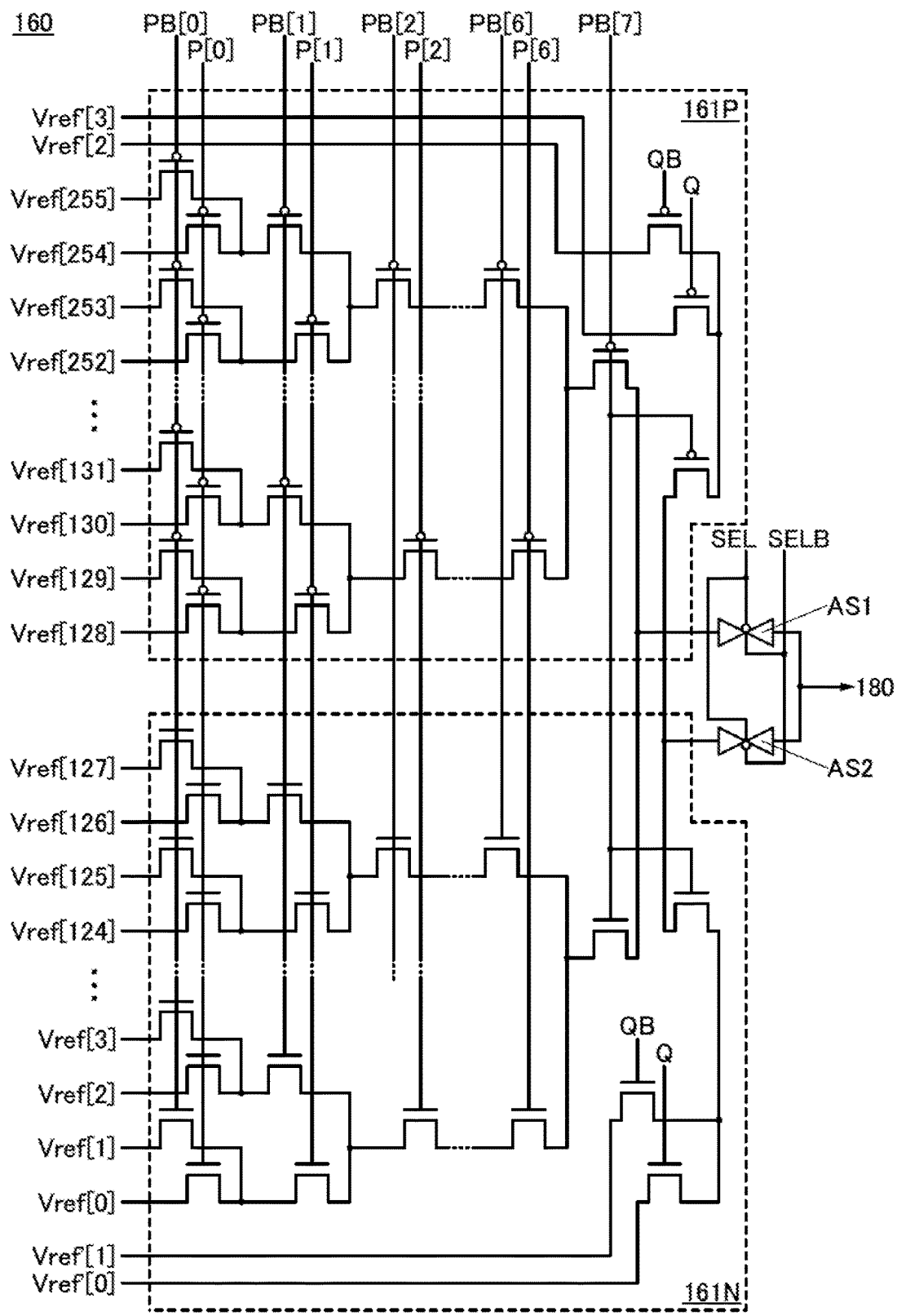
FIG. 9 illustrates a configuration example of a selection circuit.

FIG. 9 illustrates a configuration example of the selection circuit 160. The selection circuit 160 has a function of supplying a potential corresponding to the data SD, on the basis of a control signal input from the level shifter 150. Here, the case where signals P[0] to P[6], inverted signals PB[0] to PB[6] of the signals P[0] to P[6], and a signal PB[7] are input as control signals from the level shifter 150 and 256 kinds of reference potentials Vref (Vref[0] to Vref[255]) are input from the potential generation circuit 170 will be described as an example. Note that the number of control signals input from the level shifter 150 and the number of potentials input from the potential generation circuit 170 can be appropriately set in accordance with the number of gray levels displayed by the pixels. The ascending order of levels of potentials that are input from the potential generation circuit 170 is Vref[0], which is the lowest potential, to Vref[255].

The selection circuit 160 includes a circuit 161P composed of p-channel transistors and a circuit 161N composed of n-channel transistors. The reference potentials Vref[0] to Vref[127] are input to the circuit 161N, and the reference potentials Vref[128] to Vref[255] are input to the circuit 161P. The selection circuit 160 selects any of the reference potentials Vref[0] to Vref[255] on the basis of a control signal input from the level shifter 150 and outputs the selected reference potential to the amplifier 180. Thus, a potential (analog value) corresponding to the data SD is output to the amplifier 180.

In the case where the reference potentials Vref[0] to Vref[255] are input to the selection circuit 160, 256 kinds of potentials can be supplied to the wiring SL, and thus, the pixel can display 256 kinds of gray levels. However, in the case where the data SD is corrected (see FIG. 7), a potential corresponding to the data SD after correction might be lower than the reference potential Vref[0] or higher than the reference potential Vref[255]. Therefore, it is preferred that reference potentials lower than Vref[0] (here, Vref'[0] and Vref'[1]) and reference potentials higher than Vref[255] (here, Vref'[2] and Vref'[3]) be supplied to the selection circuit 160. This allows a potential corresponding to the corrected data SD to be output to the amplifier 180.

The on/off states of the transistors included in the circuit 161P and the circuit 161N are controlled by control signals Q, QB, and PB[7], and any one of the reference potentials Vref[0] to Vref'[3] is selected. Then, the selected reference potential Vref' is output to the amplifier 180. Note that the control signal QB is an inverted signal of the control signal Q.

Which of the reference potential Vref and the reference potential Vref' is output to the amplifier 180 can be selected by controlling the on/off states of analog switches AS1 and AS2 with the use of control signals SEL and SELB. Specifically, when the analog switch AS1 is turned on and the analog switch AS2 is turned off by the control signals SEL and SELB, any one of the reference potentials Vref[0] to Vref[255] is output to the amplifier 180. When the analog switch AS1 is turned off and the analog switch AS2 is turned on by the control signals SEL and SELB, any one of the reference potentials Vref'[0] to Vref'[3] is output to the amplifier 180. Note that the control signal SELB is an inverted signal of the control signal SEL.

The number of reference potentials to be input to the selection circuit 160 is set to be larger than that of gray levels to be displayed by pixels in the aforementioned manner, whereby video signals can be corrected with accuracy.

[Potential Generation Circuit]

Figure 10:
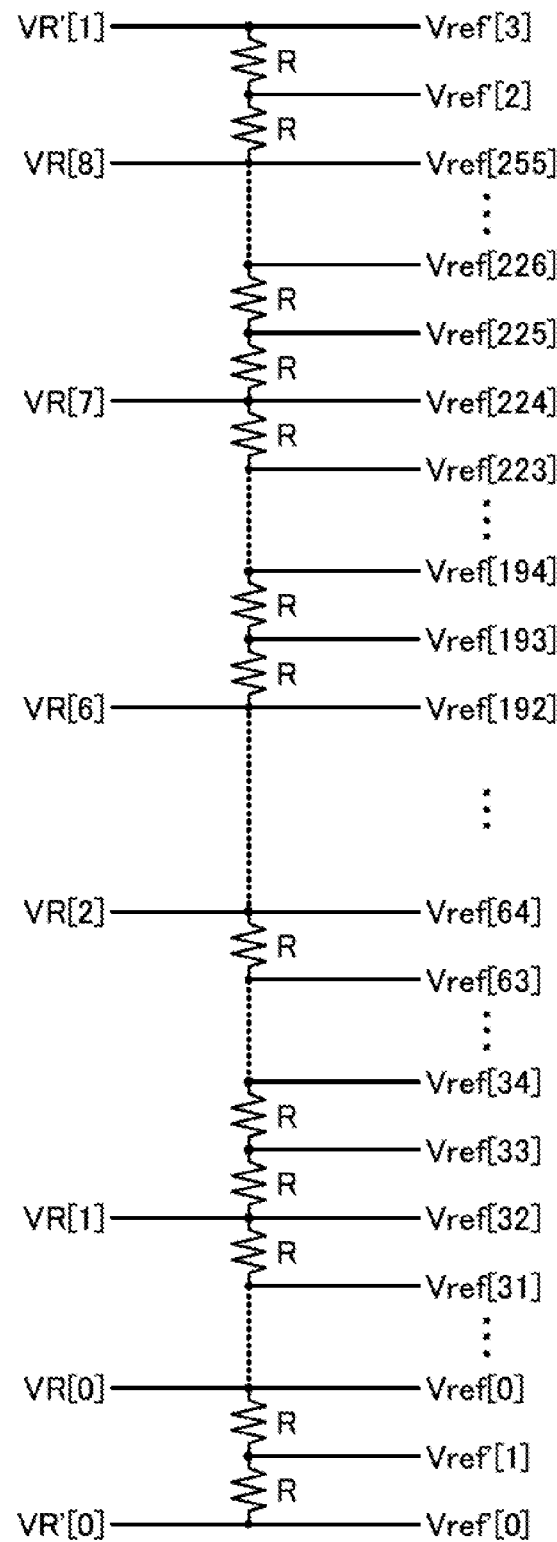
FIG. 10 illustrates a configuration example of a potential generation circuit.

FIG. 10 illustrates a configuration example of the potential generation circuit 170. The potential generation circuit 170 has a function of generating the reference potentials Vref to be supplied to the selection circuit 160 with the use of reference potentials VR. Although the example in which the reference potentials Vref[0] to Vref[255] are generated from reference potentials VR[0] to VR[8] is described here, the number of reference potentials VR is appropriately set in accordance with the number of reference potentials Vref that are generated.

The reference potentials VR[0] to VR[8] are supplied to the selection circuit 160 and are used as the reference potentials Vref. The reference potentials VR[0], VR[1], VR[2], VR[3], VR[4], VR[5], VR[6], VR[7], and VR[8] in FIG. 10 are used as the reference potentials Vref[0], Vref[32], Vref[64], Vref[96], Vref[128], Vref[160], Vref[192], Vref[224], and Vref[255], respectively. Furthermore, resistors R that are connected in series are provided between adjacent two wirings of wirings supplied with the reference potentials VR[0] to VR[8]. A difference between adjacent two reference potentials VR is divided by the resistors R to generate potentials between the two reference potentials VR, and these potentials can be used as the reference potentials Vref other than the above nine kinds of reference potentials Vref In such a manner, the reference potentials Vref[0] to Vref[255] can be generated. Note that the number of resistors R is set in accordance with the number of reference potentials Vref that are generated.

A reference potential lower than VR[0] (here, VR'[0]) and a reference potential higher than VR[8] (here, VR'[1]) are supplied to the potential generation circuit 170. The reference potentials VR'[0] and VR'[1] are used as the reference potentials Vref'[0] and Vref'[3], respectively. By the resistors R, the reference potential Vref'[1] between the reference potential Vref'[0] and the reference potential Vref[0] and the reference potential Vref'[2] between the reference potential Vref'[3] and the reference potential Vref[255] are generated.

According to one embodiment of the present invention, video signals to be supplied to the wirings SL with the use of the amplifier circuit 55 can be inspected and errors of potential can be calculated using the arithmetic circuit 56, in the above-described manner. Furthermore, according to one embodiment of the present invention, video signals are corrected on the basis of the calculated errors of potential, whereby the errors of potential of the video signals can be canceled out. In such a manner, unevenness of an image displayed on the pixel portion 20 can be reduced; thus, a reliable display device with high quality can be obtained. Moreover, according to one embodiment of the present invention, whether the amplifier 180 outputs an accurate potential corresponding to the data SD can be inspected without using a test circuit additionally provided.

This embodiment can be combined with any of the other embodiments as appropriate.

(Embodiment 2)

In this embodiment, a configuration example of the pixel described in the above embodiment will be described.

<Configuration Example 1>

Figure 11A:
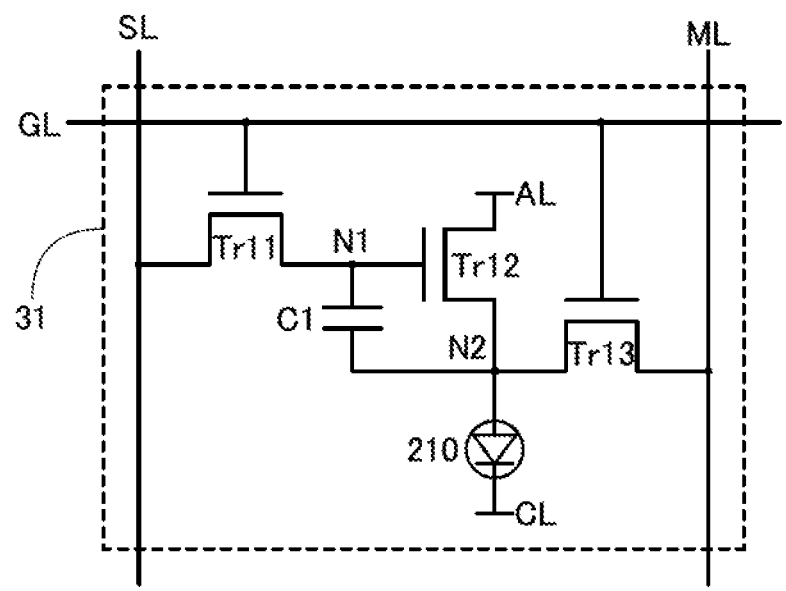
FIGS. 11A and 11B each illustrate a configuration example of a pixel.

FIG. 11A illustrates a configuration example of a pixel using a light-emitting element. The pixel 31 in FIG. 11A includes transistors Tr11 to Tr13, a light-emitting element 210, and a capacitor C1. Note that the transistors Tr11 to Tr13 are n-channel transistors here, but may be p-channel transistors.

A gate of the transistor Tr11 is connected to the wiring GL. One of a source and a drain of the transistor Tr11 is connected to a gate of the transistor Tr12 and one electrode of the capacitor C1. The other of the source and the drain of the transistor Tr11 is connected to the wiring SL. One of a source and a drain of the transistor Tr12 is connected to the other electrode of the capacitor C1, one electrode of the light-emitting element 210, and one of a source and a drain of the transistor Tr13. The other of the source and the drain of the transistor Tr12 is connected to a wiring AL to which a potential Va is supplied. The other electrode of the light-emitting element 210 is connected to a wiring CL to which a potential Vc is supplied. A gate of the transistor Tr13 is connected to a wiring GL, and the other of the source and the drain of the transistor Tr13 is connected to a wiring ML. A node which is connected to the one of the source and the drain of the transistor Tr11, the gate of the transistor Tr12, and the one electrode of the capacitor C1 is referred to as a node N1. A node which is connected to the one of the source and the drain of the transistor Tr12, the one of the source and the drain of the transistor Tr13, and the other electrode of the capacitor C1 is referred to as a node N2.

Here, the potential Va supplied to the wiring AL is set to a high power supply potential and the potential Va supplied to the wiring CL is set to a low power supply potential. The capacitor C1 functions as a storage capacitor for holding the potential of the node N2.

The transistor Tr11 has a function of controlling supply of the potential of the wiring SL to the node N1. The transistor Tr13 has a function of controlling supply of the potential of the wiring ML to the node N2. Specifically, the potential of the wiring GL is controlled to turn on the transistors Tr11 and Tr13, whereby the potential of the wiring SL and the potential of the wiring ML are supplied to the node N1 and the node N2, respectively, and are written to the pixel 31. Here, the potential of the wiring SL corresponds to a video signal. Then, the potential of the wiring GL is controlled to turn off the transistors Tr11 and Tr13, whereby the voltage between the nodes N1 and N2 is held.

The amount of current flowing between the source and the drain of the transistor Tr12 is controlled in accordance with the voltage between the nodes N1 and N2. The light-emitting element 210 emits light with a luminance depending on the amount of flowing current. Accordingly, the gray level of the pixel 31 can be controlled.

The above operations are performed for the wirings GL one by one, whereby an image for a first frame can be displayed on the pixel portion 20.

The selection of any of the wirings GL may be performed by either progressive scan or interlaced scan. The supply of video signals from the driver circuit 50 to the wirings SL may be performed by dot sequential driving in which video signals are sequentially supplied to the wirings SL, or line sequential driving in which video signals are concurrently supplied to the wirings SL. Alternatively, supply of video signals may be performed for every plural wirings SL.

Next, in a second frame period, an image is displayed by an operation similar to that of a first frame period. Thus, the image displayed on the pixel portion 20 is rewritten. Note that the image rewriting is performed at a rate high enough to prevent a change in an image due to the rewriting from being recognized by a viewer of the pixel portion 20. In the case where a moving image is displayed on the pixel portion 20, image rewriting is preferably performed at a frequency of higher than or equal to 60 times per second, for example. Accordingly, a smooth moving image can be displayed.

On the other hand, for example, in the case of displaying a still image or a moving image which does not change for a certain period or changes within a predetermined range on the pixel portion 20, it is preferable not to rewrite the image and to keep the image of the previous frame. In this way, power consumption associated with image rewriting can be reduced.

When the frequency of image rewriting is reduced, the voltage between the nodes N1 and N2 is preferably held for a long time. Thus, OS transistors are preferably used as the transistors Tr11 and Tr13, in which case the potentials of the nodes N1 and N2 can be held for an extremely long time, and the display state of an image can be maintained even when the frequency of image rewriting is reduced. The frequency of the image rewriting is more than or equal to once every day and less than 0.1 times every second, preferably more than or equal to once every hour and less than once every second, more preferably more than or equal to once every 30 seconds and less than once every second, for example.

Note that to maintain a display state is to keep the amount of change in an image within a given range. This given range can be set appropriately, and is preferably set such that a user viewing displayed images can recognize the displayed images as the same image.

Reducing the frequency of image rewriting leads to reduction in flickers in displaying an image. Accordingly, eyestrain of a viewer of the pixel portion 20 can be reduced.

In a period in which image rewriting is not performed, the supply of power supply potentials and signals to the driver circuit 40 and the driver circuit 50 can be stopped. Thus, power consumption of the driver circuits 40 and 50 can be reduced.

Note that transistors other than OS transistors may be used as the transistors Tr11 and Tr13. For example, a transistor whose channel formation region is formed in part of a substrate including a single-crystal semiconductor other than a metal oxide can be used. Examples of this kind of substrate include a single-crystal silicon substrate and a single-crystal germanium substrate. As each of the transistors Tr11 and Tr13, a transistor whose channel formation region is formed in a film including a material other than a metal oxide may be used. Examples of the material other than a metal oxide include silicon, germanium, silicon germanium, silicon carbide, gallium arsenide, aluminum gallium arsenide, indium phosphide, gallium nitride, and an organic semiconductor. Each of the above materials may be a single crystal semiconductor or a non-single-crystal semiconductor such as an amorphous semiconductor, a microcrystalline semiconductor, or a polycrystalline semiconductor.

Examples of a material that can be used for channel formation regions of the transistor Tr12 and a transistor described below are the same as examples of a material for the transistors Tr11 and Tr13.

<Configuration Example 2>

Figure 11B:
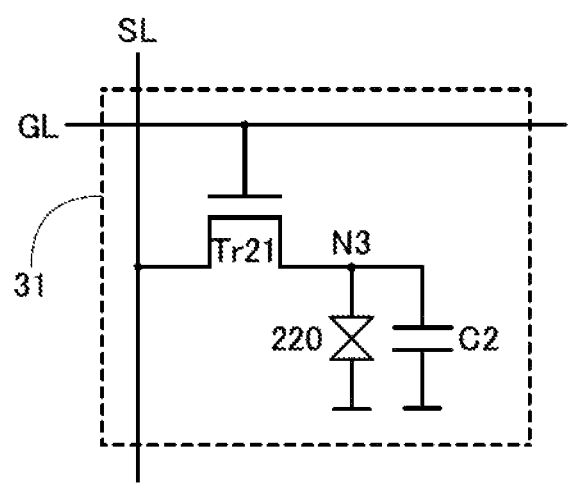

FIG. 11B illustrates a configuration example of a pixel using a liquid crystal element. The pixel 31 illustrated in FIG. 11B includes a transistor Tr21, a liquid crystal element 220, and a capacitor C2. Although the transistor Tr21 is an n-channel transistor here, the transistor Tr21 may be a p-channel transistor.

A gate of the transistor Tr21 is connected to the wiring GL. One of a source and a drain of the transistor Tr21 is connected to one electrode of the liquid crystal element 220 and one electrode of the capacitor C2. The other of the source and the drain of the transistor Tr21 is connected to the wiring SL. The other electrode of the liquid crystal element 220 and the other electrode of the capacitor C2 are each connected to a wiring to which a predetermined potential is supplied. A node which is connected to the one of the source and the drain of the transistor Tr21, the one electrode of the liquid crystal element 220, and the one electrode of the capacitor C2 is a node N3.

The potential of the other of the electrodes of the liquid crystal element 220 may be a common potential among the plurality of pixels 31 or may be the same as that of the other electrode of the capacitor C2. The potential of the other electrode of the liquid crystal element 220 may differ between the pixels 31. The capacitor C2 functions as a storage capacitor for holding the potential of the node N3.

The transistor Tr21 has a function of controlling supply of the potential of the wiring SL to the node N3. Specifically, the potential of the wiring GL is controlled to turn on the transistor Tr21, whereby the potential of the wiring SL is supplied to the node N3 and is written to the pixel 31. Then, the potential of the wiring GL is controlled to turn off the transistor Tr21, whereby the potential of the node N3 is held.

The liquid crystal element 220 includes a pair of electrodes and a liquid crystal layer containing a liquid crystal material to which the voltage between the pair of electrodes is applied. The alignment of liquid crystal molecules included in the liquid crystal element 220 changes in accordance with the value of the voltage applied between the pair of electrodes, and thus the transmittance of the liquid crystal layer is changed. Therefore, controlling the potential supplied from the wiring SL to the node N3 allows the gray level of the pixel 31 to be controlled.

An OS transistor is preferably used as the transistor Tr21, in which case the potential of the node N3 can be held for an extremely long time. Note that the description of FIG. 11A can be referred to for operations other than the above.
<Modification Example>

Figure 12A:
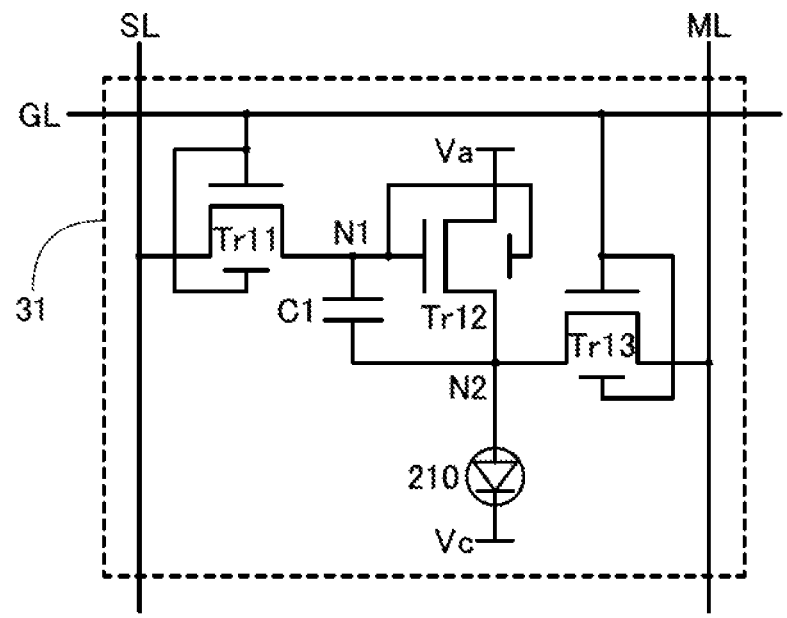
FIGS. 12A and 12B each illustrate a configuration example of a pixel.
Figure 12B:
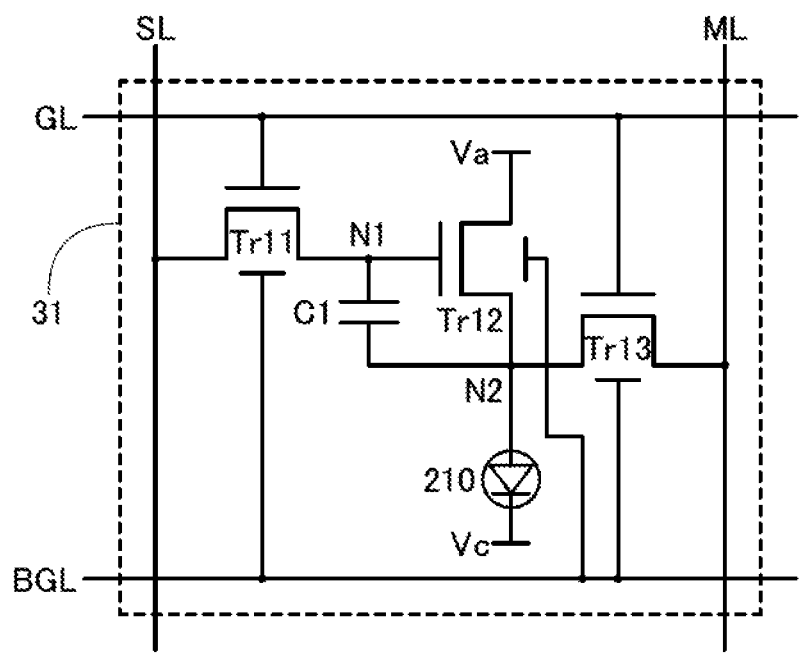
Figure 13:
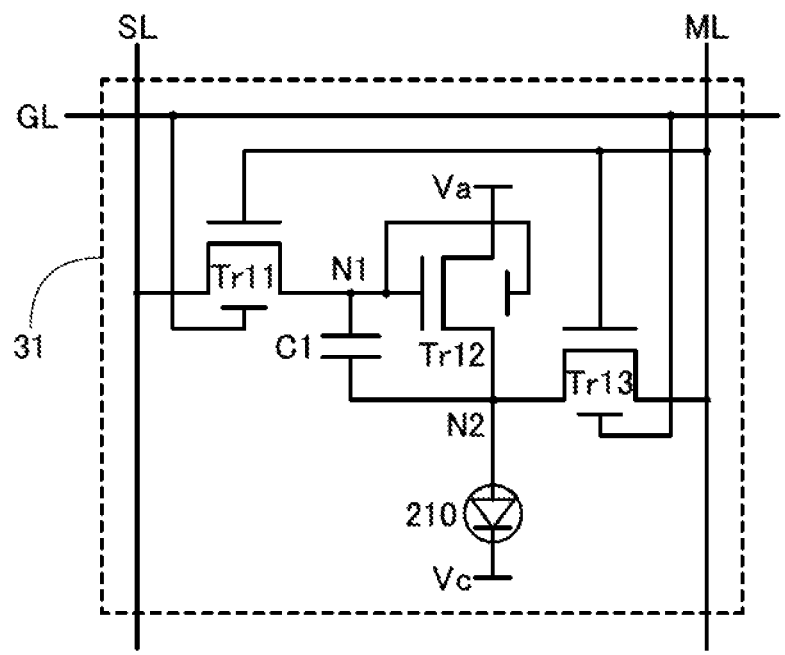
FIG. 13 illustrates a configuration example of a pixel.
Figure 14A:
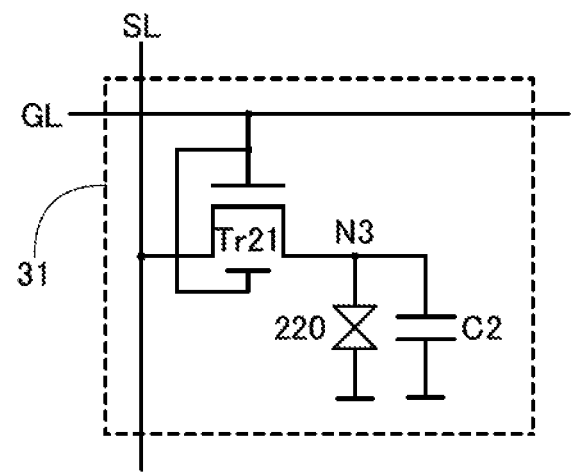
FIGS. 14A and 14B each illustrate a configuration example of a pixel.
Figure 14B:
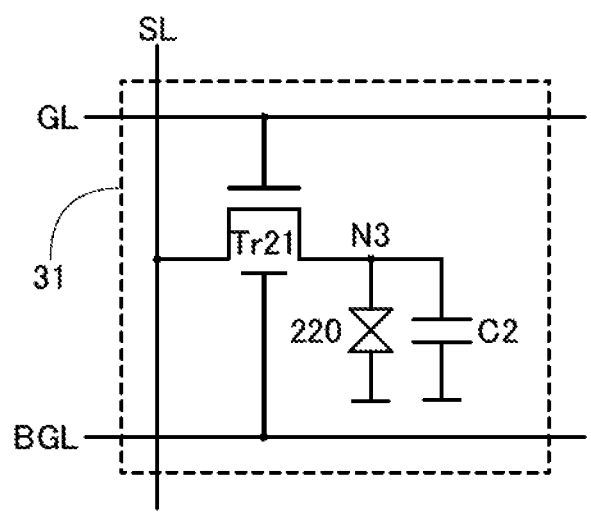

Next, modification examples of the pixels 31 illustrated in FIGS. 11A and 11B will be described. FIGS. 12A and 12B and FIG. 13 illustrate modification examples of the pixel 31 using a light-emitting element, and FIGS. 14A and 14B illustrate modification examples of the pixel 31 using a liquid crystal element.

The pixel 31 illustrated in each of FIGS. 12A and 12B is different from that in FIG. 11A in that the transistors Tr11 to Tr13 each include a pair of gates. Note that when a transistor includes a pair of gates, one of the pair of gates is referred to as a first gate, a front gate, or simply a gate in some cases, and the other thereof is referred to as a second gate or a back gate in some cases.

The transistors Tr11 to Tr13 illustrated in FIG. 12A each include a back gate connected to a front gate. In this case, the back gate is supplied with the same potential as that supplied to the front gate, resulting in an increase in the on-state current of the transistors. Thus, the pixel 31 can operate at high speed.

The back gates of the transistors Tr11 to Tr13 illustrated in FIG. 12B are connected to a wiring BGL. The wiring BGL has a function of supplying a predetermined potential to the back gate. The threshold voltages of the transistors Tr11 to Tr13 can be controlled by controlling the potential of the wiring BGL. In particular, the transistors Tr11 and Tr13 are used to hold the potentials of the nodes N1 and N2; thus, the threshold voltages of the transistors Tr11 and Tr13 may be shifted to the positive side by controlling the potential of the wiring BGL, in order to reduce the off-state currents of the transistors Tr11 and Tr13. Note that the potential supplied to the wiring BGL may be either a fixed potential or a varied potential.

The wiring BGL may be provided for each of the transistors Tr11 to Tr13. Alternatively, the wiring BGL may be shared by all or part of the pixels 31 included in the pixel portion 20.

Alternatively, the pixel 31 can have a configuration illustrated in FIG. 13. In FIG. 13, a selection signal is supplied from the wiring GL to the back gates of the transistors Tr11 and Tr13, so that the transistors Tr11 and Tr13 are turned on and predetermined potentials are supplied to the nodes N1 and N2. Note that the front gates of the transistors Tr11 and Tr13 are connected to the wiring ML.

In the above, the pixel 31 using a light-emitting element is particularly described, and a back gate can be similarly provided in the pixel 31 using a liquid crystal element. For example, the transistor Tr21 may include a back gate connected to a front gate (FIG. 14A), or the transistor Tr21 may include a back gate connected to the wiring BGL (FIG. 14B).

An OS transistor is used in the pixel 31 in the aforementioned manner, whereby power consumption can be reduced.

This embodiment can be combined with any of the other embodiments as appropriate.
(Embodiment 3)

In this embodiment, a configuration example of a display device including a plurality of pixel groups will be described.
<Configuration Example of Display Device>

Figure 15A:
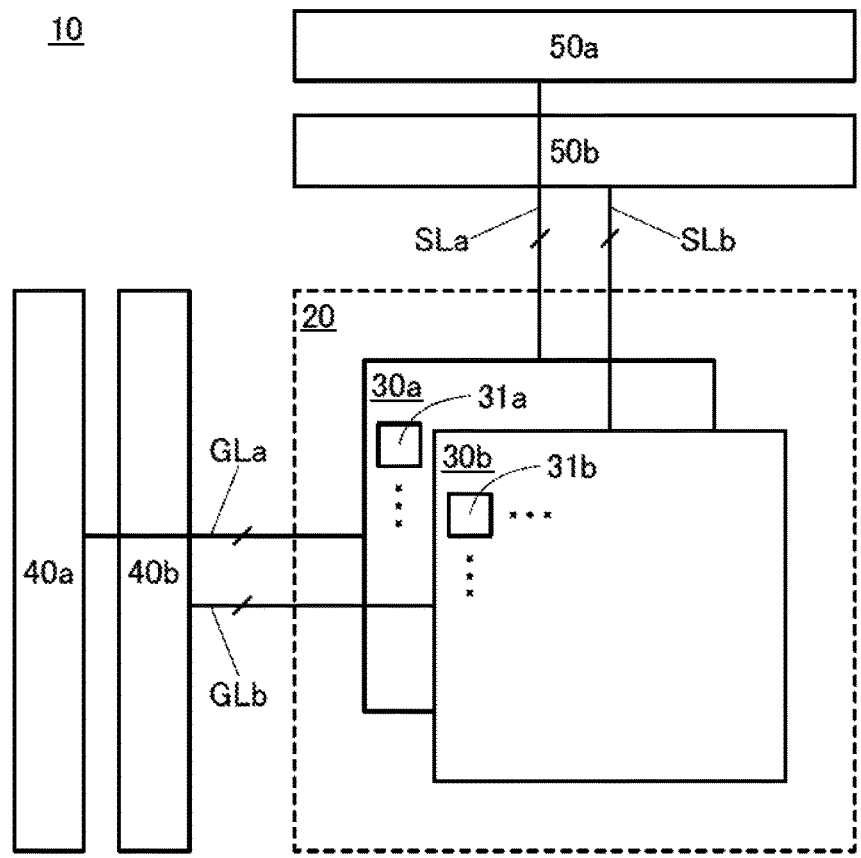
FIGS. 15A and 15B illustrate a configuration example of a display device.

FIG. 15A illustrates a modification example of the display device 10. The display device 10 illustrated in FIG. 15A includes a plurality of driver circuits 40 and a plurality of driver circuits 50. The pixel portion 20 includes a plurality of pixel groups 30. In an example below, the display device 10 includes two pixel groups 30 (pixel groups 30a and 30b), two driver circuits 40 (driver circuits 40a and 40b), and two driver circuits 50 (driver circuits 50a and 50b). Note that the number of each of these circuits may be three or more.

The pixel group 30a includes a plurality of pixels 31a, and the pixel group 30b includes a plurality of pixels 31b. The pixels 31a and 31b each include a display element and have a function of displaying a predetermined gray level. The kind and characteristics of the display element included in the pixels 31a may be the same as or different from those of the display element included in the pixels 31b. The circuit configuration of the pixels 31a may be the same as or different from that of the pixels 31b. The plurality of pixels 31a or the plurality of pixels 31b each display a predetermined gray level, whereby a predetermined image is displayed on the pixel portion 20.

Examples of the display elements included in the pixels 31a and 31b include the display elements described in Embodiment 1. Either one or both of the pixel groups 30a and 30b can be used to display an image. In the case where both of the pixel groups 30a and 30b are used, the pixel groups 30a and 30b may display one image, or the pixel groups 30a and 30b may display different images from each other.

In the case where either one of the pixel groups 30a and 30b is used to display an image, the pixel group 30 which displays an image can be selected automatically or manually. Note that by providing different display elements in the pixels 31a and 31b, the characteristics, the qualities, and the like of images displayed by the pixel group 30a and the pixel group 30b can be made different from each other. In this case, the pixel group 30 which displays an image can be selected in accordance with the surroundings, the content of a displayed image, and the like. A configuration will be described below as an example in which a reflective liquid crystal element is provided in the pixel 31a and a light-emitting element is provided in the pixel 31b.

Figure 15B:
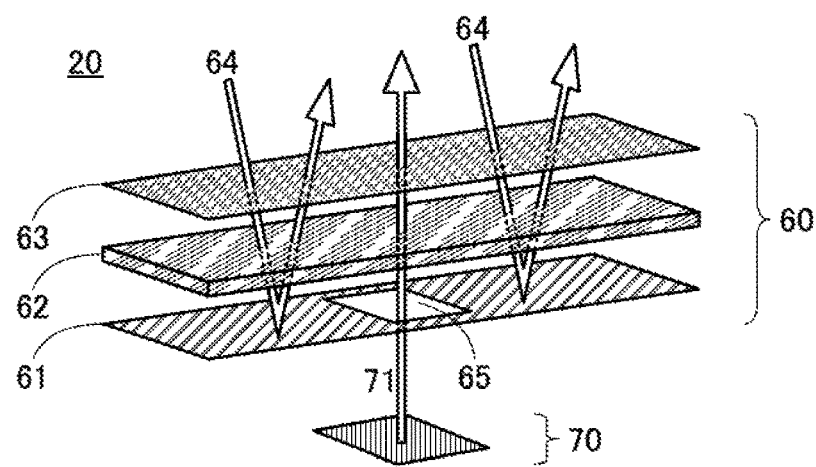

FIG. 15B is a schematic view of a configuration of the pixel portion 20 which performs display using a reflective liquid crystal element 60 and a light-emitting element 70. The liquid crystal element 60 includes a reflective electrode 61, a liquid crystal layer 62, and a transparent electrode 63. A gray level of the liquid crystal element 60 is controlled by controlling the transmittance of the liquid crystal layer 62 with respect to light 64 reflected by the reflective electrode 61. Note that the transmittance is controlled with alignment of liquid crystal. The light 64 reflected by the reflective electrode 61 passes through the liquid crystal layer 62 and the transparent electrode 63 and is extracted to the outside. The reflective electrode 61 includes an opening 65, and the light-emitting element 70 is provided to overlap with the opening 65. A gray level of the light-emitting element 70 is controlled by controlling the intensity of light 71 emitted from the light-emitting element 70. Note that the intensity of the light 71 is controlled by controlling a current flowing through the light-emitting element 70. The light 71 emitted from the light-emitting element 70 passes through the opening 65, the liquid crystal layer 62, and the transparent electrode 63 and is extracted to the outside. The light 64 and the light 71 are emitted toward a display surface of the display device 10.

With such a structure, the pixel portion 20 can display an image using the reflective liquid crystal element 60 and the light-emitting element 70.

The display device 10 has a first mode in which an image is displayed using a reflective liquid crystal element, a second mode in which an image is displayed using a light-emitting element, and a third mode in which an image is displayed using a reflective liquid crystal element and a light-emitting element. The display device 10 can be switched between these modes automatically or manually.

In the first mode, an image is displayed using the reflective liquid crystal element and external light. The first mode is a mode with extremely low power consumption because a light source is unnecessary. For example, when sufficient external light enters the display device (e.g., in a bright environment), an image can be displayed using light reflected by the reflective liquid crystal element. The first mode is effective in the case where, for example, external light is sufficiently intense and is white light or light near white light. The first mode is a mode suitable for displaying text. The first mode can offer eye-friendly display owing to the use of reflected external light and thus has an effect of being less likely to cause eyestrain.

In the first mode, the frequency of rewriting images is reduced, and the operations of the driver circuit 40b and the driver circuit 50b can be stopped in a period during which images are not rewritten. Thus, power consumption can be reduced.

In the second mode, an image is displayed using light emitted by the light-emitting element. Thus, an extremely clear image (with a high contrast and high color reproducibility) can be displayed regardless of the illuminance and chromaticity of external light. For example, the second mode is effective in the case where illuminance is extremely low, such as during the nighttime or in a dark room. When a bright image is displayed in a dark environment, a user may feel that the image is too bright. To prevent this, an image with reduced luminance is preferably displayed in the second mode. In that case, not only a reduction in brightness but also low power consumption can be achieved. The second mode is a mode suitable for displaying a vivid (still and moving) image, for example.

In the third mode, display is performed using both light reflected by the reflective element and light emitted by the light-emitting element. A clearer image than that in the first mode can be displayed and power consumption can be lower than that in the second mode. For example, the third mode is effective when illuminance is relatively low, such as under indoor illumination or in the morning or evening, or when the chromaticity of external light is not white. Furthermore, the use of mixed light of reflected light and emitted light enables display of an image like a real painting.

With such a structure, an all-weather display device or a highly convenient display device with high visibility regardless of the ambient brightness can be fabricated.

Each of the pixels 31a and the pixels 31b can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device 10 can display a full-color image using either the pixels 31a or the pixels 31b. Alternatively, the display device 10 can display a black-and-white image or a grayscale image using the pixels 31a and can display a full-color image using the pixels 31b. The pixels 31a that can be used to display a black-and-white image or a grayscale image are suitable for displaying information that need not be displayed in color, such as text information.

In the third mode, the color tone can be corrected by using light emission from the light-emitting element at the time of displaying an image by the reflective liquid crystal element. For example, in the case where an image is displayed in an environment with reddish light at twilight, a blue (B) component is not sufficient only with the display by the reflective liquid crystal element in some cases; thus, the color tone can be corrected by making the light-emitting element emit light.

In addition, in the third mode, a still image that is a background, text, and the like are displayed by the reflective liquid crystal element, whereas a moving image and the like are displayed by the light-emitting element, for example. Accordingly, a high-quality image display and a reduction in the power consumption both can be achieved. Such a structure is suitable for the case where a display device is used as a teaching material such as a textbook, a notebook, or the like.

The display device 10 can be switched between the first mode or the second mode and the third mode depending on the resolution of a displayed image. For example, an image or a picture with high resolution can be displayed in the third mode, whereas a background, text, and the like can be displayed in the first mode or the second mode. Accordingly, the resolution can be changed in accordance with a displayed image; thus, the display device is versatile.

Although an example in which the reflective liquid crystal element is provided in the pixel 31a and the light-emitting element is provided in the pixel 31b is described with reference to FIG. 15B, there is no particular limitation on the display elements provided in the pixels 31a and 31b, and the kind of display element can be freely selected. For example, a transmissive liquid crystal element may be provided in one of the pixels 31a and 31b, and a reflective liquid crystal element may be provided in the other. In that case, a transflective liquid crystal element can be fabricated using the pixels 31a and 31b. Alternatively, different kinds of light-emitting elements can be provided in the pixels 31a and 31b.

The driver circuit 40a has a function of supplying a selection signal to a wiring GLa connected to the pixels 31a, and the driver circuit 40b has a function of supplying a selection signal to a wiring GLb connected to the pixels 31b. The driver circuit 50a has a function of supplying a video signal to a wiring SLa connected to the pixels 31a, and the driver circuit 50b has a function of supplying a video signal to a wiring SLb connected to the pixels 31b.

Figure 16:
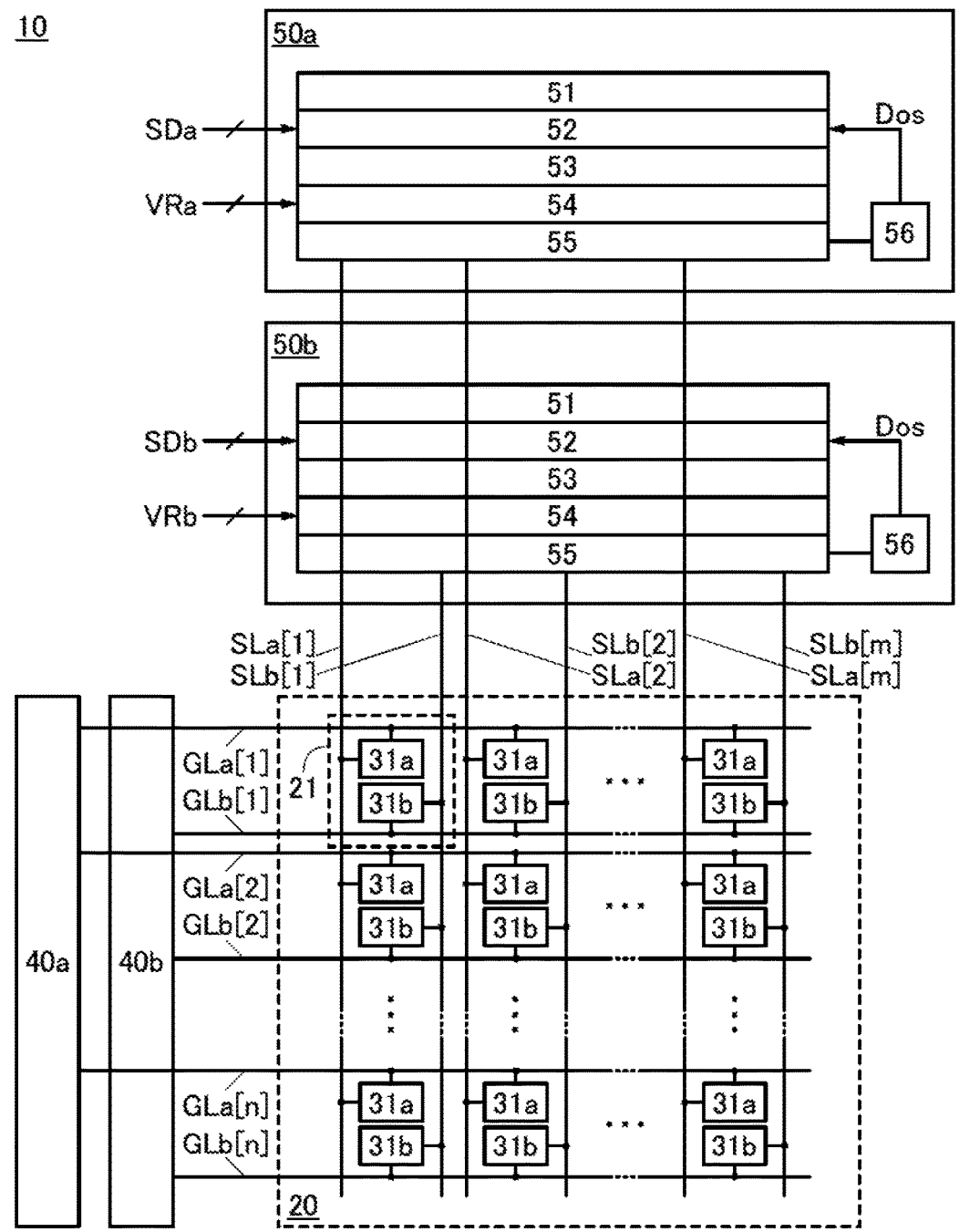
FIG. 16 illustrates a configuration example of a display device.

Next, a more specific configuration example of the display device 10 will be described. FIG. 16 illustrates a specific configuration example of the pixel portion 20 and the driver circuits 50.

The pixel portion 20 includes the pixels 31a and the pixels 31b arranged in m columns and n rows. The pixel 31a in the i-th column and the j-th row is connected to a wiring SLa[i] and a wiring GLa[j]. The pixel 31b in the i-th column and the j-th row is connected to a wiring SLb[i] and a wiring GLb[j]. Wirings GLa[1] to GLa[n] are connected to the driver circuit 40a, and wirings GLb[1] to GLb[n] are connected to the driver circuit 40b. Wirings SLa[1] to SLa[m] are connected to the driver circuit 50a, and wirings SLb[1] to SLb[m] are connected to the driver circuit 50b. Here, the pixels 31a and 31b are alternately provided in the row direction (the vertical direction), and a pixel unit 21 includes the pixels 31a and 31b. As described above, the pixels 31a and 31b can be provided in the same region of the pixel portion 20. Note that for the pixels 31a and 31b, the configurations described in Embodiment 2 can be used.

Data SDa and a reference potential VRa are input to the driver circuit 50a, and data SDb and a reference potential VRb are input to the driver circuit 50b. The data SDa and SDb correspond to the data SD in FIG. 1, and the reference potentials VRa and VRb correspond to the reference potential VR in FIG. 1. Since different display elements are provided in the pixels 31a and 31b here, different reference potentials (VRa and VRb) are input to the driver circuits 50a and 50b.

The amplifier circuit 55 included in the driver circuit 50a and the amplifier circuit 55 included in the driver circuit 50b are connected to respective arithmetic circuits 56. Thus, the driver circuits 50a and 50b can each inspect and correct a video signal. Note that the driver circuits 50a and 50b may share one arithmetic circuit 56.

<Operation Example of Display Device>

Figure 17A:
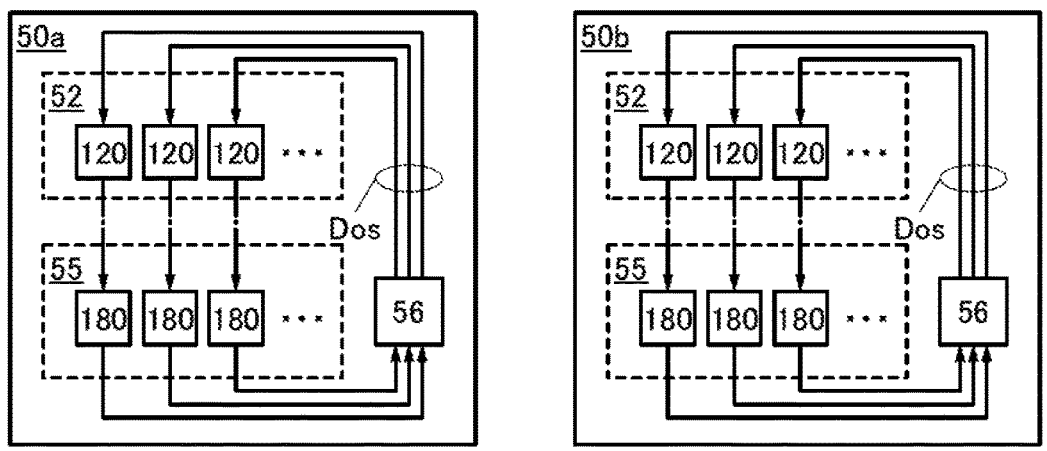
FIGS. 17A and 17B illustrate an operation example of a driver circuit.
Figure 17B:
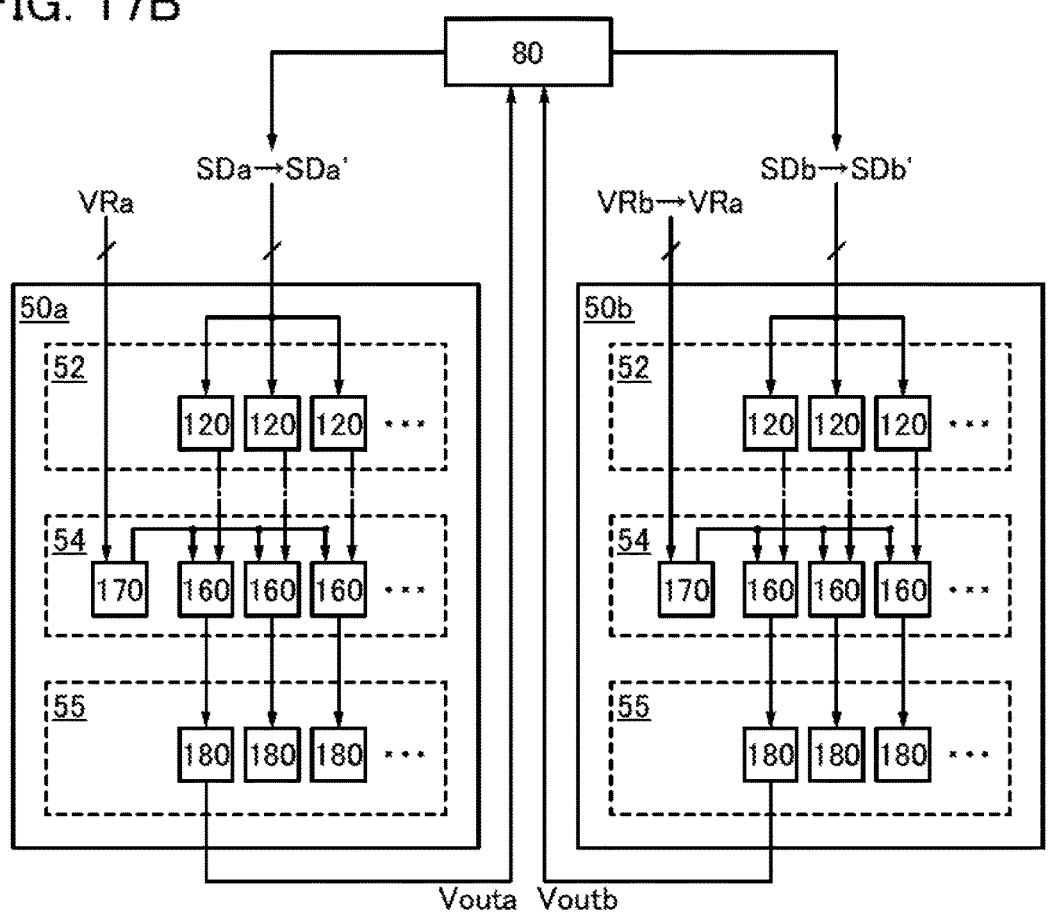

Next, an operation example of the case where video signals are corrected in the display device 10 illustrated in FIG. 15A and FIG. 16 will be described. FIGS. 17A and 17B illustrate an operation example of the driver circuits 50a and 50b.

First, as illustrated in FIG. 17A, the driver circuits 50a and 50b each inspect outputs of the amplifiers 180, calculate errors of potential with the use of the arithmetic circuit, and then correct video signals on the basis of the data Dos. This allows errors of potential in the driver circuit 50a and errors of potential in the driver circuit 50b to be canceled out. For the details of the operations to correct video signals, the description of Embodiment 1 can be referred to.

Then, a difference in the outputs of the amplifiers 180 between the driver circuit 50a and the driver circuit 50b is corrected. Specifically, as illustrated in FIG. 17B, a specific amplifier 180 is selected from each of the driver circuits 50a and 50b, and a potential Vouta supplied from the amplifier 180 in the driver circuit 50a and a potential Voutb supplied from the amplifier 180 in the driver circuit 50b are supplied to a circuit 80 provided in the display device 10. The circuit 80 calculates a difference between the potential Vouta and the potential Voutb, and corrects data SDa input to the driver circuit 50a to data SDa' or corrects data SDb input to the driver circuit 50b to data SDb' so that the difference is canceled out. In this manner, video signals input to the driver circuit 50a and the driver circuit 50b are corrected to be the same, whereby a difference in video signals between the driver circuit 50a and the driver circuit 50b can be canceled out.

Note that to correct video signals, either one or both of the data SDa and the data SDb can be corrected.

When an image is displayed on the pixel portion 20, the driver circuit 50a generates video signals supplied to the pixels 31a, and the driver circuit 50b generates video signals supplied to the pixels 31b. Since the display element in the pixel 31a and the display element in the pixel 31b are different from each other, the reference potential VRa supplied to the potential generation circuit 170 in the driver circuit 50a and the reference potential VRb supplied to the potential generation circuit 170 in the driver circuit 50b are individually set. In this case, when a video signal is corrected, the reference potential that is supplied to the driver circuit 50b is changed from the reference potential VRb to the reference potential VRa, whereby the reference potential Vref to be supplied to the selection circuit 160 in the driver circuit 50b is made to be equal to the reference potential Vref to be supplied to the selection circuit 160 in the driver circuit 50a. Consequently, an output of the amplifier 180 in the driver circuit 50a and an output of the amplifier 180 in the driver circuit 50b can be equal to each other, and even in the case where the pixels 31a and 31b include different display elements, a difference in video signals between the driver circuit 50a and the driver circuit 50b can be accurately calculated.

Note that in FIGS. 17A and 17B, the reference potential VRb may be supplied to the driver circuit 50a instead of the reference potential VRa. The case where a difference in video signals between two driver circuits 50 is canceled out is described here, and the data SD can be corrected similarly in the case where three or more driver circuits 50 are provided.

As described above, in the case where the display device 10 of one embodiment of the present invention is provided with a plurality of driver circuits 50, the display device 10 can cancel out a difference in video signals between the driver circuits 50, and thus, has high quality and high reliability.

This embodiment can be combined with any of the other embodiments as appropriate.

(Embodiment 4)

In this embodiment, specific configuration examples of the display device of one embodiment of the present invention will be described.

As described above, different display elements can be provided in the pixels 31a and 31b illustrated in FIG. 15A and FIG. 16. Structure examples of the display device in which different display elements are provided in the pixels 31a and 31b will be described below. Here, structure examples of the display device in which the pixel 31a includes a reflective liquid crystal element and the pixel 31b includes a light-emitting element will be described.

<Structure Examples of Display Device>

Structure examples of the display device of this embodiment will be described with reference to FIGS. 18 to 21.

<Structure Example 1>

Figure 18:
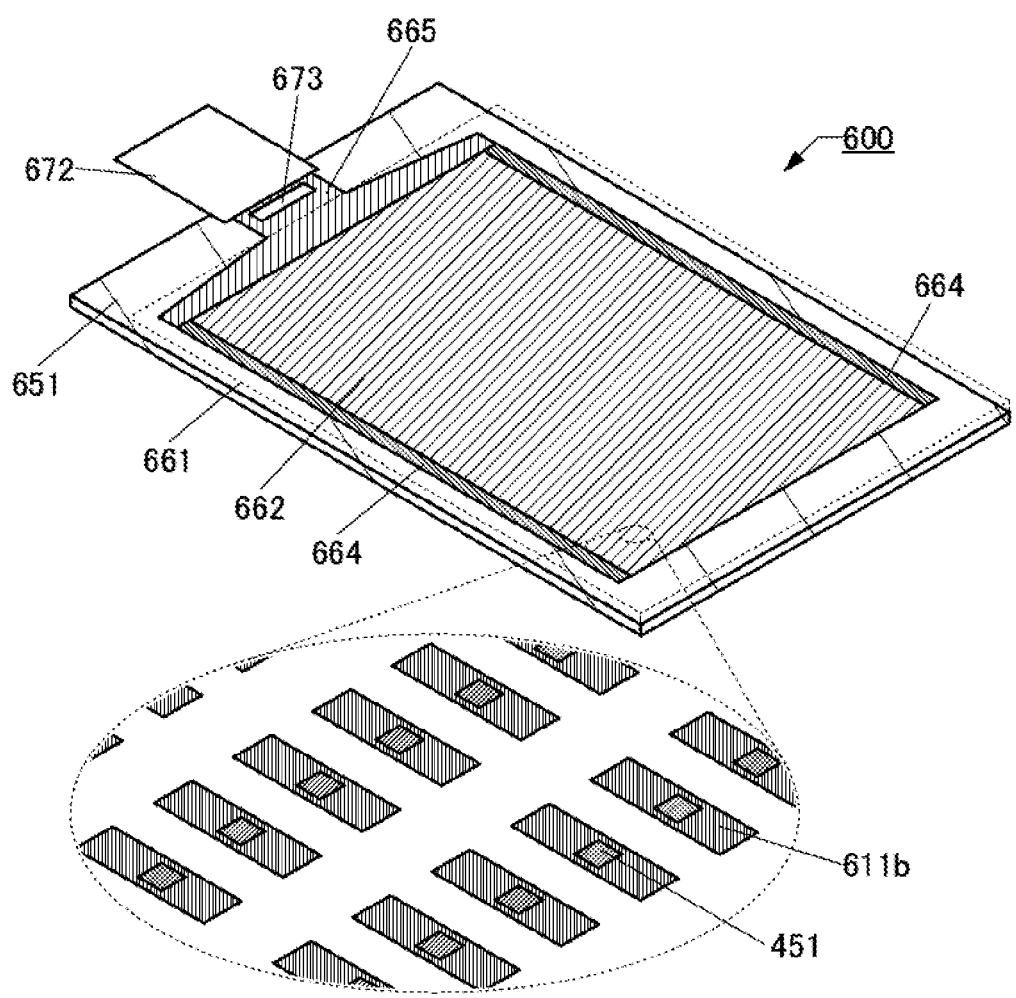
FIG. 18 illustrates a configuration example of a display device.

FIG. 18 is a schematic perspective view of a display device 600. In the display device 600, a substrate 651 and a substrate 661 are attached to each other. In FIG. 18, the substrate 661 is denoted by a dashed line.

The display device 600 includes a display portion 662, a circuit 664, a wiring 665, and the like. FIG. 18 illustrates an example in which the display device 600 is provided with an integrated circuit (IC) 673 and an FPC 672. Thus, the structure illustrated in FIG. 18 can be regarded as a display module including the display device 600, the IC, and the FPC.

As the circuit 664, for example, the driver circuit 40 can be used.

The wiring 665 has a function of supplying a signal and power to the display portion 662 and the circuit 664. The signal and power are input to the wiring 665 from the outside through the FPC 672 or from the IC 673.

FIG. 18 illustrates an example in which the IC 673 is provided over the substrate 651 by a chip on glass (COG) method, a chip on film (COF) method, or the like. For example, an IC including the driver circuit 50 or the like can be used as the IC 673. Note that the display device 600 and the display module are not necessarily provided with an IC. The IC may be provided over the FPC by a COF method or the like.

FIG. 18 illustrates an enlarged view of part of the display portion 662. Electrodes 611b included in a plurality of display elements are arranged in a matrix in the display portion 662. The electrode 611b has a function of reflecting visible light, and serves as a reflective electrode of a liquid crystal element.

As illustrated in FIG. 18, the electrode 611b includes an opening 451. In addition, the display portion 662 includes a light-emitting element that is positioned closer to the substrate 651 than the electrode 611b is. Light from the light-emitting element is emitted to the substrate 661 side through the opening 451 in the electrode 611b. The area of a light-emitting region of the light-emitting element may be equal to the area of the opening 451. One of the area of the light-emitting region of the light-emitting element and the area of the opening 451 is preferably larger than the other because a margin for misalignment can be increased. It is particularly preferable that the area of the opening 451 be larger than the area of the light-emitting region of the light-emitting element. When the area of the opening 451 is small, part of light from the light-emitting element is blocked by the electrode 611b and cannot be extracted to the outside, in some cases. The opening 451 with a sufficiently large area can reduce waste of light emitted from the light-emitting element.

Figure 19:
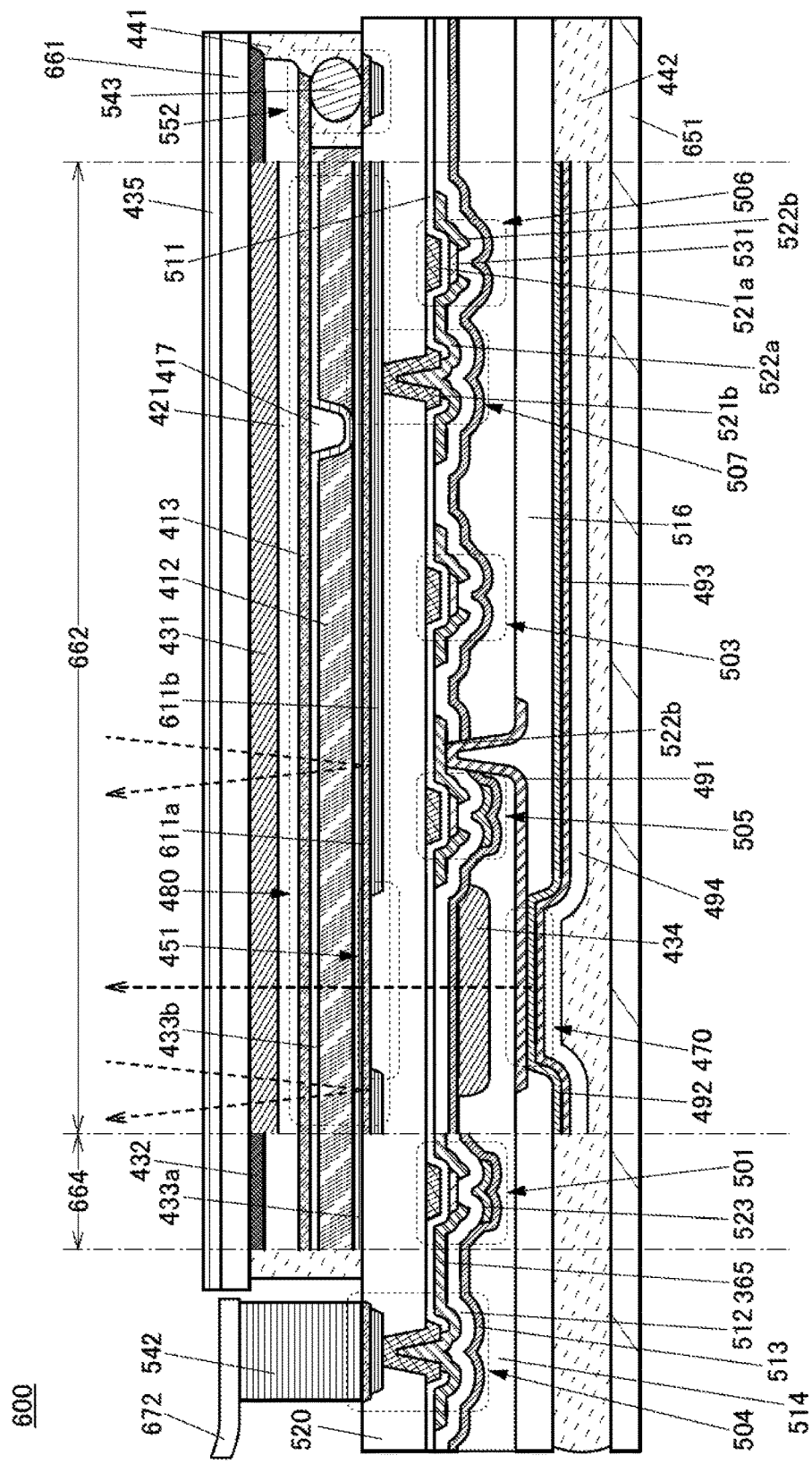
FIG. 19 illustrates a structure example of a display device.

FIG. 19 illustrates an example of cross-sectional views of part of a region including the FPC 672, part of a region including the circuit 664, and part of a region including the display portion 662 of the display device 600 illustrated in FIG. 18.

The display device 600 illustrated in FIG. 19 includes the transistor 501, the transistor 503, the transistor 505, the transistor 506, a liquid crystal element 480, a light-emitting element 470, an insulating layer 520, a coloring layer 431, a coloring layer 434, and the like between the substrate 651 and the substrate 661. The substrate 661 is bonded to the insulating layer 520 with a bonding layer 441. The substrate 651 is bonded to the insulating layer 520 with a bonding layer 442.

The substrate 661 is provided with the coloring layer 431, a light-blocking layer 432, an insulating layer 421, an electrode 413 functioning as a common electrode of the liquid crystal element 480, an alignment film 433b, an insulating layer 417, and the like. A polarizing plate 435 is provided on an outer surface of the substrate 661. The insulating layer 421 may have a function of a planarization layer. The insulating layer 421 enables the electrode 413 to have a substantially flat surface, resulting in a uniform alignment state of a liquid crystal layer 412. The insulating layer 417 serves as a spacer for holding a cell gap of the liquid crystal element 480. In the case where the insulating layer 417 transmits visible light, the insulating layer 417 may be positioned to overlap with a display region of the liquid crystal element 480.

The liquid crystal element 480 is a reflective liquid crystal element. The liquid crystal element 480 has a stacked-layer structure of an electrode 611a functioning as a pixel electrode, the liquid crystal layer 412, and the electrode 413. The electrode 611b that reflects visible light is provided in contact with a surface of the electrode 611a on the substrate 651 side. The electrode 611b includes the opening 451. The electrode 611a and the electrode 413 transmit visible light. An alignment film 433a is provided between the liquid crystal layer 412 and the electrode 611a. The alignment film 433b is provided between the liquid crystal layer 412 and the electrode 413.

In the liquid crystal element 480, the electrode 611b has a function of reflecting visible light, and the electrode 413 has a function of transmitting visible light. Light entering from the substrate 661 side is polarized by the polarizing plate 435, transmitted through the electrode 413 and the liquid crystal layer 412, and reflected by the electrode 611b. Then, the light is transmitted through the liquid crystal layer 412 and the electrode 413 again to reach the polarizing plate 435. In this case, alignment of liquid crystal can be controlled with a voltage that is applied between the electrode 611b and the electrode 413, and thus optical modulation of light can be controlled. In other words, the intensity of light exiting through the polarizing plate 435 can be controlled. Light excluding light in a particular wavelength region is absorbed by the coloring layer 431, and thus, exiting light is red light, for example.

As illustrated in FIG. 19, the electrode 611a that transmits visible light is preferably provided in the opening 451. In that case, the liquid crystal layer 412 is aligned in a region overlapping with the opening 451 as well as in the other regions; thus, defective alignment of the liquid crystal is prevented from being caused in the boundary portion of these regions and undesired light leakage can be suppressed.

In a connection portion 507, the electrode 611b is electrically connected to a conductive layer 522a included in the transistor 506 via a conductive layer 521b. The transistor 506 has a function of controlling the driving of the liquid crystal element 480.

A connection portion 552 is provided in part of a region where the bonding layer 441 is provided. In the connection portion 552, a conductive layer obtained by processing the same conductive film as the electrode 611a is electrically connected to part of the electrode 413 with a connector 543. Accordingly, a signal or a potential input from the FPC 672 connected to the substrate 651 side can be supplied to the electrode 413 formed on the substrate 661 side through the connection portion 552.

As the connector 543, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 543. As illustrated in FIG. 19, the connector 543 that is the conductive particle has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the bonding layer 441. For example, the connector 543 may be dispersed in the bonding layer 441.

The light-emitting element 470 is a bottom-emission light-emitting element. The light-emitting element 470 has a stacked-layer structure in which an electrode 491 functioning as a pixel electrode, an EL layer 492, and an electrode 493 functioning as a common electrode are stacked in this order from the insulating layer 520 side. The electrode 491 is connected to a conductive layer 522b included in the transistor 505 through an opening provided in an insulating layer 514. The transistor 505 has a function of controlling the driving of the light-emitting element 470. An insulating layer 516 covers an end portion of the electrode 491. The electrode 493 includes a material that reflects visible light, and the electrode 491 includes a material that transmits visible light. An insulating layer 494 is provided so as to cover the electrode 493. Light from the light-emitting element 470 is emitted to the substrate 661 side through the coloring layer 434, the insulating layer 520, the opening 451, the electrode 611a, and the like.

The liquid crystal element 480 and the light-emitting element 470 can exhibit various colors when the color of the coloring layer varies among pixels. The display device 600 can display a color image using the liquid crystal element 480. The display device 600 can display a color image using the light-emitting element 470.

The transistors 501, 503, 505, and 506 are formed on the substrate 651 side of the insulating layer 520. These transistors can be fabricated using the same process.

A circuit electrically connected to the liquid crystal element 480 and a circuit electrically connected to the light-emitting element 470 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 480 is positioned on the opposite side of a gate insulating layer of the transistor from the pixel electrode of the light-emitting element 470.

In the case where an OS transistor is used as the transistor 506 or in the case where a memory element electrically connected to the transistor 506 is used, for example, a gray level can be maintained even when writing operation of the pixel is stopped while a still image is displayed using the liquid crystal element 480. In other words, an image can be kept displayed even with an extremely low frame rate. In one embodiment of the present invention, the frame rate can be extremely low, and driving with low power consumption can be performed.

The transistor 503 is used to control whether the pixel is selected or not (such a transistor is also referred to as a switching transistor or a selection transistor). The transistor 505 is used to control a current flowing to the light-emitting element 470 (such a transistor is also referred to as a driving transistor).

Insulating layers such as an insulating layer 511, an insulating layer 512, an insulating layer 513, and the insulating layer 514 are provided on the substrate 651 side of the insulating layer 520. Part of the insulating layer 511 functions as a gate insulating layer of each transistor. The insulating layer 512 is provided to cover the transistor 506 and the like. The insulating layer 513 is provided to cover the transistor 505 and the like. The insulating layer 514 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 501, 503, 505, and 506 includes a conductive layer 521a functioning as a gate, the insulating layer 511 functioning as a gate insulating layer, the conductive layer 522a and the conductive layer 522b functioning as a source and a drain, and a semiconductor layer 531. Here, a plurality of layers obtained by processing the same conductive film are shown with the same hatching pattern.

The transistors 501 and 505 each include a conductive layer 523 functioning as a gate in addition to the components of the transistor 503 or 506.

The structure in which the semiconductor layer including a channel formation region is provided between two gates is used as an example of the transistors 501 and 505. With such a structure, the threshold voltage of the transistors can be controlled. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of increase in size or resolution.

Alternatively, by supplying a potential for controlling the threshold voltage to one of the two gates and a potential for driving to the other, the threshold voltage of the transistors can be controlled.

The structure of the transistors included in the display device is not limited. The transistor included in the circuit 664 and the transistor included in the display portion 662 may have the same structure or different structures. A plurality of transistors included in the circuit 664 may have the same structure or a combination of two or more kinds of structures. Similarly, a plurality of transistors included in the display portion 662 may have the same structure or a combination of two or more kinds of structures.

It is preferable to use a conductive material containing an oxide for the conductive layer 523. A conductive film used for the conductive layer 523 is formed under an atmosphere containing oxygen, whereby oxygen can be supplied to the insulating layer 512. The proportion of an oxygen gas in a deposition gas is preferably higher than or equal to 90% and lower than or equal to 100%. Oxygen supplied to the insulating layer 512 is then supplied to the semiconductor layer 531 by later heat treatment; as a result, oxygen vacancies in the semiconductor layer 531 can be reduced.

It is particularly preferable to use a low-resistance metal oxide for the conductive layer 523. In that case, an insulating film that releases hydrogen, such as a silicon nitride film, is preferably used for the insulating layer 513, for example, because hydrogen can be supplied to the conductive layer 523 during the formation of the insulating layer 513 or by heat treatment performed after the formation of the insulating layer 513, which leads to an effective reduction in the electric resistance of the conductive layer 523.

The coloring layer 434 is provided in contact with the insulating layer 513. The coloring layer 434 is covered with the insulating layer 514.

A connection portion 504 is provided in a region where the substrate 651 does not overlap with the substrate 661. In the connection portion 504, the wiring 665 is electrically connected to the FPC 672 via a connection layer 542. The connection portion 504 has a structure similar to that of the connection portion 507. On the top surface of the connection portion 504, a conductive layer obtained by processing the same conductive film as the electrode 611a is exposed. Thus, the connection portion 504 and the FPC 672 can be electrically connected to each other via the connection layer 542.

As the polarizing plate 435 provided on the outer surface of the substrate 661, a linear polarizing plate or a circularly polarizing plate can be used. An example of a circularly polarizing plate is a stack of a linear polarizing plate and a quarter-wave retardation plate. Such a structure can reduce reflection of external light. The cell gap, alignment, drive voltage, and the like of the liquid crystal element used as the liquid crystal element 480 are controlled depending on the kind of the polarizing plate so that desirable contrast is obtained.

Note that a variety of optical members can be arranged on the outer surface of the substrate 661. Examples of the optical members include a polarizing plate, a retardation plate, a light diffusion layer (e.g., a diffusion film), an anti-reflective layer, and a light-condensing film. Furthermore, an antistatic film that prevents the attachment of a foreign substance, a water repellent film that suppresses the attachment of stain, a hard coat film suppressing a scratch in use, or the like may be provided on the outer surface of the substrate 661.

For each of the substrates 651 and 661, glass, quartz, ceramic, sapphire, an organic resin, or the like can be used. When the substrates 651 and 661 are formed using a flexible material, the flexibility of the display device can be increased.

In the case where the reflective liquid crystal element is used, the polarizing plate 435 is provided on the display surface side. In addition, a light diffusion plate is preferably provided on the display surface side to improve visibility.

A front light may be provided on the outer side of the polarizing plate 435. As the front light, an edge-light front light is preferably used. A front light including a light-emitting diode (LED) is preferably used to reduce power consumption.

<Structure Example 2>

Figure 20:
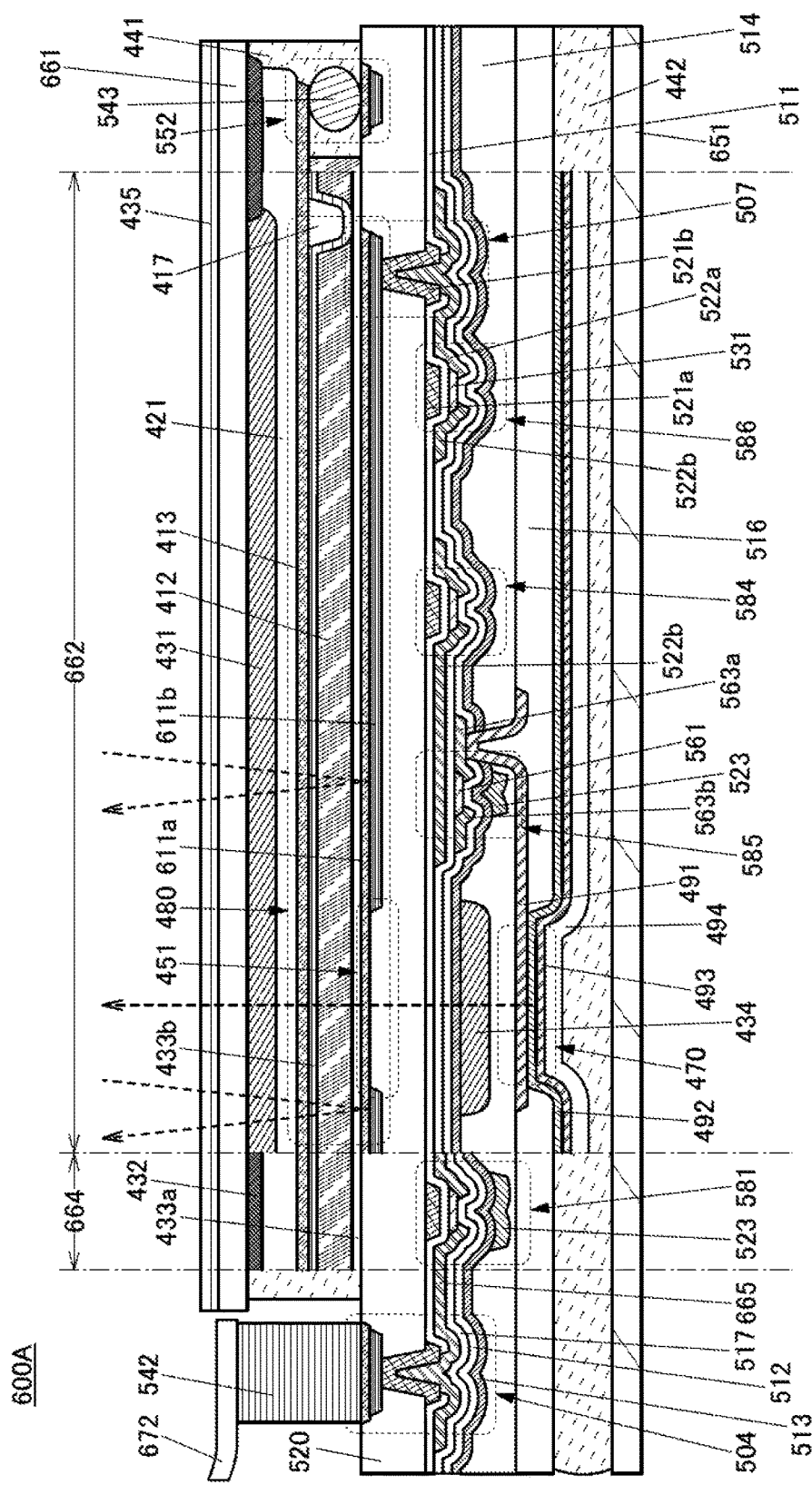
FIG. 20 illustrates a structure example of a display device.

A display device 600A illustrated in FIG. 20 is different from the display device 600 mainly in that a transistor 581, a transistor 584, a transistor 585, and a transistor 586 are included instead of the transistor 501, the transistor 503, the transistor 505, and the transistor 506.

Note that the positions of the insulating layer 417, the connection portion 507, and the like in FIG. 20 are different from those in FIG. 19. FIG. 20 illustrates an end portion of a pixel. The insulating layer 417 is provided so as to overlap with an end portion of the coloring layer 431 and an end portion of the light-blocking layer 432. As in this structure, the insulating layer 417 may be provided in a region not overlapping with a display region (or in a region overlapping with the light-blocking layer 432).

Two transistors included in the display device may partly overlap with each other like the transistor 584 and the transistor 585. In that case, the area occupied by a pixel circuit can be reduced, leading to an increase in resolution. Furthermore, the light-emitting area of the light-emitting element 470 can be increased, leading to an improvement in aperture ratio. The light-emitting element 470 with a high aperture ratio requires low current density to obtain necessary luminance; thus, the reliability is improved.

Each of the transistors 581, 584, and 586 includes the conductive layer 521a, the insulating layer 511, the semiconductor layer 531, the conductive layer 522a, and the conductive layer 522b. The conductive layer 521a overlaps with the semiconductor layer 531 with the insulating layer 511 positioned therebetween. The conductive layer 522a and the conductive layer 522b are electrically connected to the semiconductor layer 531. The transistor 581 includes the conductive layer 523.

The transistor 585 includes the conductive layer 522b, an insulating layer 517, a semiconductor layer 561, the conductive layer 523, the insulating layer 512, the insulating layer 513, a conductive layer 563a, and a conductive layer 563b. The conductive layer 522b overlaps with the semiconductor layer 561 with the insulating layer 517 positioned therebetween. The conductive layer 523 overlaps with the semiconductor layer 561 with the insulating layers 512 and 513 positioned therebetween. The conductive layer 563a and the conductive layer 563b are electrically connected to the semiconductor layer 561.

The conductive layer 521a functions as a gate. The insulating layer 511 functions as a gate insulating layer. The conductive layer 522a functions as one of a source and a drain. The conductive layer 522b included in the transistor 586 functions as the other of the source and the drain.

The conductive layer 522b shared by the transistor 584 and the transistor 585 has a portion functioning as the other of the source and the drain of the transistor 584 and a portion functioning as a gate of the transistor 585. The insulating layer 517, the insulating layer 512, and the insulating layer 513 function as gate insulating layers. One of the conductive layers 563a and 563b functions as a source and the other functions as a drain. The conductive layer 523 functions as a gate.

<Structure Example 3>

Figure 21:
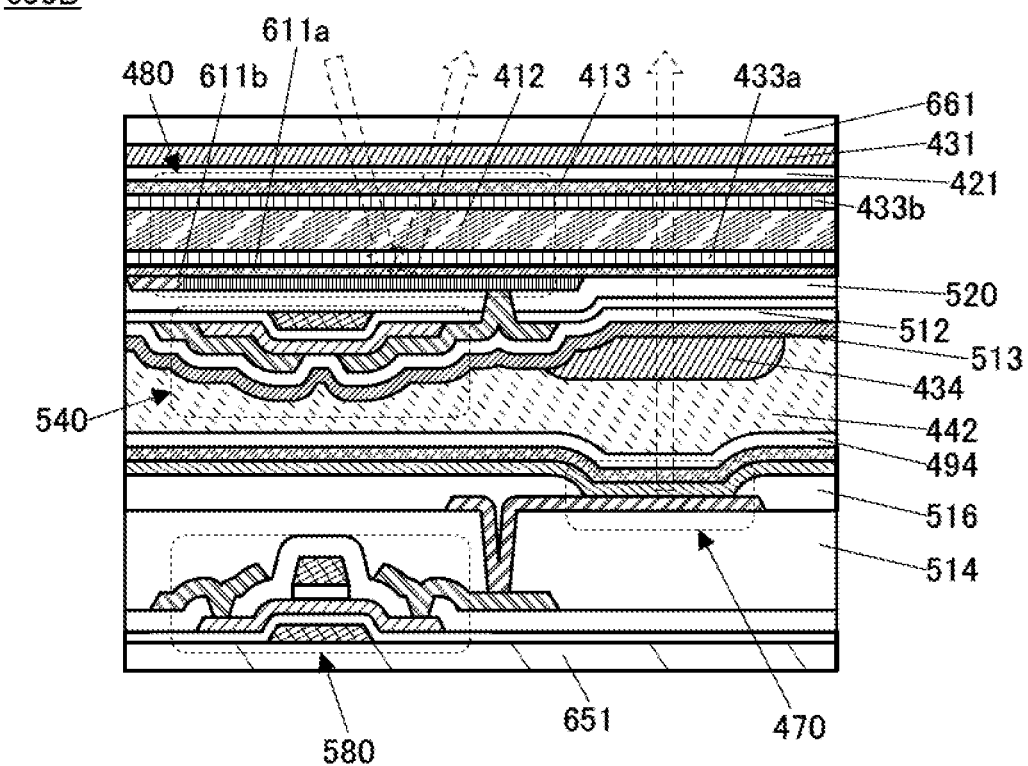
FIG. 21 illustrates a structure example of a display device.

FIG. 21 is a cross-sectional view illustrating a display portion of a display device 600B.

The display device 600B illustrated in FIG. 21 includes a transistor 540, a transistor 580, the liquid crystal element 480, the light-emitting element 470, the insulating layer 520, the coloring layer 431, the coloring layer 434, and the like, between the substrate 651 and the substrate 661.

In the liquid crystal element 480, the electrode 611b reflects external light to the substrate 661 side. The light-emitting element 470 emits light to the substrate 661 side.

The substrate 661 is provided with the coloring layer 431, the insulating layer 421, the electrode 413 functioning as a common electrode of the liquid crystal element 480, and the alignment film 433b.

The liquid crystal layer 412 is provided between the electrode 611a and the electrode 413 with the alignment film 433a and the alignment film 433b therebetween.

The transistor 540 is covered with the insulating layer 512 and the insulating layer 513. The insulating layer 513 and the coloring layer 434 are bonded to the insulating layer 494 with the bonding layer 442.

In the display device 600B, the transistor 540 for driving the liquid crystal element 480 and the transistor 580 for driving the light-emitting element 470 are formed on different planes;

thus, each of the transistors can be easily formed using a structure and a material suitable for driving the corresponding display element.

<Structure Examples of Pixel>

Next, specific structure examples of a pixel included in a display device will be described with reference to FIGS. 22A to 22D to FIGS. 24A and 24B.

FIGS. 22A to 22D each illustrate a structure example of an electrode included in the pixel unit 21 in FIG. 16. The electrode 611 serves as a reflective electrode of the liquid crystal element. The electrode 611 in each of FIGS. 22A and 22B includes an opening 451.

Figure 22A:
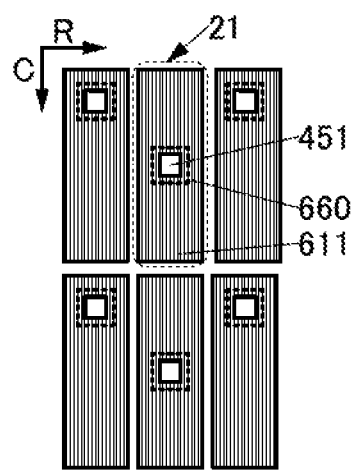
FIGS. 22A to 22D each illustrate a structure example of an electrode.
Figure 22B:
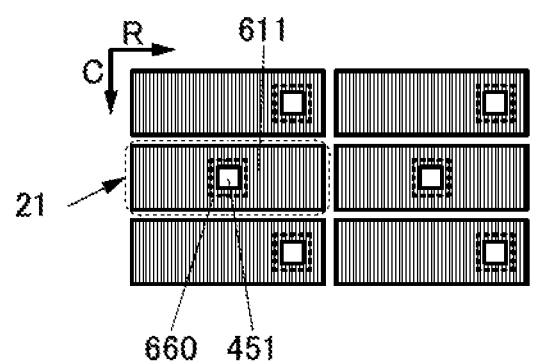

In FIGS. 22A and 22B, a light-emitting element 660 in a region overlapping with the electrode 611 is shown by a dashed line. The light-emitting element 660 overlaps with the opening 451 included in the electrode 611. Thus, light from the light-emitting element 660 is emitted to the display surface side through the opening 451.

In FIG. 22A, the pixel units 21 adjacent in the direction shown by an arrow R correspond to different colors. In this case, as illustrated in FIG. 22A, the openings 451 are preferably provided in different positions in the electrodes 611 so as not to be aligned in the two adjacent pixel units 21 arranged in the direction shown by the arrow R. This allows the adjacent two light-emitting elements 660 to be apart from each other, thereby preventing light emitted from the light-emitting element 660 from entering a coloring layer in the adjacent pixel unit 21 (such a phenomenon is also referred to as "crosstalk"). Furthermore, since the two adjacent light-emitting elements 660 can be arranged apart from each other, a high-resolution display device can be obtained even when EL layers of the light-emitting elements 660 are separately formed with a shadow mask or the like.

In FIG. 22B, the pixel units 21 adjacent in the direction of the arrow C are pixels for different colors. Also in FIG. 22B, the openings 451 are preferably provided in different positions in the electrodes 611 so as not to be aligned in two adjacent pixels provided in the direction shown by the arrow C.

The smaller the ratio of the total area of the opening 451 to the total area except for the opening is, the brighter an image displayed using the liquid crystal element can be. Furthermore, the larger the ratio of the total area of the opening 451 to the total area except for the opening is, the brighter an image displayed using the light-emitting element 660 can be.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

Figure 22C:
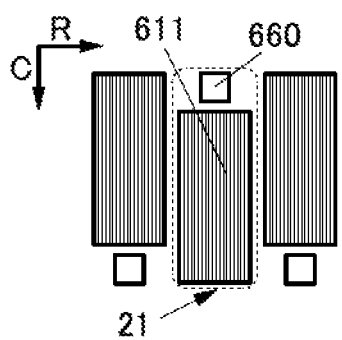
Figure 22D:
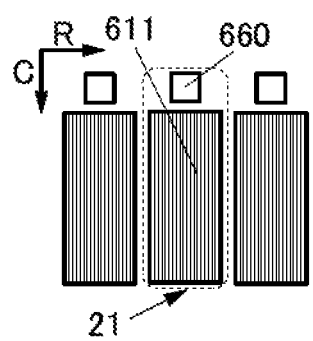

As illustrated in FIGS. 22C and 22D, a light-emitting region of the light-emitting element 660 may be positioned in a region where the electrode 611 is not provided, in which case light emitted from the light-emitting element 660 is emitted to the display surface side.

In FIG. 22C, the light-emitting elements 660 are not aligned in the two pixel units 21 adjacent in the direction indicated by the arrow R. In FIG. 22D, the light-emitting elements 660 are aligned in the two pixel units 21 adjacent to each other in the direction indicated by the arrow R.

The structure illustrated in FIG. 22C can, as mentioned above, prevent crosstalk and increase the resolution because the light-emitting elements 660 included in the two adjacent pixel units 21 can be apart from each other. The structure illustrated in FIG. 22D can prevent light emitted from the light-emitting element 660 from being blocked by the electrode 611 because the electrode 611 is not positioned along the side of the light-emitting element 660 which is parallel to the direction indicated by the arrow C. Thus, high viewing angle characteristics can be achieved.

Figure 23:
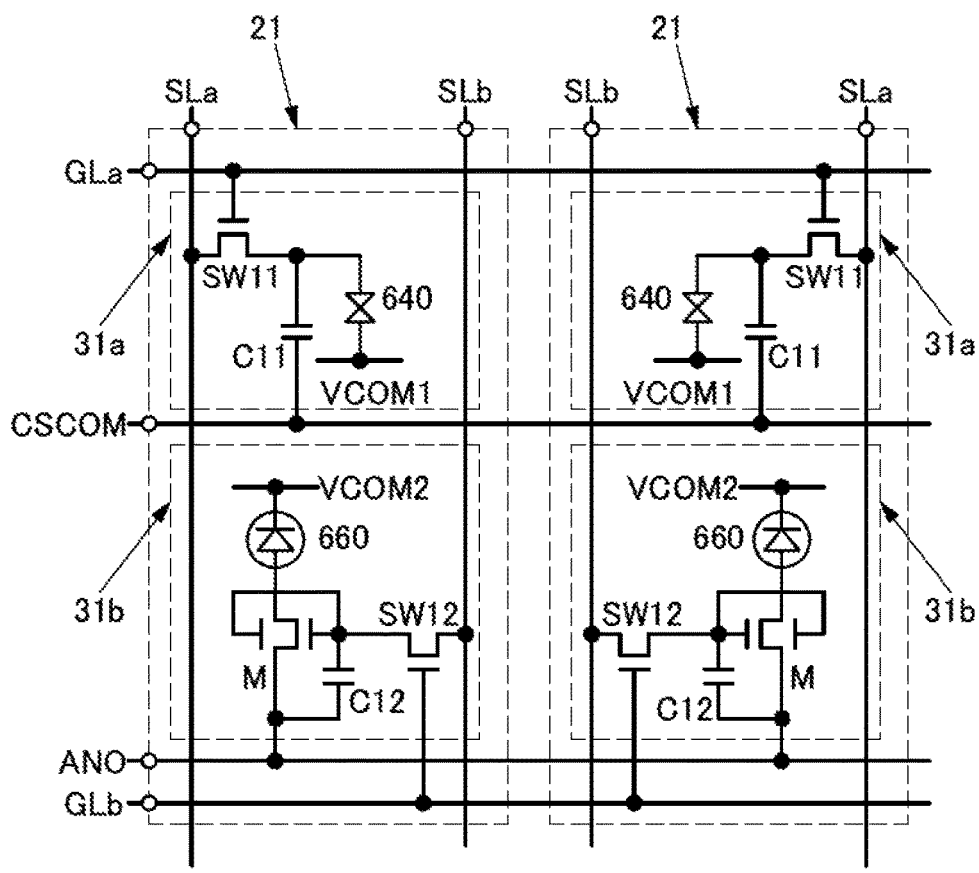
FIG. 23 illustrates a configuration example of a pixel.

FIG. 23 is an example of a circuit diagram of the pixel unit 21. FIG. 23 shows two adjacent pixel units 21.

The pixel unit 21 includes the pixel 31a including a switch SW11, a capacitor C11, and a liquid crystal element 640 and the pixel 31b including a switch SW12, a transistor M, a capacitor C12, and the light-emitting element 660. The wiring GLa, the wiring GLb, a wiring ANO, a wiring CSCOM, the wiring SLa, and the wiring SLb are connected to the pixel unit 21. Furthermore, FIG. 23 illustrates a wiring VCOM1 connected to the liquid crystal element 640 and a wiring VCOM2 connected to the light-emitting element 660.

FIG. 23 illustrates an example in which a transistor is used as each of the switches SW11 and SW12.

A gate of the switch SW11 is connected to the wiring GLa. One of a source and a drain of the switch SW11 is connected to the wiring SLa, and the other of the source and the drain of the switch SW11 is connected to one electrode of the capacitor C11 and one electrode of the liquid crystal element 640. The other electrode of the capacitor C11 is connected to the wiring CSCOM. The other electrode of the liquid crystal element 640 is connected to the wiring VCOM1.

A gate of the switch SW12 is connected to the wiring GLb. One of a source and a drain of the switch SW12 is connected to the wiring SLb, and the other of the source and the drain of the switch SW12 is connected to one electrode of the capacitor C12 and a gate of the transistor M. The other electrode of the capacitor C12 is connected to one of a source and a drain of the transistor M and the wiring ANO. The other of the source and the drain of the transistor M is connected to one electrode of the light-emitting element 660. The other electrode of the light-emitting element 660 is connected to the wiring VCOM2.

FIG. 23 illustrates an example in which the transistor M includes two gates between which a semiconductor is provided and which are connected to each other. This structure can increase the amount of current flowing through the transistor M.

A predetermined potential can be supplied to the wiring VCOM1 and the wiring CSCOM.

The wiring VCOM2 and the wiring ANO can be supplied with potentials having a difference large enough to make the light-emitting element 660 emit light.

In the pixel unit 21 of FIG. 23, for example, an image can be displayed in a reflective mode by driving the pixel unit with the signals supplied to the wiring GLa and the wiring SLa and utilizing the optical modulation of the liquid crystal element 640. In the case where an image is displayed in a transmissive mode, the pixel unit is driven with the signals supplied to the wiring GLb and the wiring SLb and the light-emitting element 660 emits light. In the case where both modes are performed at the same time, the pixel unit can be driven with the signals supplied to the wirings GLa, GLb, SLa, and SLb.

As the switches SW11 and SW12, OS transistors are preferably used. With the use of the OS transistors, video signals can be held in the pixels 31a and 31b for an extremely long time; thus, gray levels displayed by the pixels 31a and 31b can be maintained for a long time.

Figure 24A:
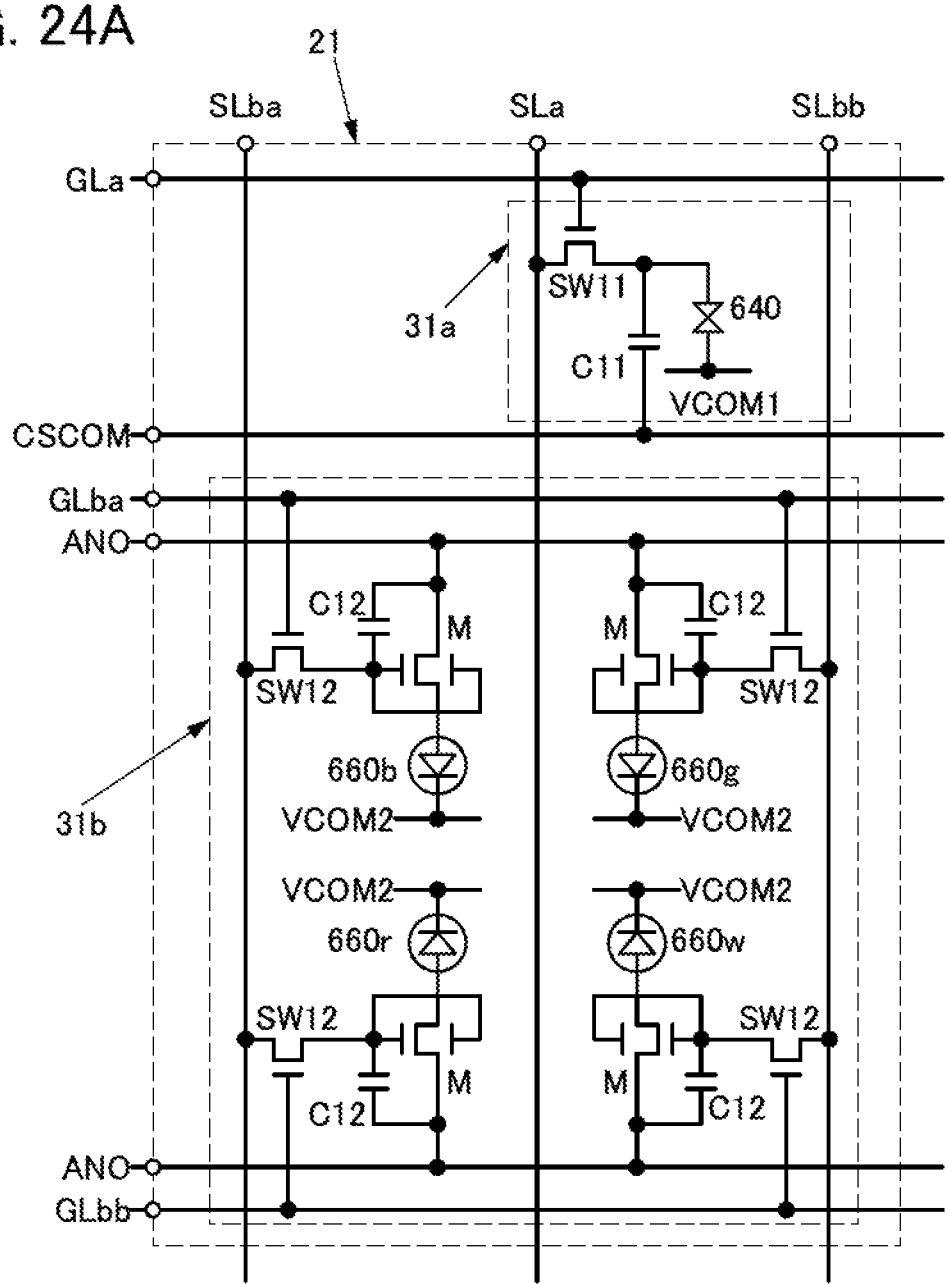
FIGS. 24A and 24B illustrate a configuration example of a pixel.

Although FIG. 23 illustrates the example in which one pixel unit 21 includes one liquid crystal element 640 and one light-emitting element 660, one embodiment of the present invention is not limited to this example. FIG. 24A illustrates an example in which one pixel unit 21 includes one liquid crystal element 640 and four light-emitting elements 660 (light-emitting elements 660r, 660g, 660b, and 660w). The pixel 31b illustrated in FIG. 24A differs from that in FIG. 23 in being capable of performing full-color display using the light-emitting elements.

In FIG. 24A, the pixel unit 21 is connected to wirings GLba, GLbb, SLba, and SLbb.

In the example illustrated in FIG. 24A, for example, light-emitting elements which exhibit red (R), green (G), blue (B), and white (W) can be used as the four light-emitting elements 660. A reflective liquid crystal element which exhibits white can be used as the liquid crystal element 640. This enables white display with high reflectance in the reflective mode. This also enables display with excellent color-rendering properties and low power consumption in the transmissive mode.

Figure 24B:
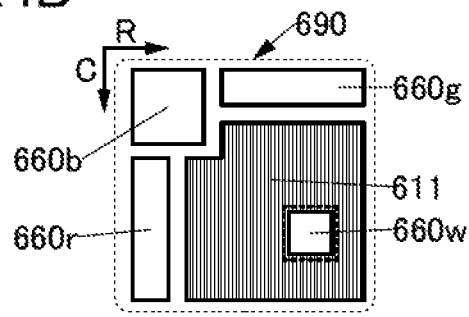

FIG. 24B illustrates a configuration example of the pixel unit 21 corresponding to FIG. 24A. The pixel unit 21 includes the light-emitting element 660w which overlaps with the opening in the electrode 611 and the light-emitting elements 660r, 660g, and 660b located near the electrode 611. It is preferred that the light-emitting elements 660r, 660g, and 660b have substantially the same light-emitting area.

This embodiment can be combined with any of the other embodiments as appropriate.

(Embodiment 5)

In this embodiment, a structure example of a display module using any of the display devices described in the above embodiments will be described.

Figure 25:
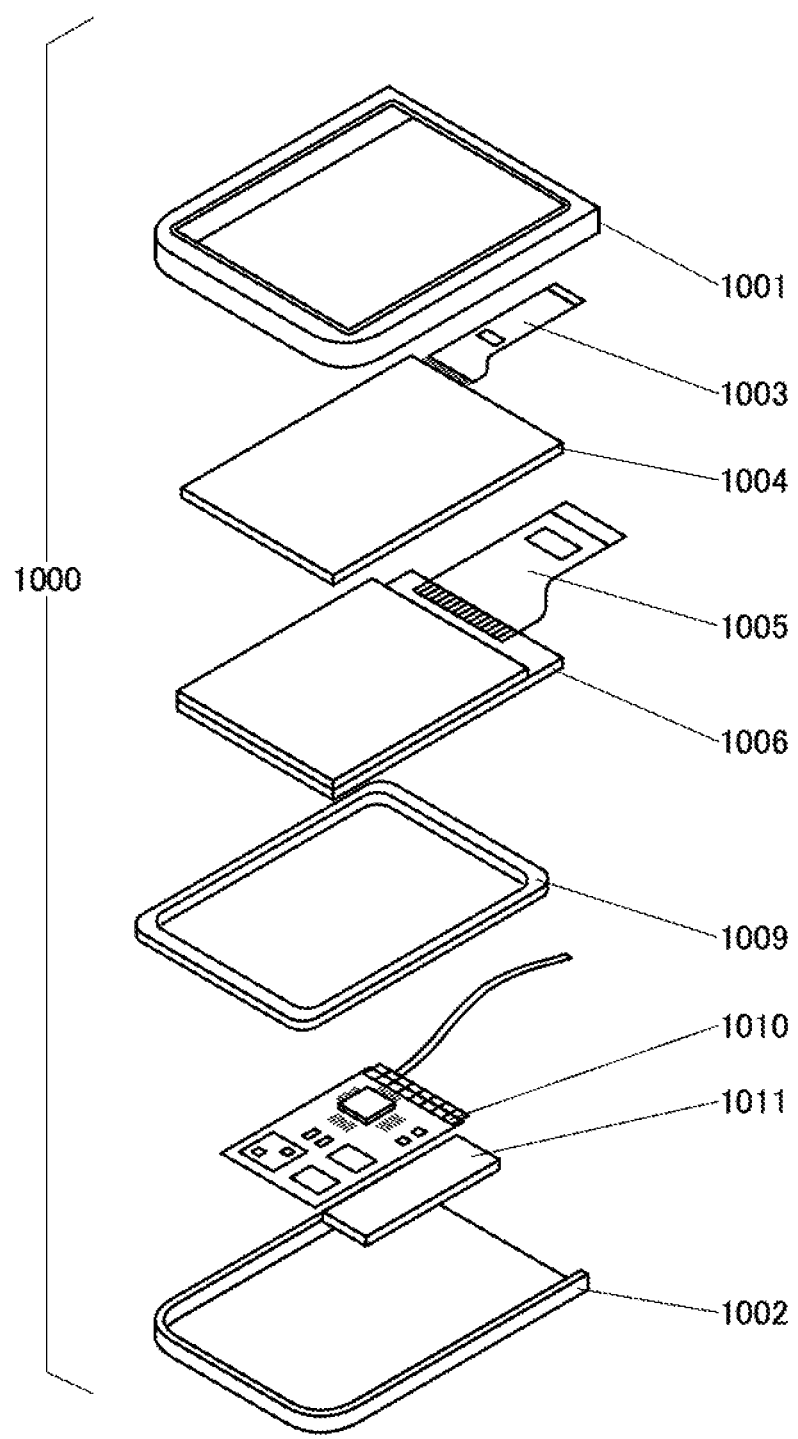
FIG. 25 illustrates a structure example of a display module.

In a display module 1000 illustrated in FIG. 25, a touch panel 1004 connected to an FPC 1003, a display device 1006 connected to an FPC 1005, a frame 1009, a printed board 1010, and a battery 1011 are provided between an upper cover 1001 and a lower cover 1002.

The display device described in the above embodiment can be used as the display device 1006.

The shapes and sizes of the upper cover 1001 and the lower cover 1002 can be changed as appropriate in accordance with the sizes of the touch panel 1004 and the display device 1006.

The touch panel 1004 can be a resistive touch panel or a capacitive touch panel and may be formed to overlap with the display device 1006. Instead of providing a touch panel 1004, the display device 1006 can have a touch panel function.

The frame 1009 protects the display device 1006 and functions as an electromagnetic shield for blocking electromagnetic waves generated by the operation of the printed board 1010. The frame 1009 may function as a radiator plate.

The printed board 1010 is provided with a power supply circuit and a signal processing circuit for outputting a video signal and a clock signal. As a power source for supplying power to the power supply circuit, an external commercial power source or a power source using the battery 1011 provided separately may be used. The battery 1011 can be omitted in the case of using a commercial power source.

The display module 1000 may be additionally provided with a member such as a polarizing plate, a retardation plate, or a prism sheet.

This embodiment can be combined with any of the other embodiments as appropriate.

(Embodiment 6)

In this embodiment, a structure example of an OS transistor that can be used in the above embodiment will be described.

<Structure Example of Transistor>

FIG. 26A is a top view illustrating a structure example of a transistor. FIG. 26B is a cross-sectional view taken along line X1-X2 in FIG. 26A. FIG. 26C is a cross-sectional view taken along line Y1-Y2 in FIG. 26A. In some cases, the direction of line X1-X2 is referred to as a channel length direction, and the direction of line Y1-Y2 is referred to as a channel width direction. FIG. 26B illustrates a cross-sectional structure of the transistor in the channel length direction, and FIG. 26C illustrates a cross-sectional structure of the transistor in the channel width direction. Note that to clarify the device structure, FIG. 26A does not illustrate some components.

The semiconductor device of one embodiment of the present invention includes insulating layers 812 to 820, metal oxide films 821 to 824, and conductive layers 850 to 853. A transistor 801 is formed over an insulating surface. FIGS. 26A to 26C illustrate the case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may each be a single film, or a stack including a plurality of films. They can be formed by any of a variety of deposition methods such as a sputtering method, a molecular beam epitaxy (MBE) method, a pulsed laser ablation (PLA) method, a CVD method, and an atomic layer deposition (ALD) method. Note that examples of CVD methods include a plasma-enhanced CVD method, a thermal CVD method, and a metal organic CVD method.

The conductive layer 850 includes a region that functions as a gate electrode of the transistor 801. The conductive layer 851 and the conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer that is a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIGS. 26B and 26C, the oxide layer 830 includes a region where the metal oxide film 821, the metal oxide film 822, and the metal oxide film 824 are stacked in this order. In addition, a pair of metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 823 and the conductive layer 850. The conductive layers 851 and 852 each include a region that overlaps with the conductive layer 850 with the metal oxide film 823, the metal oxide film 824, and the insulating layer 817 positioned therebetween.

The conductive layers 851 and 852 are formed from a hard mask that is used in the formation of the metal oxide films 821 and 822. Thus, the conductive layers 851 and 852 do not include a region that is in contact with the side surfaces of the metal oxide films 821 and 822. For example, the metal oxide films 821 and 822 and the conductive layers 851 and 852 can be formed through the following steps. First, a conductive film is formed over a metal oxide film including a stack of two layers. The conductive film is processed (etched) into a desired shape so that a hard mask is formed. The hard mask is used to process the shape of the two-layered metal oxide film, forming the metal oxide films 821 and 822 that are stacked. Next, the hard mask is processed into a desired shape, forming the conductive layers 851 and 852.

Examples of an insulating material used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed using a single-layer structure or a stacked-layer structure containing any of these insulating materials. The layers used for the insulating layers 811 to 818 may include a plurality of insulating materials.

In this specification and the like, an oxynitride refers to a compound in which the oxygen content is higher than the nitrogen content, and a nitride oxide refers to a compound in which the nitrogen content is higher than the oxygen content.

In order to suppress an increase in oxygen vacancies in the oxide layer 830, the insulating layers 816 to 818 preferably contain oxygen. More preferably, the insulating layers 816 to 818 are formed using an insulating film from which oxygen is released by heating (hereinafter such an insulating film is also referred to as an insulating film containing excess oxygen). When oxygen is supplied from the insulating film containing excess oxygen to the oxide layer 830, the oxygen vacancies in the oxide layer 830 can be compensated. Thus, the reliability and electric characteristics of the transistor 801 can be improved.

The insulating layer containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 812 to 819 is preferably low in order to prevent an increase in the concentration of hydrogen in the oxide layer 830. In particular, the concentration of hydrogen in the insulating layers 813 to 818 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The hydrogen concentration is measured by secondary ion mass spectrometry (SIMS).

In the transistor 801, the oxide layer 830 is preferably surrounded by an insulating layer with oxygen and hydrogen barrier properties (hereinafter such an insulating layer is also referred to as a barrier layer). The use of such a structure prevents release of oxygen from the oxide layer 830 and entry of hydrogen into the oxide layer 830. Thus, the reliability and electric characteristics of the transistor 801 can be improved.

For example, the insulating layer 819 functions as a barrier layer and at least one of the insulating layers 811, 812, and 814 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is formed using silicon nitride. The insulating layer 812 is formed using aluminum oxide. The insulating layer 813 is formed using silicon oxynitride. The insulating layers 814 to 816 functioning as the gate insulating layers on the back gate electrode side are formed using a stack of silicon oxide, aluminum oxide, and silicon oxide. The insulating layer 817 functioning as the gate insulating layer on the front gate side is formed using silicon oxynitride. The insulating layer 818 functioning as the interlayer insulating layer is formed using silicon oxide. The insulating layer 819 is formed using aluminum oxide.

Examples of a conductive material used for the conductive layers 850 to 853 include a metals such as molybdenum, titanium, tantalum, tungsten, aluminum, copper, chromium, neodymium, and scandium; and metal nitrides containing any of the above metals as their components (e.g., tantalum nitride, titanium nitride, molybdenum nitride, and tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 850 to 853 will be described. The conductive layer 850 is a single layer of tantalum nitride or tungsten. Alternatively, the conductive layer 850 is a stack of tantalum nitride, tantalum, and tantalum nitride. The conductive layer 851 is formed with a single layer of tantalum nitride, or a stack of tantalum nitride and tungsten. The structure of the conductive layer 852 is the same as that of the conductive layer 851. A conductive layer 853a is formed using tantalum nitride, and a conductive layer 853b is formed using tungsten.

In order to reduce the off-state current of the transistor 801, for example, the energy gap of the metal oxide film 822 is preferably large. The energy gap of the metal oxide film 822 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 830 preferably exhibits crystallinity. At least the metal oxide film 822 preferably exhibits crystallinity. With the structure described above, the transistor 801 can have high reliability and favorable electric characteristics.

As the oxide of the metal oxide film 822, for example, an In—Ga oxide, an In—Zn oxide, or an In-M-Zn oxide (M is Al, Ga, Y, or Sn) can be used. The metal oxide film 822 is not limited to the oxide layer containing indium. The metal oxide film 822 can be formed using a Zn—Sn oxide, a Ga—Sn oxide, or a Zn—Mg oxide, for example. The metal oxide films 821, 823, and 824 can be formed using an oxide that is similar to the oxide of the metal oxide film 822. In particular, each of the metal oxide films 821, 823 and 824 can be formed with a Ga oxide.

When an interface state is formed at the interface between the metal oxide film 822 and the metal oxide film 821, a channel formation region is formed also in the vicinity of the interface, which causes a change in the threshold voltage of the transistor 801. It is preferable that the metal oxide film 821 contain at least one of the metal elements contained in the metal oxide film 822 as its component. In that case, an interface state is unlikely to be formed at the interface between the metal oxide film 822 and the metal oxide film 821, and variations in the electric characteristics of the transistor 801, such as the threshold voltage, can be reduced.

The metal oxide film 824 preferably contains at least one of the metal elements contained in the metal oxide film 822 as its component because interface scattering is unlikely to occur at the interface between the metal oxide film 822 and the metal oxide film 824, and carrier transfer is unlikely to be inhibited. Thus, the field-effect mobility of the transistor 801 can be increased.

It is preferable that the metal oxide film 822 have the highest carrier mobility among the metal oxide films 821 to 824, in which case a channel can be formed in the metal oxide film 822 that is apart from the insulating layers 816 and 817.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as the metal oxide film, so that carrier mobility can be increased.

Thus, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the In content of the metal oxide film 822 is made higher than the In content of the metal oxide films 821 and 823. In the case where the In-M-Zn oxide is formed by a sputtering method, the In content can be changed by a change in the atomic ratio of metal elements of a target.

For example, it is preferable that the atomic ratio of metal elements of a target used to deposit the metal oxide film 822 be In:M:Zn=1:1:1, 3:1:2, or 4:2:4.1. For example, it is preferable that the atomic ratio of metal elements of a target used to deposit the metal oxide films 821 and 823 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 801 have stable electric characteristics, it is preferable to reduce the concentration of impurities in the oxide layer 830. In the metal oxide, hydrogen, nitrogen, carbon, silicon, and a metal element other than a main component are impurities. For example, hydrogen and nitrogen form donor states to increase the carrier density. In addition, silicon and carbon form impurity states in the metal oxide. The impurity states serve as traps and might cause the electric characteristics of the transistor to deteriorate.

For example, the oxide layer 830 includes a region where the concentration of silicon is lower than or equal to $2\times10^{18}$ atoms/cm$^3$, preferably lower than or equal to $2\times10^{17}$ atoms/cm$^3$. The same applies to the concentration of carbon in the oxide layer 830.

The oxide layer 830 includes a region where the concentration of an alkali metal is lower than or equal to $1\times10^{18}$ atoms/cm$^3$, preferably lower than or equal to $2\times10^{16}$ atoms/cm$^3$. The same applies to the concentration of an alkaline earth metal in the oxide layer 830.

The oxide layer 830 includes a region where the concentration of hydrogen is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

The above concentrations of the impurities in the oxide layer 830 are measured by SIMS.

In the case where the metal oxide film 822 contains oxygen vacancies, donor states are formed by entry of hydrogen into sites of oxygen vacancies in some cases. The oxygen vacancy is a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by a reduction in hydrogen in the metal oxide film 822 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 801 is likely to be normally-on when the metal oxide film 822 contains hydrogen because the metal oxide film 822 includes a channel formation region. Accordingly, it is preferable that hydrogen in the metal oxide film 822 be reduced as much as possible.

FIGS. 26A to 26C illustrate an example in which the oxide layer 830 has a four-layer structure; however, one embodiment of the present invention is not limited thereto. For example, the oxide layer 830 can have a three-layer structure without the metal oxide film 821 or without the metal oxide film 823. Alternatively, the oxide layer 830 may include one or more metal oxide films that are similar to the metal oxide films 821 to 824 at two or more of the following positions: between given layers in the oxide layer 830, over the oxide layer 830, and below the oxide layer 830.

Figure 27:
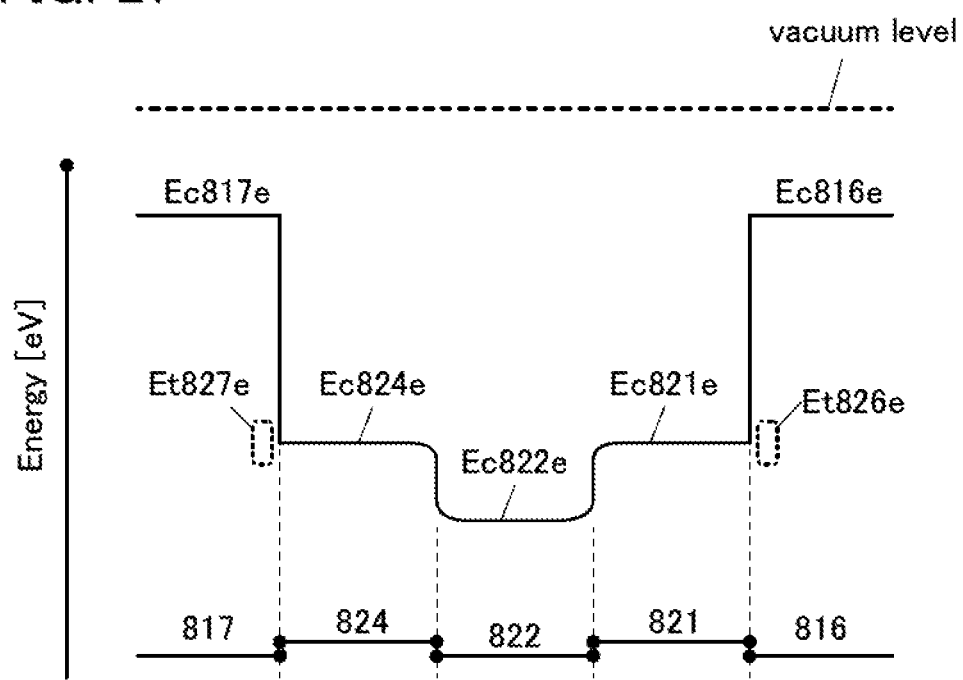
FIG. 27 shows an energy band structure.

Effects of the stack of the metal oxide films 821, 822, and 824 will be described with reference to FIG. 27. FIG. 27 is a schematic diagram showing the energy band structure of a channel formation region of the transistor 801.

In FIG. 27, Ec816e, Ec821e, Ec822e, Ec824e, and Ec817e indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (the difference is also referred to as electron affinity) corresponds to a value obtained by subtracting an energy gap from the energy difference between the vacuum level and the valence band maximum (the difference is also referred to as an ionization potential). The energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Since the insulating layers 816 and 817 are insulators, Ec816e and Ec817e are closer to the vacuum level than Ec821e, Ec822e, and Ec824e (i.e., the insulating layers 816 and 817 have lower electron affinities than the metal oxide films 821, 822, and 824).

The metal oxide film 822 has a higher electron affinity than the metal oxide films 821 and 824. For example, the difference in electron affinity between the metal oxide films 822 and 821 and the difference in electron affinity between the metal oxide films 822 and 824 are each greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

When a voltage is applied to the gate electrode (the conductive layer 850) of the transistor 801, a channel is formed mainly in the metal oxide film 822 having the highest electron affinity among the metal oxide films 821, 822, and 824.

An indium gallium oxide has a small electron affinity and a high oxygen-blocking property. Therefore, the metal oxide film 824 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide films 821 and 822 between the metal oxide films 821 and 822. Furthermore, in some cases, there is a mixed region of the metal oxide films 824 and 822 between the metal oxide films 824 and 822. Because the mixed region has a low interface state density, a region with a stack formed with the metal oxide films 821, 822, and 824 has a band structure where energy at each interface and in the vicinity of the interface is changed continuously (continuous junction).

Electrons transfer mainly through the metal oxide film 822 in the oxide layer 830 having such an energy band structure. Therefore, even when an interface state exists at the interface between the metal oxide film 821 and the insulating layer 816 or the interface between the metal oxide film 824 and the insulating layer 817, electron transfer in the oxide layer 830 is less likely to be inhibited and the on-state current of the transistor 801 can be increased.

Although trap states Et826e and Et827e due to impurities or defects might be formed in the vicinity of the interface between the metal oxide film 821 and the insulating layer 816 and the vicinity of the interface between the metal oxide film 824 and the insulating layer 817 as illustrated in FIG. 27, the metal oxide film 822 can be separated from the trap states Et826e and Et827e owing to the existence of the metal oxide films 821 and 824.

Note that when a difference between Ec821e and Ec822e is small, an electron in the metal oxide film 822 might reach the trap state Et826e by passing over the difference in energy. Since the electron is trapped at the trap state Et826e, negative fixed charge is generated at the interface with the insulating film, causing the threshold voltage of the transistor to be shifted in the positive direction. The same applies to the case where a difference in energy between Ec822e and Ec824e is small.

Each of the difference in energy between Ec821e and Ec822e and the difference in energy between Ec824e and Ec822e is preferably greater than or equal to 0.1 eV, more preferably greater than or equal to 0.15 eV so that a change in the threshold voltage of the transistor 801 can be reduced and the transistor 801 can have favorable electric characteristics.

Note that the transistor 801 does not necessarily include a back gate electrode.

<Metal Oxide>

Next, a metal oxide that can be used in the OS transistor will be described. In particular, the details of a metal oxide and a cloud-aligned composite (CAC)-OS will be described below.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers flow mainly in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite. Thus, CAC-OS may be called a cloud-aligned composite OS.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that the metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis aligned crystal (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component and nanoparticle regions including In as a main component are observed in parts of the CAC-OS. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) and nanoparticle regions including In as a main component are observed in parts of the CAC-OS, and these nanoparticle regions are randomly dispersed to form a mosaic pattern in the CAC-OS.

The CAC-OS can be deposited by a sputtering method under conditions where a substrate is not heated intentionally, for example. In the case of depositing the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow rate of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{x2}Zn_{y2}O_{z2}$ or $InO_{X1}$ as a main component, the conductivity of an oxide semiconductor is exhibited. Accordingly, when regions including $In_{x2}Zn_{y2}O_{z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{x2}Zn_{y2}O_{z2}$ or $InO_{X1}$ as a main component. In other words, when regions including $GaO_{X3}$ or the like as a main component are distributed in an oxide semiconductor, a leakage current can be suppressed and favorable switching operation can be achieved.

Accordingly, when a CAC-OS is used for a semiconductor element, the insulating property derived from $GaO_{X3}$ or the like and the conductivity derived from $In_{x2}Zn_{y2}O_{z2}$ or $InO_{X1}$ complement each other, whereby a high on-state current (Ion) and high field-effect mobility (μ) can be achieved.

A semiconductor element including a CAC-OS has high reliability. Thus, the CAC-OS is suitably used in a variety of semiconductor devices.

This embodiment can be combined with any of the other embodiments as appropriate.

(Embodiment 7)

In this embodiment, a configuration example of a display system using any of the driver circuits or any of the display devices described in the above embodiments will be described.

Figure 28:
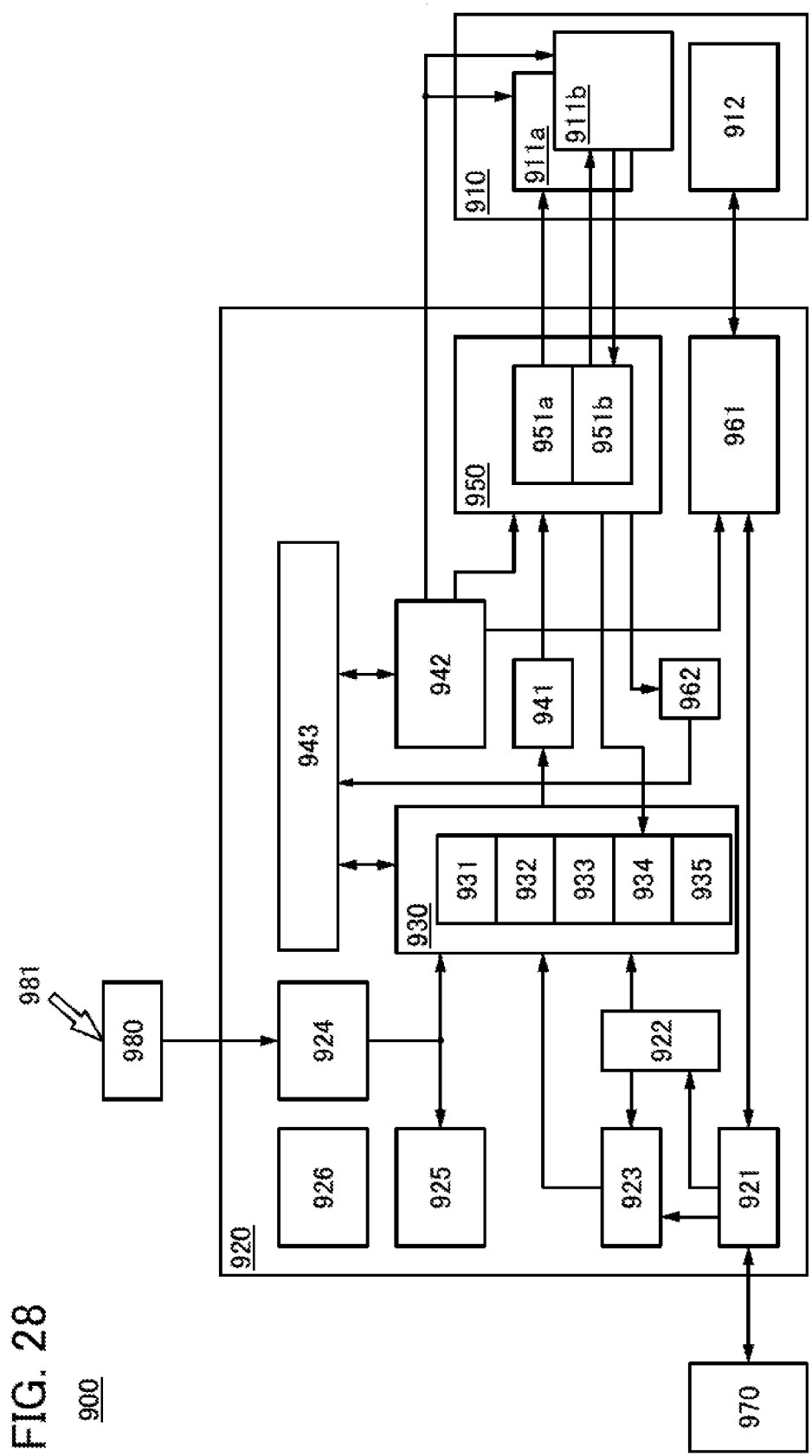
FIG. 28 illustrates a configuration example of a display system.

FIG. 28 illustrates a configuration example of a display system 900. The display system 900 includes a display portion 910 and a control portion 920.

The control portion 920 has a function of generating a video signal on the basis of image data. The control portion 920 includes an interface 921, a frame memory 922, a decoder 923, a sensor controller 924, a controller 925, a clock generation circuit 926, an image processing portion 930, a memory device 941, a timing controller 942, a register 943, a driver circuit 950, a touch sensor controller 961, and an arithmetic circuit 962.

The display portion 910 has a function of displaying an image using a video signal input from the control portion 920. Here, an example will be described in which the display portion 910 is provided with a plurality of display units 911a and 911b. In addition, the display portion 910 may include a touch sensor unit 912 having a function of obtaining information on whether an object touches, where an object touches, or the like. In the case where the display portion 910 does not include the touch sensor unit 912, the touch sensor controller 961 may be omitted.

As each of the display units 911a and 911b, a display unit which performs display using a liquid crystal element, a display unit which performs display using a light-emitting element, or the like can be used. Here, as an example, a configuration will be described in which the display portion 910 includes a display unit 911a that performs display using a reflective liquid crystal element and a display unit 911b that performs display using a light-emitting element. The display units 911a and 911b correspond to a unit including the pixel group 30a and the driver circuit 40a and a unit including the pixel group 30b and the driver circuit 40b in FIG. 15A, respectively.

The driver circuit 950 has a function of supplying a video signal to the display portion 910. The driver circuit 950 includes driver circuits 951a and 951b. The driver circuits 951a and 951b correspond to the driver circuits 50a and 50b in FIG. 15A and FIG. 16.

A host 970 corresponds to, for example, a processor having a function of transmitting image data, a control signal, or the like to the control portion 920. Communication between the control portion 920 and the host 970 can be performed through the interface 921. In addition, information on whether an object touches, where an object touches, or the like which the touch sensor controller 961 obtains is transmitted from the control portion 920 to the host 970. Note that the circuits included in the control portion 920 can be selected as appropriate in accordance with the standard of the host 970, the specifications of the display portion 910, and the like.

The frame memory 922 is a memory circuit having a function of storing image data input to the control portion 920. In the case where compressed image data is transmitted from the host 970 to the control portion 920, the frame memory 922 can store the compressed image data. The decoder 923 is a circuit for decompressing the compressed image data. When decompression of the image data is not needed, processing is not performed in the decoder 923. Note that the decoder 923 can be provided between the frame memory 922 and the interface 921.

The image processing portion 930 has a function of performing various kinds of image processing on image data input from the frame memory 922 or the decoder 923 and generating a video signal. For example, the image processing portion 930 includes a gamma correction circuit 931, a dimming circuit 932, and a color calibration circuit 933.

In the case where the driver circuit 951b includes a circuit (current sensing circuit) having a function of sensing a current which flows to a light-emitting element included in the display unit 911b, an EL correction circuit 934 may be provided in the image processing portion 930. The EL correction circuit 934 has a function of adjusting the luminance of the light-emitting element on the basis of a signal transmitted from the current sensing circuit.

A video signal generated in the image processing portion 930 is output to the driver circuit 950 through the memory device 941. The memory device 941 has a function of temporarily storing the video signal. The driver circuits 951a and 951b have a function of performing various kinds of processing on video signals input from the memory device 941 and outputting the signals to the display units 911a and 911b.

The timing controller 942 has a function of generating timing signals and the like used in the driver circuit 950, the touch sensor controller 961, and the driver circuit included in the display unit 911.

The touch sensor controller 961 has a function of controlling the operation of the touch sensor unit 912. A signal including touch information sensed by the touch sensor unit 912 is processed in the touch sensor controller 961 and transmitted to the host 970 through the interface 921. The host 970 generates image data in accordance with the touch information and transmits the image data to the control portion 920. The control portion 920 may have a function of reflecting the touch information in the image data. The touch sensor controller 961 may be provided in the touch sensor unit 912.

The clock generation circuit 926 has a function of generating a clock signal used in the control portion 920. The controller 925 has a function of processing a variety of control signals transmitted from the host 970 through the interface 921 and controlling a variety of circuits in the control portion 920. The controller 925 also has a function of controlling power supply to the variety of circuits in the control portion 920. For example, the controller 925 can temporarily interrupt the power supply to a circuit which is not driven.

The arithmetic circuit 962 has a function of calculating a difference ΔVout between potentials input from the driver circuits 951a and 951b (corresponding to the potentials Vouta and Voutb in FIG. 17B). The value of ΔVout calculated by the arithmetic circuit 962 is stored in the register 943. Note that the arithmetic circuit 56 illustrated in FIG. 1, for example, may be used as the arithmetic circuit 962.

The image processing portion 930 includes a correction circuit 935. The correction circuit 935 has a function of correcting the data SD so that ΔVout is canceled out. Thus, a difference in video signals between the driver circuit 951a and the driver circuit 951b can be canceled out as illustrated in FIG. 17B.

Note that the circuit 80 in FIG. 17B corresponds to a circuit having a function of the arithmetic circuit 962 and a function of the correction circuit 935.

The register 943 has a function of storing data used for the operation of the control portion 920. Examples of the data stored in the register 943 include a parameter used to perform correction processing in the image processing portion 930 and parameters used to generate waveforms of a variety of timing signals in the timing controller 942. The register 943 can include a scan chain register including a plurality of registers.

The sensor controller 924 connected to a photosensor 980 can be provided in the control portion 920. The photosensor 980 has a function of sensing external light 981 and generating a sensing signal. The sensor controller 924 has a function of generating a control signal on the basis of the sensing signal. The control signal generated in the sensor controller 924 is output to the controller 925, for example.

In the case where the display units 911a and 911b display the same image, the image processing portion 930 has a function of separately generating a video signal of the display unit 911a and a video signal of the display unit 911b. In that case, in accordance with the brightness of the external light 981 measured by the photosensor 980 and the sensor controller 924, the reflection intensity of the reflective liquid crystal element included in the display unit 911a and the emission intensity of the light-emitting element included in the display unit 911b can be adjusted. Here, the adjustment can be referred to as dimming or dimming treatment. In addition, a circuit that performs the dimming treatment is referred to as a dimming circuit.

The image processing portion 930 may include another processing circuit such as an RGB-RGBW conversion circuit depending on the specifications of the display portion 910. The RGB-RGBW conversion circuit has a function of converting image data of red, green, and blue (RGB) into image signals of red, green, blue, and white (RGBW). That is, in the case where the display portion 910 includes pixels of four colors of RGBW, power consumption can be reduced by displaying a white (W) component in the image data using the white (W) pixel. Note that in the case where the display portion 910 includes pixels of four colors of RGBY, a RGB-RGBY (red, green, blue, and yellow) conversion circuit can be used, for example.

Note that the control portion 920 can be formed using a semiconductor device. Thus, the control portion 920 can also be referred to as a semiconductor device. The circuits included in the control portion 920 can be integrated into one integrated circuit. This integrated circuit can be used as the IC 673 in FIG. 18. In that case, the display device 600 can be provided with the control portion 920.

This embodiment can be combined with any of the other embodiments as appropriate.

(Embodiment 8)

Figure 29A:
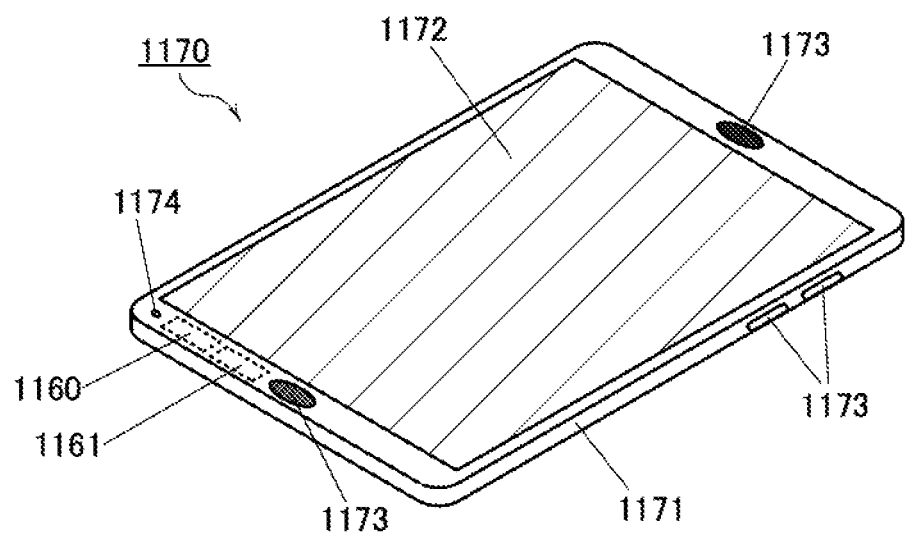
FIGS. 29A and 29B each illustrate a structure example of an electronic device.
Figure 29B:
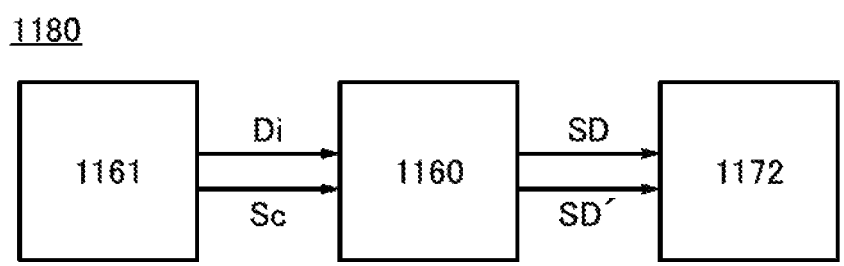

In this embodiment, structure examples of electronic devices including any of the display devices or the display system described in the above embodiments will be described. FIGS. 29A and 29B illustrate a structure example of a tablet information terminal as an example of an electronic device.

FIG. 29A illustrates a structure example of a tablet information terminal. An information terminal 1170 includes a housing 1171, a display portion 1172, operation keys 1173, and a speaker 1174. Note that a display device having a position-input function can be used as the display portion 1172. The position-input function can be added by providing a touch panel in a display device or by providing a pixel portion including a photoelectric conversion element in a display device, for example. The operation keys 1173 can be used as any one of a power switch for starting the information terminal 1170, a button for operating an application of the information terminal 1170, a volume control button, and a switch for turning on or off the display portion 1172.

Although the number of operation keys 1173 illustrated in FIG. 29A is four, the number and position of operation keys included in the information terminal 1170 are not limited to those in this example. The information terminal 1170 may also include a microphone. Thus, the information terminal 1170 can have a telephone function like a cellular phone, for example. The information terminal 1170 may also include a camera. The information terminal 1170 may also include a light-emitting device for use as a flashlight or lighting device.

The information terminal 1170 may also include a sensor (which measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 1171. In particular, when a measuring device including a sensor for measuring inclination, such as a gyroscope sensor or an acceleration sensor, is provided, display on the screen of the display portion 1172 can be automatically changed in accordance with the orientation of the information terminal 1170 by determining the orientation of the information terminal 1170 (the orientation of the information terminal with respect to the vertical direction).

The display portion 910 in FIG. 28 can be used as the display portion 1172. Furthermore, the information terminal 1170 can be provided with an integrated circuit 1160 corresponding to the control portion 920 in the FIG. 28 and a processor 1161 corresponding to the host 970 in the FIG. 28. In this manner, the information terminal 1170 is provided with the display system.

FIG. 29B illustrates a configuration example of a display system 1180 provided in the information terminal 1170. The display system 1180 is composed of the processor 1161, the integrated circuit 1160, and the display portion 1172.

Image data Di and a control signal Sc are sent from the processor 1161 to the integrated circuit 1160. The integrated circuit 1160 supplies a video signal to the display portion 1172 or inspects and corrects a video signal, on the basis of the control signal Sc. That is, the processor 1161 has a function of selecting whether to make the integrated circuit 1160 supply a video signal to the display portion 1172 or to make the integrated circuit 1160 inspect and correct a video signal.

When being instructed to supply a video signal to the display portion 1172 by the control signal Sc, the integrated circuit 1160 generates a video signal on the basis of the image data Di and supplies the video signal as the data SD to the display portion 1172. When being instructed to inspect and correct a video signal by the control signal Sc, the integrated circuit 1160 corrects a video signal through the operations illustrated in FIGS. 4 to 7. Then, the corrected video signal is supplied as data SD' to the display portion 1172.

Thus, providing the display system 1180 in the electronic device enables the electronic device to inspect and correct a video signal with the use of the processor 1161.

Note that the electronic device of one embodiment of the present invention is not limited to the information terminal illustrated in FIGS. 29A and 29B. FIGS. 30A to 30D illustrate other examples of electronic devices.

FIGS. 30A and 30B illustrate an example of a portable information terminal 2000. The portable information terminal 2000 includes a housing 2001, a housing 2002, a display portion 2003, a display portion 2004, and a hinge 2005, for example.

The housing 2001 and the housing 2002 are joined together with the hinge 2005. The portable information terminal 2000 folded as illustrated in FIG. 30A can be changed into the state illustrated in FIG. 30B, in which the housing 2001 and the housing 2002 are opened.

For example, text information can be displayed on the display portions 2003 and 2004; thus, the portable information terminal can be used as an e-book reader. Furthermore, still images and moving images can be displayed on the display portions 2003 and 2004. Furthermore, the display portion 2003 may be provided with a touch panel.

The portable information terminal 2000 can be folded when being carried, and thus has general versatility.

Note that the housings 2001 and 2002 may have a power button, an operation button, an external connection port, a speaker, a microphone, and the like.

Note that the portable information terminal 2000 may have a function of identifying a character, a figure, or an image using a touch sensor provided for the display portion 2003. In that case, learning in the following mode is possible: an answer is written with a finger, a stylus pen, or the like on an information terminal that displays a workbook or the like for studying mathematics or for learning language, for example, and then the portable information terminal 2000 determines whether the answer is correct or not. The portable information terminal 2000 may have a function of performing speech interpretation. In that case, for example, the portable information terminal 2000 can be used in learning a foreign language. Such a portable information terminal is suitable for use as a teaching material such as a textbook, a notebook, or the like.

Note that the touch information obtained by the touch sensor of the display portion 2003 can be used to predict whether to make the semiconductor device of one embodiment of the present invention supply power.

FIG. 30C illustrates an example of a portable information terminal. A portable information terminal 2010 illustrated in FIG. 30C includes a housing 2011, a display portion 2012, operation buttons 2013, an external connection port 2014, a speaker 2015, a microphone 2016, a camera 2017, and the like.

The portable information terminal 2010 includes a touch sensor in the display portion 2012. Operations such as making a call and inputting text can be performed by a touch on the display portion 2012 with a finger, a stylus, or the like.

With the operation buttons 2013, power on/off can be switched and types of images displayed on the display portion 2012 can be switched. For example, images can be switched from a mail creation screen to a main menu screen.

When a sensing device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically for a landscape mode or a portrait mode). The direction of display on the screen can also be changed by a touch on the display portion 2012, operation with the operation buttons 2013, sound input using the microphone 2016, or the like.

The portable information terminal 2010 has one or more of a telephone function, a notebook function, an information browsing function, and the like. For example, the portable information terminal 2010 can be used as a smartphone. The portable information terminal 2010 is capable of executing a variety of applications such as mobile phone calls, e-mailing, viewing and editing text, music reproduction, video replay, Internet communication, and games.

FIG. 30D illustrates an example of a camera. A camera 2020 includes a housing 2021, a display portion 2022, operation buttons 2023, a shutter button 2024, and the like. The camera 2020 is provided with an attachable lens 2026.

Although the lens 2026 of the camera 2020 here is detachable from the housing 2021 for replacement, the lens 2026 may be integrated with the housing 2021.

Still images or moving images can be taken with the camera 2020 by pushing the shutter button 2024. In addition, images can be taken by a touch on the display portion 2022 that serves as a touch panel.

Note that a stroboscope, a viewfinder, or the like can be additionally provided in the camera 2020. Alternatively, these can be incorporated in the housing 2021.

This embodiment can be combined with any of the other embodiments as appropriate.

EXPLANATION OF REFERENCE

10: display device, 20: pixel portion, 21: pixel unit, 30: pixel group, 31: pixel, 40: driver circuit, 50: driver circuit, 51: shift register, 52: decoder circuit, 53: level shifter circuit, 54: D/A converter circuit, 55: amplifier circuit, 56: arithmetic circuit, 60: liquid crystal element, 61: reflective electrode, 62: liquid crystal layer, 63: transparent electrode, 64: light, 65: opening, 70: light-emitting element, 71: light, 80: circuit, 110: register, 120: latch circuit, 121: subtraction circuit, 122: adder, 123: inverter, 130: decoder, 140: latch circuit, 150: level shifter, 160: selection circuit, 161: circuit, 170: potential generation circuit, 180: amplifier, 210: light-emitting element, 220: liquid crystal element, 412: liquid crystal layer, 413: electrode, 417: insulating layer, 421: insulating layer, 431: coloring layer, 432: light-blocking layer, 433: alignment film, 434: coloring layer, 435: polarizing plate, 441: bonding layer, 442: bonding layer, 451: opening, 470: light-emitting element, 480: liquid crystal element, 491: electrode, 492: EL layer, 493: electrode, 494: insulating layer, 501: transistor, 503: transistor, 504: connection portion, 505: transistor, 506: transistor, 507: connection portion, 511: insulating layer, 512: insulating layer, 513: insulating layer, 514: insulating layer, 516: insulating layer, 517: insulating layer, 518: insulating layer, 520: insulating layer, 521: conductive layer, 523: conductive layer, 531: semiconductor layer, 540: transistor, 542: connection layer, 543: connector, 552: connection portion, 561: semiconductor layer, 563: conductive layer, 580: transistor, 581: transistor, 584: transistor, 585: transistor, 586: transistor, 600: display device, 600A: display device, 600B: display device, 611: electrode, 640: liquid crystal element, 651: substrate, 660: light-emitting element, 661: substrate, 662: display portion, 664: circuit, 665: wiring, 672: FPC, 673: IC, 801: transistor, 811: insulating layer, 812: insulating layer, 813: insulating layer, 814: insulating layer, 815: insulating layer, 816: insulating layer, 817: insulating layer, 818: insulating layer, 819: insulating layer, 820: insulating layer, 821: metal oxide film, 822: metal oxide film, 823: metal oxide film, 824: metal oxide film, 830: oxide layer, 850: conductive layer, 851: conductive layer, 852: conductive layer, 853: conductive layer, 900: display system, 910: display portion, 911: display unit, 912: touch sensor unit, 920: control portion, 921: interface, 922: frame memory, 923: decoder, 924: sensor controller, 925: controller, 926: clock generation circuit, 930: image processing portion, 931: gamma correction circuit, 932: dimming circuit, 933: color calibration circuit, 934: EL correction circuit, 935: correction circuit, 941: memory device, 942: timing controller, 943: register, 950: driver circuit, 951: driver circuit, 961: touch sensor controller, 962: arithmetic circuit, 970: host, 980: optical sensor, 981: external light, 1000: display module, 1001: upper cover, 1002: lower cover, 1003: FPC, 1004: touch panel, 1005: FPC, 1006: display device, 1009: frame, 1010: printed board, 1011: battery, 1160: integrated circuit, 1161: processor, 1170: information terminal, 1171: housing, 1172: display portion, 1173: operation key, 1174: speaker, 1180: display system, 2000: portable information terminal, 2001: housing, 2002: housing, 2003: display portion, 2004: display portion, 2005: hinge, 2010: portable information terminal, 2011: housing, 2012: display portion, 2013: operation button, 2014: external connection port, 2015: speaker, 2016: microphone, 2017: camera, 2020: camera, 2021: housing, 2022: display portion, 2023: operation button, 2024: shutter button, and 2026: lens This application is based on Japanese Patent Application Ser. No. 2016-167883 filed with Japan Patent Office on Aug. 30, 2016, the entire contents of which are hereby incorporated by reference.

The invention claimed is:

1. A semiconductor device comprising:
a decoder circuit;
an amplifier circuit; and
an arithmetic circuit,
wherein the amplifier circuit comprises a first amplifier and a second amplifier,
wherein one of the first amplifier and the second amplifier is configured to inspect an output of the other of the first amplifier and the second amplifier,
wherein the arithmetic circuit is configured to calculate an error of a potential output from the first amplifier or the second amplifier, on the basis of a result of the inspection, and
wherein the decoder circuit is configured to correct a video signal input to the decoder circuit by subtracting the error of the potential from the video signal.

2. The semiconductor device according to claim 1,
wherein the video signal is digital data, and
wherein the arithmetic circuit is configured to calculate the error of the potential with use of the digital data.

3. A display device comprising:
the semiconductor device according to claim 1; and
a pixel portion,
wherein the pixel portion includes a plurality of pixels, and
wherein the semiconductor device is configured to supply a potential corresponding to a corrected video signal to the pixel.

4. An electronic device comprising:
the display device according to claim 3; and
a processor,
wherein the processor is configured to select whether to make the semiconductor device supply a video signal to the pixel portion or make the semiconductor device perform the inspection.

5. A semiconductor device comprising:
a decoder circuit;
an amplifier circuit; and
an arithmetic circuit,
wherein the amplifier circuit comprises a first amplifier and a second amplifier,
wherein one of the first amplifier and the second amplifier is configured to inspect an output of the other of the first amplifier and the second amplifier,
wherein the arithmetic circuit is configured to calculate an error of a potential output from the first amplifier or the second amplifier, on the basis of a result of the inspection,
wherein the decoder circuit is configured to correct a video signal input to the decoder circuit by subtracting the error of the potential from the video signal,
wherein the first amplifier comprises a first operational amplifier,
wherein the second amplifier comprises a second operational amplifier, a first switch, and a second switch,
wherein a first terminal of the first switch is electrically connected to an inverting input terminal of the second operational amplifier,
wherein a second terminal of the first switch is electrically connected to an output terminal of the second operational amplifier,
wherein a first terminal of the second switch is electrically connected to the inverting input terminal of the second operational amplifier,
wherein a second terminal of the second switch is electrically connected to an output terminal of the first operational amplifier, and
wherein the second operational amplifier is configured to output a signal corresponding to an inspection result of an output of the first operational amplifier to the arithmetic circuit.

6. The semiconductor device according to claim 5,
wherein the output of the first operational amplifier is inspected by turning on the second switch so that a potential supplied to a non-inverting input terminal of the second operational amplifier is gradually changed.

7. The semiconductor device according to claim 5,
wherein the first switch and the second switch are each composed of a transistor, and
wherein the transistor includes a metal oxide in a channel formation region.

8. A display device comprising:
a decoder circuit;
an amplifier circuit;
an arithmetic circuit;
a pixel portion; and
a D/A converter circuit, wherein the amplifier circuit comprises a first amplifier and a second amplifier, wherein one of the first amplifier and the second amplifier is configured to inspect an output of the other of the first amplifier and the second amplifier, wherein the arithmetic circuit is configured to calculate an error of a potential output from the first amplifier or the second amplifier, on the basis of a result of the inspection, wherein the decoder circuit is configured to correct a video signal input to the decoder circuit by subtracting the error of the potential from the video signal, wherein the pixel portion includes a plurality of pixels, wherein the D/A converter circuit comprises a selection circuit and a potential generation circuit, wherein the potential generation circuit is configured to supply a plurality of reference potentials to the selection circuit, and wherein a first number of the reference potentials is larger than a second number of grey levels displayed by the pixels.

9. The display device according to claim 8, further comprising:

a first driver circuit comprising the semiconductor device; and a second driver circuit comprising the semiconductor device, wherein the pixel portion comprises a first pixel comprising a liquid crystal element and a second pixel comprising a light-emitting element, wherein the first driver circuit is configured to supply a video signal to the first pixel, wherein the second driver circuit is configured to supply a video signal to the second pixel, wherein the potential generation circuit in the first driver circuit is configured to generate the reference potential with use of a first potential, wherein the potential generation circuit in the second driver circuit is configured to generate the reference potential with use of a second potential, wherein when the potential generation circuit in the first driver circuit generates the reference potential, the first potential is supplied to the potential generation circuit in the first driver circuit, wherein when the potential generation circuit in the second driver circuit generates the reference potential, the second potential is supplied to the potential generation circuit in the second driver circuit, and wherein when the inspection is performed, the first potential is supplied to the potential generation circuit in each of the first driver circuit and the second driver circuit.

* * * * *